US 11,118,961 B2
… Sep. 14, 2021

(12) United States Patent
Hosaka et al.

(10) Patent No.: US 11,118,961 B2
(45) Date of Patent: Sep. 14, 2021

(54) IMAGING APPARATUS WITH INFRARED-BASED TEMPERATURE DETECTION DEVICES

(71) Applicant: Sony Corporation, Tokyo (JP)

(72) Inventors: Hajime Hosaka, Kanagawa (JP); Yoshikazu Nitta, Tokyo (JP); Kenichi Okumura, Tokyo (JP); Shunichi Sukegawa, Ibaraki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 326 days.

(21) Appl. No.: 15/770,636

(22) PCT Filed: Jun. 28, 2017

(86) PCT No.: PCT/JP2017/023713
§ 371 (c)(1),
(2) Date: Apr. 24, 2018

(87) PCT Pub. No.: WO2018/042850
PCT Pub. Date: Mar. 8, 2018

(65) Prior Publication Data
US 2019/0137331 A1   May 9, 2019

(30) Foreign Application Priority Data
Sep. 2, 2016   (JP) .............................. JP2016-171472

(51) Int. Cl.
*G01J 1/02*   (2006.01)
*G01J 1/44*   (2006.01)
(Continued)

(52) U.S. Cl.
CPC . *G01J 1/02* (2013.01); *G01J 1/44* (2013.01); *G01J 5/48* (2013.01); *H01L 27/1467* (2013.01);
(Continued)

(58) Field of Classification Search
CPC ....... G01J 1/02; G01J 5/48; G01J 1/44; H01L 27/14634; H01L 27/1467; H01L 27/1469; H04N 5/225; H04N 5/33; H04N 5/369
See application file for complete search history.

(56) References Cited

U.S. PATENT DOCUMENTS 5,420,419 A   5/1995   Wood
5,965,892 A   10/1999   Tanaka
(Continued)

FOREIGN PATENT DOCUMENTS

DE   102012208220 A1   11/2013
EP   2343523 A1   7/2011
(Continued)

OTHER PUBLICATIONS

International Search Report and English translation thereof dated Sep. 19, 2017 in connection with International Application No. PCT/JP2017/023713.
(Continued)

*Primary Examiner* — Blake C Riddick
(74) *Attorney, Agent, or Firm* — Wolf, Greenfield & Sacks, P.C.

(57) ABSTRACT

An imaging apparatus is configured of a first structure 20 and a second structure 40, in which the first structure 20 includes a first substrate 21, a plurality of temperature detection devices 15 formed on the first substrate 21 and configured to detect a temperature on the basis of an infrared ray, drive lines 72, and signal lines 71, the second structure 40 includes a second substrate 41, and a drive circuit provided on the second substrate 41 and covered with a covering layer 43, the first substrate 21 is bonded to the covering layer 43, a cavity 50 is provided between each temperature detection device 15 and the covering layer 43,
(Continued)

and the drive lines 72 and the signal lines 71 are electrically connected to the drive circuit.

19 Claims, 34 Drawing Sheets

(51) Int. Cl.
  *G01J 5/48* (2006.01)
  *H04N 5/225* (2006.01)
  *H04N 5/33* (2006.01)
  *H01L 27/146* (2006.01)
  *H04N 5/369* (2011.01)

(52) U.S. Cl.
  CPC .... *H01L 27/1469* (2013.01); *H01L 27/14634* (2013.01); *H04N 5/225* (2013.01); *H04N 5/33* (2013.01); *H04N 5/379* (2018.08)

(56) References Cited

U.S. PATENT DOCUMENTS

| | | | | |
|---|---|---|---|---|
| 6,441,374 | B1* | 8/2002 | Kawano | G01J 5/20 250/338.1 |
| 9,404,804 | B1 | 8/2016 | Liu et al. | |
| 2001/0010360 | A1* | 8/2001 | Oda | G01J 5/02 250/338.1 |
| 2001/0028035 | A1* | 10/2001 | Iida | G01J 5/10 250/338.4 |
| 2002/0139933 | A1* | 10/2002 | Iida | G01J 5/08 250/338.1 |
| 2005/0224714 | A1* | 10/2005 | Akin | H01L 27/14649 250/332 |
| 2006/0058196 | A1* | 3/2006 | Yefremenko | G01J 5/061 505/190 |
| 2006/0131506 | A1* | 6/2006 | Shigenaka | H01L 27/1463 250/370.08 |
| 2007/0201738 | A1* | 8/2007 | Toda | H04N 9/045 382/144 |
| 2007/0298534 | A1* | 12/2007 | Ikushima | H01L 37/00 438/57 |
| 2008/0179525 | A1* | 7/2008 | Ikushima | G01J 5/02 250/338.1 |
| 2009/0242768 | A1* | 10/2009 | Tohyama | G01J 5/02 250/338.3 |
| 2009/0266987 | A1* | 10/2009 | Honda | G01J 5/02 250/338.4 |
| 2009/0283759 | A1 | 11/2009 | Cole et al. | |
| 2010/0025584 | A1* | 2/2010 | Sasaki | H01L 27/14669 250/338.4 |
| 2011/0226953 | A1* | 9/2011 | Honda | G01V 8/10 250/338.3 |
| 2012/0018635 | A1* | 1/2012 | Takizawa | G01J 5/08 250/338.3 |
| 2012/0049313 | A1* | 3/2012 | Kwon | G01J 5/20 257/467 |
| 2012/0119088 | A1* | 5/2012 | Honda | G01J 5/025 250/332 |
| 2012/0139078 | A1 | 6/2012 | Malm | |
| 2012/0228497 | A1* | 9/2012 | Suzuki | G01J 5/024 250/332 |
| 2012/0228506 | A1* | 9/2012 | Honda | G01J 5/20 250/338.4 |
| 2012/0241613 | A1* | 9/2012 | Ishii | G01J 5/04 250/330 |
| 2013/0032717 | A1 | 2/2013 | Saito | |
| 2013/0243155 | A1* | 9/2013 | Ryu | G01T 1/2018 378/62 |
| 2013/0248686 | A1* | 9/2013 | Tohyama | H01L 27/146 250/208.1 |
| 2013/0256823 | A1* | 10/2013 | Kurokawa | H01L 37/02 257/443 |
| 2013/0256824 | A1* | 10/2013 | Mizuta | H01L 23/481 257/459 |
| 2014/0319359 | A1* | 10/2014 | Sasaki | G01J 5/20 250/353 |
| 2015/0001659 | A1 | 1/2015 | Le Neel et al. | |
| 2015/0136984 | A1* | 5/2015 | Ishii | G01J 5/023 250/338.4 |
| 2015/0137300 | A1 | 5/2015 | Herrmann et al. | |
| 2015/0241282 | A1* | 8/2015 | Honda | H01L 27/14649 250/338.4 |

FOREIGN PATENT DOCUMENTS

| | | |
|---|---|---|
| JP | 09-284651 A | 10/1997 |
| JP | 2001-324390 A | 11/2001 |
| JP | 2005-236717 A | 9/2005 |
| JP | 2006-081204 A | 3/2006 |
| JP | 2011-137744 A | 7/2011 |
| JP | 2013-036766 A | 2/2013 |
| JP | 2013-044590 A | 3/2013 |
| JP | 2014-055871 A | 3/2014 |
| JP | 2015-057862 A | 3/2015 |
| KR | 20020077238 A | 10/2002 |
| WO | WO 94/00950 A1 | 1/1994 |
| WO | WO 2010/147532 A1 | 12/2010 |
| WO | WO 2016/114291 A1 | 7/2016 |

OTHER PUBLICATIONS

Written Opinion and English translation thereof dated Sep. 19, 2017 in connection with International Application No. PCT/JP2017/023713.

International Preliminary Report on Patentability and English translation thereof dated Mar. 14, 2019 in connection with International Application No. PCT/JP2017/023713.

Extended European Search Report dated Feb. 27, 2019 in connection with European Application No. European Application No. 17845860.0.

Chinese Office Action dated Aug. 11, 2020 in connection with Chinese Application No. 201780003734.7, and English translation thereof.

* cited by examiner

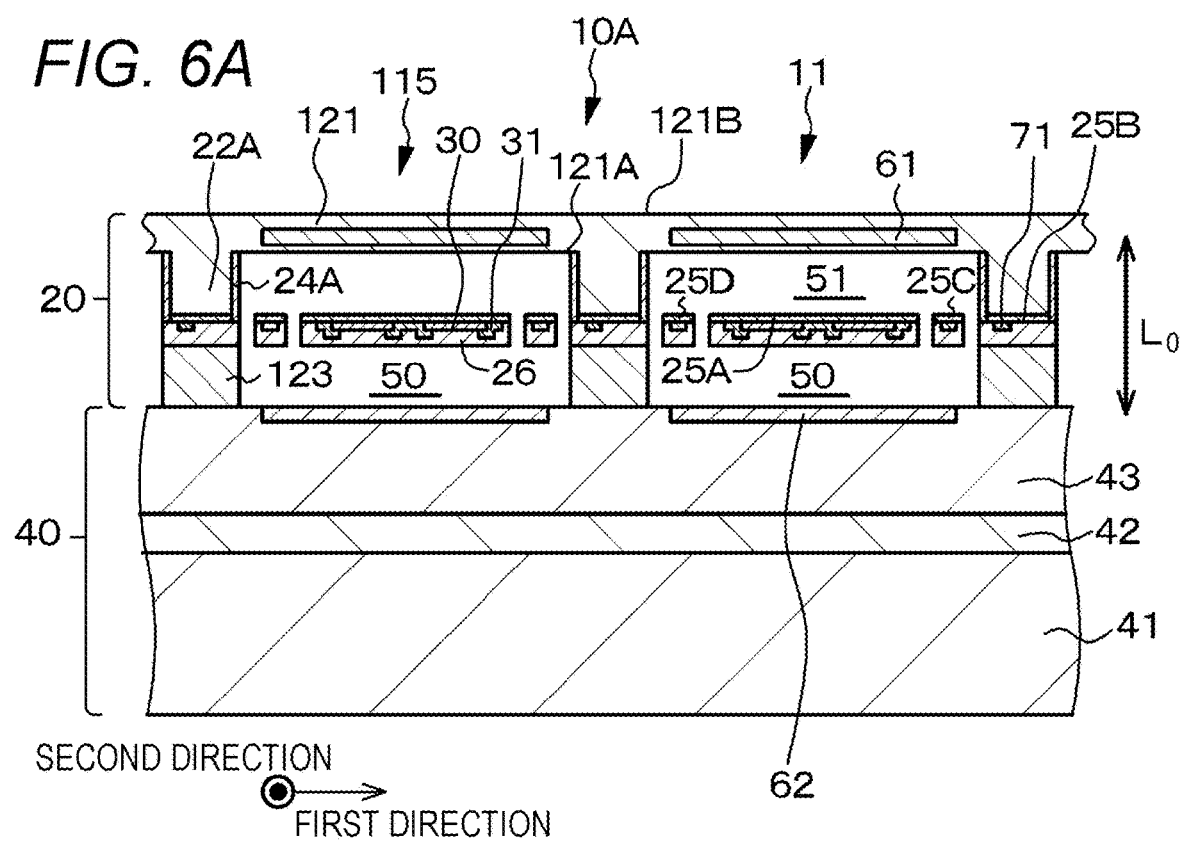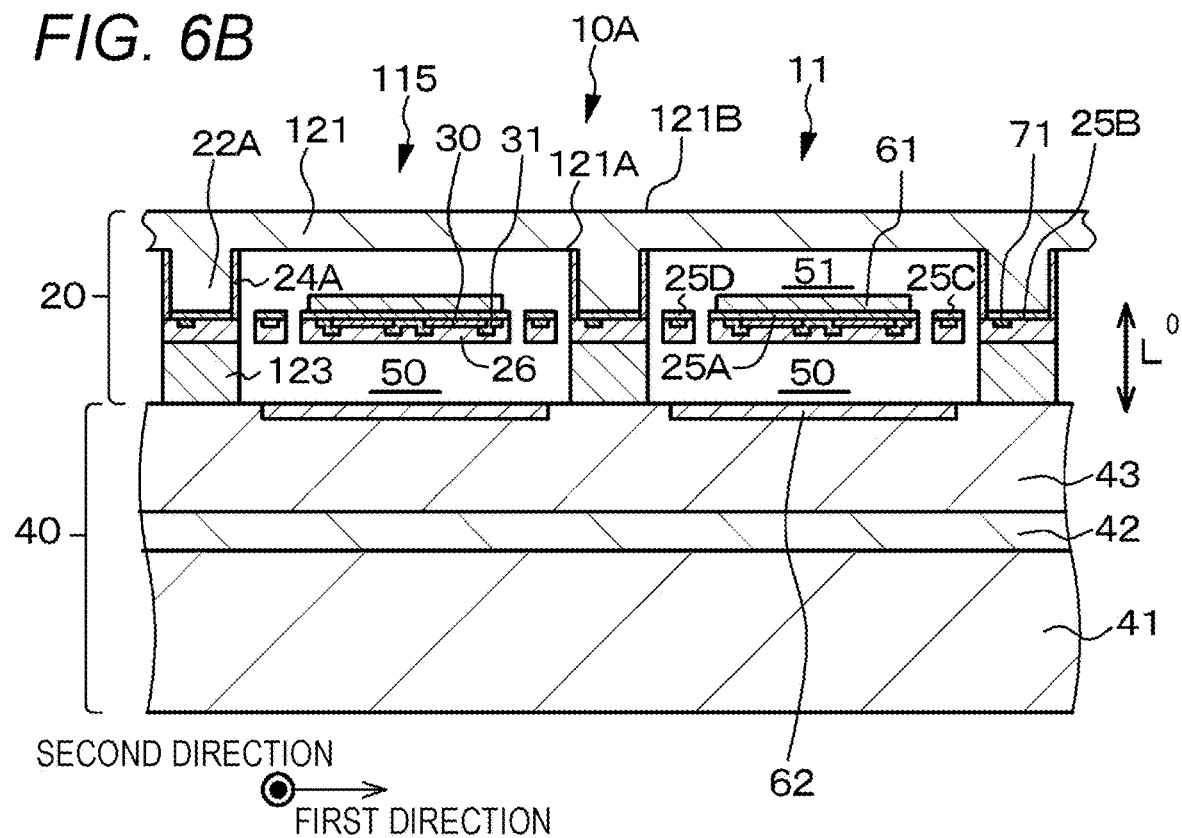

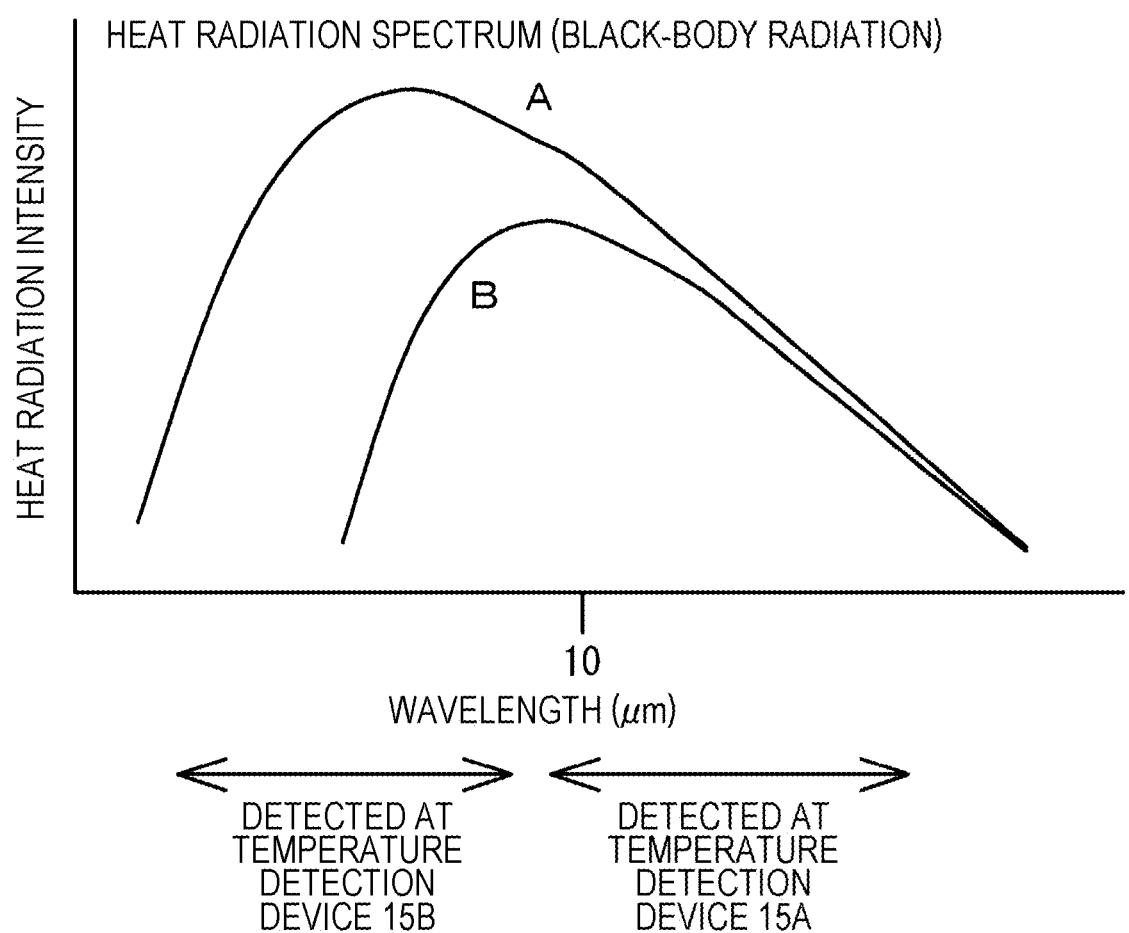

IMAGING APPARATUS WITH INFRARED-BASED TEMPERATURE DETECTION DEVICES

CROSS REFERENCE TO RELATED APPLICATIONS

This application claims the benefit under 35 U.S.C. § 371 as a U.S. National Stage Entry of International Application No. PCT/JP2017/023713, filed in the Japanese Patent Office as a Receiving Office on Jun. 28, 2017, which claims priority to Japanese Patent Application Number JP2016-171472, filed in the Japanese Patent Office on Sep. 2, 2016, each of which is hereby incorporated by reference in its entirety.

TECHNICAL FIELD

The present disclosure relates to an imaging apparatus, more specifically to an imaging apparatus including temperature detection devices configured to detect a temperature on the basis of an infrared ray.

BACKGROUND ART

There is well known, in Japanese Patent Application Laid-Open No. 2011-137744, an infrared sensor including, as temperature detection devices configure to detect a temperature on the basis of an infrared ray:

(a) a first substrate including depressurized and sealed cavities and configured to transmit an infrared ray, (b) a second substrate including a detection unit provided opposite to a side of the first substrate in which an infrared ray is incident from the outside and causing an output change in response to an infrared ray passing through the cavities, a concave part in which a depressurized space surrounding the detection unit is formed between the first substrate and the second substrate, and a reflection face capable of reflecting and condensing an infrared ray passing through the first substrate without being received by the detection unit toward the detection unit, and laminated on the first substrate, and (c) a calculation circuit provided with respect to the detection unit on the second substrate across the reflection face and configured to amplify or integrate the output of the detection unit.

Further, Japanese Patent Application Laid-Open No. 2005-236717 discloses an infrared solid-state image sensing apparatus including differential integration circuits configured to integrate a signal output from temperature detection devices configured to detect a temperature on the basis of an infrared ray.

CITATION LIST

Patent Document

Patent Document 1: Japanese Patent Application Laid-Open No. 2011-137744
Patent Document 2: Japanese Patent Application Laid-Open No. 2005-236717

SUMMARY OF THE INVENTION

Problems to be Solved by the Invention

In the technique disclosed in Japanese Patent Application Laid-Open No. 2011-137744, however, the complicated steps as illustrated in FIG. 4D and FIG. 4E are required in order to form the concave parts (cavities) on the second substrate, and the concave parts (cavities) are difficult to provide with high accuracy. Further, in Japanese Patent Application Laid-Open No. 2005-236717, there is a problem that a time required for a differential integration circuit to integrate a signal output from a temperature detection device is not enough. That is, an intensity of a noise which is output without being suppressed by the differential integration circuit out of Jonson noise or current shot noise in the semiconductor substrate, the semiconductor layer, or the temperature detection device is inversely proportional to an integration time, and thus it is desirable to prolong the integration time. The maximum integration time in the technique disclosed in Japanese Patent Application Laid-Open No. 2005-236717 is obtained by dividing a one-frame readout time by the number of readout rows of the temperature detection devices. Only the ways to prolong the integration time are to prolong a one-frame readout time and to reduce the number of readout rows, and thus a decrease in moving picture frame rate or a reduction in resolution is accordingly caused. Further, the imaging apparatus has a demand to change wavelength spectroscopic characteristics or infrared sensitivity per temperature detection device and a demand to reduce power consumption in driving the temperature detection devices. However, Patent Documents do not refer to any solution to the demands.

Therefore, a first object of the present disclosure is to provide an imaging apparatus in a configuration or structure capable of providing cavities for temperature detection devices with high accuracy. A second object of the present disclosure is to provide an imaging apparatus in a configuration or structure capable of changing wavelength spectroscopic characteristics or infrared sensitivity per temperature detection device. A third object of the present disclosure is to provide an imaging apparatus in a configuration or structure capable of sufficiently securing a time required to integrate a signal output from a temperature detection device. A fourth object of the present disclosure is to provide an imaging apparatus in a configuration or structure capable of achieving a reduction in power consumption in driving the temperature detection devices.

Solutions to Problems

An imaging apparatus according to a first aspect of the present disclosure in order to solve the first object includes:
  a first structure and a second structure,
  in which the first structure includes:
    a first substrate;
    a plurality of temperature detection devices formed on the first substrate, arranged in a 2D matrix shape in a first direction and in a second direction different from the first direction, and configured to detect a temperature on the basis of an infrared ray;
    a plurality of drive lines arranged in the first direction and connected with the plurality of temperature detection devices; and
    a plurality of signal lines arranged in the second direction and connected with the plurality of temperature detection devices,
  the second structure includes:
    a second substrate; and
    a drive circuit provided on the second substrate and covered with a covering layer,
    the first substrate is bonded to the covering layer, a cavity is provided between each temperature detection device and the covering layer, and the drive lines and the signal lines are electrically connected to the drive circuit.

An imaging apparatus according to a second aspect of the present disclosure in order to solve the second object includes:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices are arranged, and a wavelength of an infrared ray detected by each temperature detection device is different in the temperature detection device units.

An imaging apparatus according to a third aspect of the present disclosure in order to solve the second object includes:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices are arranged, and an amount of absorbed infrared ray of each temperature detection device is different in the temperature detection device units.

An imaging apparatus according to a fourth aspect of the present disclosure in order to solve the third object includes:

$M_0 \times N_0$ (where $M_0 \geq 2$, $N_0 \geq 2$) temperature detection devices arranged in a 2D matrix shape in a first direction and in a second direction different from the first direction and configured to detect a temperature on the basis of an infrared ray;

a plurality of drive lines arranged in the first direction;

$N_0 \times P_0$ (where $P_0 \geq 2$) signal lines arranged in the second direction;

a first drive circuit connected with the plurality of drive lines; and a second drive circuit connected with the $N_0 \times P_0$ signal lines, in which each temperature detection device includes a first terminal and a second terminal, the first terminal of each temperature detection device is connected to a drive line, and a (n, p)-th signal line (where n=1, 2, . . . , No, p=1, 2, . . . , $P_0$) is connected to the second terminals of $\{(q-1)P_0+p\}$-th temperature detection devices (where q=1, 2, 3, . . . ) in a group of temperature detection devices configured of $N_0$ n-th temperature detection devices arranged in the second direction.

An imaging apparatus according to a fifth aspect of the present disclosure in order to solve the fourth object includes:

$S_0 \times T_0$ (where $S_0 \geq 2$, $T_0 \geq 2$) temperature detection devices arranged in a 2D matrix shape in a first direction and in a second direction different from the first direction and configured to detect a temperature on the basis of an infrared ray;

$S_0 \times U_0$ (where $U_0 \geq 2$) drive lines arranged in the first direction;

a plurality of signal lines arranged in the second direction;

a first drive circuit connected with the $S_0 \times U_0$ drive lines; and a second drive circuit connected with the plurality of signal lines, in which each temperature detection device includes a first terminal and a second terminal, the second terminal of each temperature detection device is connected to a signal line, and a (s, u)-th drive line (where s=1, 2, . . . , $S_0$, u=1, 2, . . . , $U_0$) is connected to the first terminals of $\{(t-1)U_0+u\}$-th temperature detection devices (t=1, 2, 3, . . . ) in a group of temperature detection devices configured of $S_0$ s-th temperature detection devices arranged in the first direction.

Effects of the Invention

In the imaging apparatus according to the first aspect in the present disclosure, the first substrate is bonded to the covering layer formed on the second substrate and the cavities are provided between the temperature detection devices and the covering layer, thereby providing the cavities for the temperature detection devices with high accuracy. In the imaging apparatus according to the second aspect or the third aspect in the present disclosure, each temperature detection device unit is configured in which a plurality of temperature detection devices are arranged, a wavelength of an infrared ray detected by each temperature detection device is different in the temperature detection device unit, or the amount of absorbed infrared ray of each temperature detection device is different in the temperature detection device unit, thereby changing wavelength spectroscopic characteristics or infrared sensitivity per temperature detection device. In the imaging apparatus according to the fourth aspect in the present disclosure, a (n, p)-th signal line is connected to the second terminals of $\{(q-1)P_0+p\}$-th temperature detection devices in a group of temperature detection devices configured of $N_0$ n-th temperature detection devices arranged in the second direction, thereby sufficiently securing a time required to integrate the signals output from the temperature detection devices and achieving higher sensitivity and less noises of the imaging apparatus. In the imaging apparatus according to the fifth aspect in the present disclosure, a (s, u)-th drive line is connected to the first terminals of $\{(t-1)U_0+u\}$-th temperature detection devices in a group of temperature detection devices configured of $S_0$ s-th temperature detection devices arranged in the first direction, thereby achieving a reduction in power consumption in driving the temperature detection devices. Additionally, the effects described in the present specification are merely exemplary and are not restrictive, and an additional effect may be obtained.

BRIEF DESCRIPTION OF DRAWINGS

FIG. 6A and FIG. 6B are schematic partial end views of another variant of the imaging apparatus according to the second embodiment.

FIG. 14 is a graph schematically illustrating a relationship between a radiation spectrum from an object and an infrared ray wavelength.

MODE FOR CARRYING OUT THE INVENTION

Figure 1A:
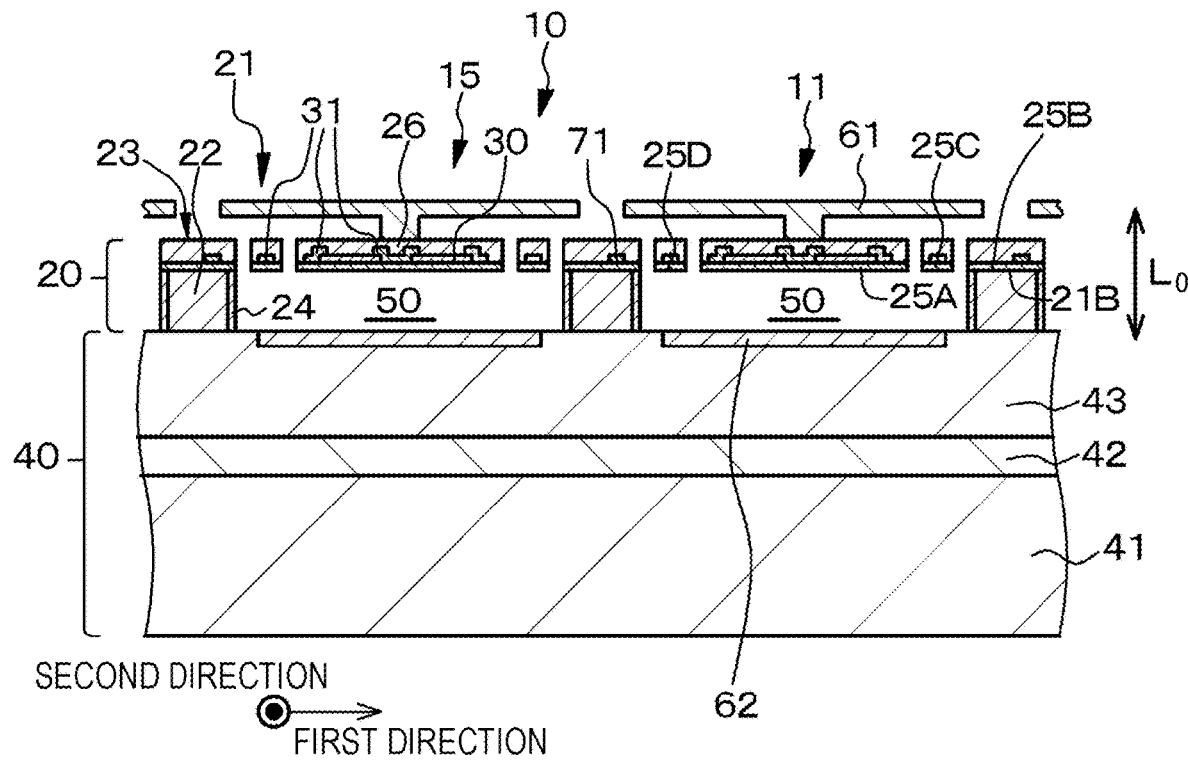
FIG. 1A and FIG. 1B are a schematic partial end view and a schematic partial plan view of an imaging apparatus according to a first embodiment, respectively.

The present disclosure will be described below on the basis of embodiments with reference to the drawings, but the present disclosure is not limited to the embodiments and various numerical values or materials in the embodiments are exemplary. Additionally, the description will be made below in the following order.
1. General description of imaging apparatuses in the present disclosure according to first aspect in the present disclosure to fifth aspect in the present disclosure, imaging apparatus according to preferable form in the present disclosure, and noise reduction method in imaging apparatus according to preferable form in the present disclosure
2. First embodiment (imaging apparatus according to first aspect in the present disclosure, specifically imaging apparatus in face-to-back structure, and its variant)
3. Second embodiment (variant of first embodiment, specifically imaging apparatus in face-to-face structure)
4. Third embodiment (variant of first embodiment and second embodiment)
5. Fourth embodiment (variant of first embodiment to third embodiment)
6. Fifth embodiment (imaging apparatuses according to second aspect and third aspect in the present disclosure)
7. Sixth embodiment (imaging apparatus according to fourth aspect in the present disclosure)
8. Seventh embodiment (imaging apparatus according to fifth aspect in the present disclosure)
9. Eighth embodiment (imaging apparatus according to sixth aspect in the present disclosure)
10. Ninth embodiment (imaging apparatus according to seventh aspect in the present disclosure)
11. 10th embodiment (noise reduction method in imaging apparatus)
12. 11th embodiment (exemplary application of imaging apparatus according to the present disclosure)
13. 12th embodiment (exemplary application to mobile object control system)
14. 13th embodiment (exemplary application to endoscopic surgery system)
15. Others <General Description of Imaging Apparatuses in the Present Disclosure According to First Aspect in the Present Disclosure to Fifth Aspect in the Present Disclosure, Imaging Apparatus According to Preferable Form in the Present Disclosure, and Noise Reduction Method in Imaging Apparatus According to Preferable Form in the Present Disclosure>

In order to simplify a configuration of an entire imaging apparatus, to reduce an effect of heat generated in a drive circuit chip described below, and to achieve a reduction in lamination cost, there can be employed an imaging apparatus including a substrate for temperature detection devices, the substrate including:

a plurality of temperature detection devices arranged in a 2D matrix shape in a first direction and in a second direction different from the first direction and configured to detect a temperature on the basis of an infrared ray;

a plurality of drive lines arranged in the first direction and connected with the plurality of temperature detection devices; and a plurality of signal lines arranged in the second direction and connected with the plurality of temperature detection devices, in which the substrate for temperature detection devices includes a temperature detection device array region in which a plurality of temperature detection devices are arranged in a 2D matrix shape and a peripheral region surrounding the temperature detection device array region, and the drive lines and the signal lines are electrically connected to a drive circuit provided in a drive circuit chip in the peripheral region in which an infrared ray is incident. Additionally, the imaging apparatus in the aspect will be called "imaging apparatus according to sixth aspect in the present disclosure" as needed.

Alternatively, in order to simplify a configuration of an entire imaging apparatus, to serve as an infrared ray passage window, and to reduce a thickness of an entire imaging apparatus, there can be employed an imaging apparatus configured of a first structure and a second structure, in which:

the first structure includes:

a first substrate;

a plurality of temperature detection devices provided on the first substrate, arranged in a 2D matrix shape in a first direction and in a second direction different from the first direction, and configured to detect a temperature on the basis of an infrared ray;

a plurality of drive lines arranged in the first direction and connected with the plurality of temperature detection devices; and a plurality of signal lines arranged in the second direction and connected with the plurality of temperature detection devices, the second structure includes:

a second substrate; and a drive circuit provided on the second substrate, the first structure includes a temperature detection device array region in which a plurality of temperature detection devices are arranged in a 2D matrix shape and a peripheral region surrounding the temperature detection device array region, the second structure is attached on a side of the first substrate in which an infrared ray is incident, and the drive lines and the signal lines are electrically connected to the drive circuit in the peripheral region. Additionally, the imaging apparatus in the aspect will be called "imaging apparatus according to seventh aspect in the present disclosure" as needed.

An imaging apparatus according to a first aspect in the present disclosure can be configured such that a first structure includes a temperature detection device array region in which a plurality of temperature detection devices are arranged in a 2D matrix shape and a peripheral region surrounding the temperature detection device array region, and drive lines and signal lines are electrically connected to a drive circuit in the peripheral region.

The imaging apparatus according to the first aspect in the present disclosure including the above preferable form can be configured such that a partition wall is formed on a portion of a first substrate between a temperature detection device and another temperature detection device, and the bottom of the partition wall is bonded to a covering layer. Additionally, the thus-configured imaging apparatus is called "imaging apparatus in the face-to-back structure" as needed. In a case where a face of the first substrate opposite to a second substrate is called "first face of the first substrate" and a face of the first substrate opposite to the first face of the first substrate is called "second face of the first substrate", the temperature detection devices are provided on the second face of the first substrate.

Then, the imaging apparatus in the face-to-back structure can be configured such that an exposed face of the covering layer exposed to cavities includes at least one material layer selected from a group comprising an insulative material layer, a metal material layer, an alloy material layer, and a carbon material layer, and the sidewall of the partition wall includes at least one material layer selected from a group comprising an insulative material layer, a metal material layer, an alloy material layer, and a carbon material layer. The inside of the partition wall surrounded by the sidewall of the partition wall is configured of part of the first substrate. In some cases, the inside of the partition wall may include the same material as a material making the sidewall of the partition wall, or may include a different material from a material making the first substrate or the sidewall of the partition wall.

Alternatively, the imaging apparatus in the face-to-back structure can be configured such that the exposed face of the covering layer exposed to the cavities includes at least one material layer selected from a group comprising an insulative material layer, a metal material layer, an alloy material layer, and a carbon material layer. Then, the imaging apparatus in the face-to-back structure including the configuration can be configured such that the sidewall of the partition wall includes at least one material layer selected from a group comprising an insulative material layer, a metal material layer, an alloy material layer, and a carbon material layer.

An insulative material layer making the exposed face of the covering layer exposed to the cavities may be an insulative material layer including oxide (specifically such as $SiO_x$ ($1 \leq X \leq 2$), SiOF, or SiOC), an insulative material layer including nitride (specifically such as SiN), an insulative material layer including oxynitride (specifically such as SiON), or a bonding material layer, a metal material layer making the exposed face of the covering layer exposed to the cavities may be gold (Au), copper (Cu), aluminum (Al), tungsten (W), or titanium (Ti), an alloy material layer making the exposed face of the covering layer exposed to the cavities may be an alloy layer containing the metals, or a solder layer, and a carbon material layer making the exposed face of the covering layer exposed to the cavities may be a carbon film or a carbon nanotube.

Further, various materials described above may be used for an insulative material layer, a metal material layer, an alloy material layer, and a carbon material layer making the sidewall of the partition wall.

A combination of (material of the insulative material layer making the exposed face of the covering layer exposed to the cavities, material of the insulative material layer making the sidewall of the partition wall) may take 16 combinations (insulative material layer, insulative material layer), (insulative material layer, metal material layer), (insulative material layer, alloy material layer), (insulative material layer, carbon material layer), (metal material layer, insulative material layer), (metal material layer, metal material layer), (metal material layer, alloy material layer), (metal material layer, carbon material layer), (alloy material layer, insulative material layer), (alloy material layer, metal material layer), (alloy material layer, alloy material layer), (alloy material layer, carbon material layer), (carbon material layer, insulative material layer), (carbon material layer, metal material layer), (carbon material layer, alloy material layer), and (carbon material layer, carbon material layer).

The insulative material layer making the exposed face of the covering layer exposed to the cavities and the insulative material layer making the sidewall of the partition wall may include the same material or may include different materials. The metal material layer making the exposed face of the covering layer exposed to the cavities and the metal material layer making the sidewall of the partition wall may include the same material or may include different materials. The alloy material layer making the exposed face of the covering layer exposed to the cavities and the alloy material layer making the sidewall of the partition wall may include the same material or may include different materials. The carbon material layer making the exposed face of the covering layer exposed to the cavities and the carbon material layer making the sidewall of the partition wall may include the same material or may include different materials. The imaging apparatus in the face-to-back structure described below is similarly configured. However, "sidewall of partition wall" will be interpreted as "partition wall".

The imaging apparatus in the face-to-back structure including various preferable configurations described above can be configured such that an infrared ray absorption layer is formed on a side of a temperature detection device in which an infrared ray is incident, and an infrared ray reflection layer is formed in the regions of the covering layer positioned at the bottom of a cavity. The infrared ray reflection layer may be formed on the covering layer positioned at the bottom of a cavity, may be formed on part of the covering layer positioned at the bottom of a cavity, or may be formed out of the covering layer positioned at the bottom of a cavity. Then in this case, the infrared ray absorption layer can be configured to be formed above the temperature detection device. Specifically, the infrared ray absorption layer may be formed on the insulative film formed on the temperature detection device, or the infrared ray absorption layer may be formed while a gap (space) is present between the infrared ray absorption layer and the temperature detection device. Further, in the cases, the infrared ray reflection layer can be configured to be formed on the top face of the covering layer (on the top face of the covering layer or part of the top face of the covering layer), or inside the covering layer. Furthermore, in the cases, assuming a wavelength $\lambda_{IR}$ of an infrared ray to be absorbed in the infrared ray absorption layer, an optical distance between the infrared ray absorption layer and the infrared ray reflection layer (distance in consideration of thickness and refractive index of material) $L_0$ can meet:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

$\lambda_{IR}$ may be 8 µm to 14 µm.

Alternatively, the imaging apparatus according to the first aspect in the present disclosure including the preferable form can be configured such that a partition wall is formed independent of the first substrate between the portion of the first substrate positioned between a temperature detection device and another temperature detection device, and the covering layer, and the bottom of the partition wall is bonded to the covering layer. Additionally, the thus-configured imaging apparatus will be called "imaging apparatus in the face-to-face structure" as needed. The partition wall includes a different material from the first substrate. The temperature detection devices are provided on the first face of the first substrate.

Then, the imaging apparatus in the face-to-face structure can be configured such that the exposed face of the covering layer exposed to the cavities includes at least one material layer selected from a group comprising an insulative material layer, a metal material layer, an alloy material layer, and a carbon material layer, and the partition wall includes at least one material layer selected from a group comprising an insulative material layer, a metal material layer, an alloy material layer, and a carbon material layer.

Alternatively, the imaging apparatus in the face-to-face structure can be configured such that the exposed face of the covering layer exposed to the cavities includes at least one material layer selected from a group comprising an insulative material layer, a metal material layer, an alloy material layer, and a carbon material layer. Then, the imaging apparatus in the face-to-face structure including the configuration can be configured such that the partition wall includes at least one material layer selected from a group comprising an insulative material layer, a metal material layer, an alloy material layer, and a carbon material layer.

Additionally, specific examples or combination of insulative material layer, metal material layer, alloy material layer, and carbon material layer making the exposed face of the covering layer exposed to the cavities and insulative material layer, metal material layer, alloy material layer, and carbon material layer making the partition wall may be similar as described for the material making the exposed face of the covering layer and the material making the sidewall of the partition wall in the imaging apparatus in the face-to-back structure.

The imaging apparatus in the face-to-face structure including various preferable configurations described above can be configured such that an infrared ray absorption layer is formed on a side of a temperature detection devices in which an infrared ray is incident, and an infrared ray reflection layer is formed in the regions of the covering layer positioned at the bottom of a cavity. The infrared ray reflection layer may be formed on the covering layer positioned at the bottom of a cavity, or may be formed on part of the covering layer positioned at the bottom of a cavity, or may be formed out of the covering layer positioned at the bottom of a cavity. Further, the infrared ray absorption layer may be provided on the first face of the first substrate, or may be provided on the second face of the first substrate, or may be provided on a protective substrate described below. Then in this case, the infrared ray reflection layer can be configured to be formed on the top face of the covering layer (on the top face of the covering layer or part of the top face of the covering layer) or inside the covering layer. Furthermore, in the cases, assuming a wavelength $\lambda_{IR}$ of an infrared ray to be absorbed in the infrared ray absorption layer, an optical distance $L_0$ between the infrared ray absorption layer and the infrared ray reflection layer can meet:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

In some cases, the infrared ray absorption layer may be formed opposite to the side of the temperature detection device in which an infrared ray is incident.

Furthermore, the imaging apparatus in the face-to-face structure including various preferable configurations described above can be configured such that the protective substrate is attached on the face of the first substrate (the second face of the first substrate) in which an infrared ray is incident. A material making the protective substrate may be a silicon semiconductor substrate, a glass substrate, a quartz substrate, a plastic substrate, a plastic film, a germanium substrate, or a substrate including a material transmitting an infrared ray (specifically such as $CaF_2$, $BaF_2$, $Al_2O_3$, and ZnSe). Further, plastic such as polyethylene may be employed.

Furthermore, the imaging apparatus according to the first aspect in the present disclosure including various preferable forms and configurations described above can take a form in which a heat conductive layer is formed on the covering layer. The heat conductive layer may have high heat conductivity, or inversely may have low heat conductivity. A material making the heat conductive layer with high heat conductivity may be a metal material or a carbon-based material such as carbon film or carbon nanotube, and a material making the heat conductive layer with low heat conductivity may be an organic material. Though not limited, the heat conductive layer is preferably formed on the entire temperature detection device array region. Further, though not limited, the heat conductive layer is desirably arranged inside the covering layer and below the infrared ray reflection layer. In some cases, the heat conductive layer may serve as the infrared ray reflection layer.

Furthermore, the imaging apparatus according to the first aspect in the present disclosure including various preferable forms and configurations described above can be configured such that temperature control layers are formed on the covering layer and temperature detection means are further provided, thereby controlling temperatures or a distribution of temperatures of the temperature detection devices with high accuracy. Here, the temperature control layers can function as heaters (resistors, resistive members), and the temperature control layers may serve as wirings, for example. Specifically, the temperature detection means may be silicon diodes, transistors, or polysilicon thin films configured to detect a temperature by measuring a change in temperature-dependent electric resistance value, a material making the temperature control layers serving as wirings may be a metal-based material film such as tungsten film, a polysilicon film, or a titanium film, and a material making the temperature control layers may be a laminated film using the Peltier effect, or a carbon film. In some cases, the temperature control layers may be provided on the second substrate. Further, in the cases, the drive circuit can be configured to control the temperature control layers on the basis of the temperature detection results of the temperature detection means (specifically, for example, to control a current flowing in the temperature control layers thereby to control the amounts of generated heat in the temperature control layers). Then in the configurations, there can be configured such that:

the first structure includes a temperature detection device array region in which a plurality of temperature detection devices are arranged in a 2D matrix shape and a peripheral region surrounding the temperature detection device array region, the temperature control layers are formed in the temperature detection device array region, or the temperature control layers are formed in regions of the covering layer in which an orthographically-projected image of the temperature detection device array region is present, or the drive circuit includes analog-digital conversion circuits (ADC), and the analog-digital conversion circuits are not arranged in regions of the drive substrate in which an orthographically-projected image of the temperature detection device array region is present. The analog-digital conversion circuits generate much heat, thereby achieving more uniform temperatures in the configuration. Additionally, the arrangement of the temperature control layers can be applied to a structure in which not temperature detection devices but well-known light receiving devices (light receiving devices configured to receive a visible ray) are formed. Further, in some cases, the temperature control layers may serve as the infrared ray reflection layers.

Furthermore, the imaging apparatus according to the first aspect in the present disclosure including various preferable forms and configurations described above can take a form in which a cavity is shared in 2×k adjacent temperature detection devices (where k is an integer of 1 or more).

An imaging apparatus according to a second aspect in the present disclosure can be configured such that:

each temperature detection device has an infrared ray absorption layer on a side in which an infrared ray is incident, and an infrared ray reflection layer opposite to the side in which an infrared ray is incident, an optical distance $L_0$ between the infrared ray absorption layer and the infrared ray reflection layer in each temperature detection device is different in a temperature detection device unit, assuming a wavelength $\lambda_{IR}$ of an infrared ray to be absorbed in the infrared ray absorption layer configuring a temperature detection device, an optical distance $L_0$ in each temperature detection device meets:

$$0.75 \times \lambda_{IR}/2 \le L_0 \le 1.25 \times \lambda_{IR}/2$$

or $$0.75 \times \lambda_{IR}/4 \le L_0 \le 1.25 \times \lambda_{IR}/4.$$

Then, the imaging apparatus according to the second aspect in the present disclosure including the preferable form can be configured such that:

each temperature detection device has an infrared ray absorption layer on a side in which an infrared ray is incident, and an infrared ray reflection layer opposite to the side in which an infrared ray is incident, a material, configuration, and structure making the infrared ray absorption layer, or a material, configuration, and structure making the infrared ray reflection layer, or the material, configuration, and structure making the infrared ray absorption layer and the material, configuration, and structure making the infrared ray reflection layer are different for each temperature detection device in the temperature detection device unit. That is, the following forms can be employed:

(Case A) The material, configuration, and structure making the infrared ray absorption layer are different and the material, configuration, and structure making the infrared ray reflection layer are the same for each temperature detection device.

(Case B) The material, configuration, and structure making the infrared ray reflection layer are different and the material, configuration, and structure making the infrared ray absorption layer are the same for each temperature detection device.

(Case C) The material, configuration, and structure making the infrared ray absorption layer are different and the material, configuration, and structure making the infrared ray reflection layer are different for each temperature detection device.

An imaging apparatus according to a third aspect in the present disclosure can be configured such that:

each temperature detection device has an infrared ray absorption layer on a side in which an infrared ray is incident, and an infrared ray reflection layer opposite to the side in which an infrared ray is incident, a material making the infrared ray absorption layer, or a material making the infrared ray reflection layer, or the material making the infrared ray absorption layer and the material making the infrared ray reflection layer are different for each temperature detection device in a temperature detection device unit. Then, the imaging apparatus according to the third aspect in the present disclosure including the preferable form can be configured such that:

each temperature detection device has an infrared ray absorption layer on a side in which an infrared ray is incident, and an infrared ray reflection layer opposite to the side in which an infrared ray is incident, and the infrared ray absorption layer, or the infrared ray reflection layer, or the infrared ray absorption layer and the infrared ray reflection layer are different in area, or thickness, or area and thickness for each temperature detection device in a temperature detection device unit. That is, the following forms can be employed:

(Case a) The infrared ray absorption layer is different in area and the infrared ray reflection layer is the same in area for each temperature detection device.

(Case b) The infrared ray reflection layer is different in area and the infrared ray absorption layer is the same in area for each temperature detection device.

(Case c) The infrared ray absorption layer is different in area and the infrared ray reflection layer is different in area for each temperature detection device.

(Case d) The infrared ray absorption layer is different in thickness and the infrared ray reflection layer is the same in thickness for each temperature detection device.

(Case e) The infrared ray reflection layer is different in thickness and the infrared ray absorption layer is the same in thickness for each temperature detection device.

(Case f) The infrared ray absorption layer is different in thickness and the infrared ray reflection layer is different in thickness for each temperature detection device.

(Case g) The infrared ray absorption layer is different in area and thickness and the infrared ray reflection layer is the same in area and thickness for each temperature detection device.

(Case h) The infrared ray reflection layer is different in area and thickness and the infrared ray absorption layer is the same in area and thickness for each temperature detection device.

(Case i) The infrared ray absorption layer is different in area and thickness and the infrared ray reflection layer is different in area and thickness for each temperature detection device.

In the imaging apparatuses according to the second aspect and the third aspect in the present disclosure, the number of temperature detection devices configuring the temperature detection device unit may be 2 or more.

An imaging apparatus according to a fourth aspect in the present disclosure can be configured such that:

the number of plurality of drive lines is $M_0/P_0$, and an m-th drive line (where m=1, 2, . . . , $M_0/P_0$) is shared in a group of temperature detection devices configured of $M_0\{(m-1)P_0+p'\}$-th temperature detection devices (where all values of p'=1, 2, . . . $P_0$) arranged in the first direction.

Then, the imaging apparatus according to the fourth aspect in the present disclosure including the preferable form can be configured such that each signal line is connected to an analog front end and an analog-digital conversion circuit in the second drive circuit and the analog front end has a differential integration circuit functioning as an amplifier (preamplifier) Alternatively, the imaging apparatus according to the fourth aspect in the present disclosure including the preferable form can be configured such that each signal line is connected to an analog front end and an analog-digital conversion circuit in the second drive circuit, and in this case, the analog front end has a differential integration circuit. The analog front end including a differential integration circuit, and the analog-digital conversion circuit can be in a well-known circuit configuration.

Furthermore, the imaging apparatus according to the fourth aspect in the present disclosure including various preferable forms and configurations described above can be configured such that:

a temperature detection device is arranged above a cavity provided on a substrate for temperature detection devices, a first connection part provided on the substrate for temperature detection devices is connected to the first terminal of the temperature detection device via a first stud (support leg or elongate beam, which applies hereafter), a second connection part provided on the substrate for temperature detection devices is connected to the second terminal of the temperature detection device via a second stud. Then in this case, $P_0$=2 is assumed, the second terminals of two temperature detection devices adjacent in the second direction are connected to the second connection part provided on the substrate for temperature detection devices via one second stud, and the first terminals of a total of four temperature detection devices including two temperature detection devices adjacent in the first direction and two temperature detection devices adjacent in the second direction are connected to the first connection part provided on the substrate for temperature detection devices via one first stud.

The imaging apparatuses according to the first aspect to the seventh aspect in the present disclosure including various preferable forms and configurations described above can be configured such that each signal line is connected to an analog front end and an analog-digital conversion circuit in the second drive circuit. Then in this case, the analog front end has a differential integration circuit, and a switch means configured to control the conductive state between a differential integration circuit and a signal line is provided between the differential integration circuit and the signal line. Furthermore, in this case, there can be configured such that when the switch means sets the differential integration circuit and the signal line in the non-conductive state, the signal line is set at a fixed potential. The analog front end including a differential integration circuit, the analog-digital conversion circuit, and the switch means can be in a well-known circuit configuration.

The imaging apparatuses according to the first aspect to the seventh aspect in the present disclosure including various preferable forms and configurations described above can be configured such that the temperature detection devices include various diodes such as pn junction diodes including SOI diodes, or schottky diodes, transistors, or a combination of diodes and active devices; resistive bolometric devices including vanadium oxide film, amorphous silicon film, polysilicon film, silicon carbide film, or titanium film; thermoelectric conversion devices using a metal such as platinum, gold, or nickel, thermistor, or the like; thermopile devices using the Seebeck effect; pyroelectric devices with changing surface charges of dielectric bodies; ferroelectric devices; diodes using the tunnel effect; or devices with applied superconductivity. These have well-known configurations and structures. More specifically, the temperature detection devices can include pn junction diodes, bolometric devices, thermopile devices, metal film resistive devices, metal oxide resistive devices, ceramic resistive devices, or thermistor devices. One temperature detection device can include a plurality of diodes connected in series, for example. The temperature detection devices can be formed in the MEMS technique, for example.

In the imaging apparatuses according to the second aspect to the fifth aspect in the present disclosure, the temperature detection devices can be provided on the first substrate or the side of the substrate for temperature detection devices in which an infrared ray is incident, or may be provided opposite to the first substrate or the side of the substrate for temperature detection devices in which an infrared ray is incident.

In the imaging apparatuses according to the first aspect to the seventh aspect in the present disclosure including various preferable forms and configurations described above (which may be called "imaging apparatuses and the like in the present disclosure" below), the number of plurality of temperature detection devices or temperature detection device units arranged in a 2D matrix shape in the first direction and in the second direction different from the first direction and configured to detect a temperature on the basis of an infrared ray may be 640×480 (VGA), 320×240 (QVGA), 160×120 (QQVGA), 612×512, 1980×1080 (and its integral multiple), and 2048×1080 (and its integral multiple) by way of example. The first direction and the second direction are preferably orthogonal to each other, but are not limited thereto, and the pixels in the pixel arrangement having the above number of pixels may be checkerwise removed, and arranged to be obliquely rotated by 45 degrees.

In the imaging apparatuses and the like in the present disclosure, the first substrate or the substrate for temperature detection devices can include a silicon semiconductor substrate or a SOI substrate, for example, and the second substrate may include a silicon semiconductor substrate, for example. The drive lines and the signal lines may include a well-known conductive material in a well-known method. The drive circuit provided in the second structure can be configured of a well-known drive circuit. Alternatively, the drive circuit can be configured of a well-known readout integrated circuit (ROIC).

The covering layer covering the drive circuit in the second structure may include a silicon oxide-based material, a silicon nitride-based material, a silicon oxynitride-based material, or various organic materials, for example. The covering layer may be a single layer or may be in a laminated structure of a plurality of layers.

A method for electrically connecting the drive lines and the signal lines to the drive circuit may be a method using solder, or bumps including indium, gold (Au), or the like, a method in the chip-on-chop system, a method using through chip vias (TCV) or through silicon vias (TSV), or metal-metal bonding including Cu—Cu.

The first substrate and the covering layer, or specifically the bottoms of the partition walls and the covering layer can be bonded through silicon-oxygen covalent bonding formation by dehydration and condensation, for example.

A material making the infrared ray absorption layer may be chromium (Cr) and its alloy, aluminum (Al) and its alloy, or a laminated structure of a layer including the materials and a $SiO_2$ film or SiN film, for example. It is desirable that heat generated by an infrared ray absorbed in the infrared ray absorption layer is accurately transmitted to the temperature detection device. Further, it is desirable that the infrared ray absorption layer is set at a thickness such that the sheet resistance value of a conductive material or resistive material making the infrared ray absorption layer is at ±30% of 377Ω. A material making the infrared ray reflection layer may be aluminum (Al) and its alloy, gold (Au) and its alloy, silver (Ag) and its alloy, copper (Cu) and its alloy, platinum (Pt) and its alloy, which are different from the infrared ray absorption layer in characteristics (such as area resistivity and sheet resistance value), or a laminated structure of layers including the materials. The infrared ray reflection layer may serve as a metal material layer or alloy material layer making the exposed face of the covering layer.

It is preferable that the space in which the temperature detection devices are arranged is depressurized or evacuated (at a low pressure close to vacuum, which applies hereafter). It is preferable that the cavities are also depressurized or evacuated. Alternatively, it is preferable that the entire imaging apparatus is stored in a depressurized or evacuated package or container (case).

A structure for preventing an infrared ray from being reflected, an infrared filter for transmitting only an infrared ray with a specific frequency, or a light condensing device such as diffraction grating or lens may be arranged in the imaging apparatus on a side in which an infrared ray is incident as needed.

The imaging apparatus according to the first aspect in the present disclosure to the imaging apparatus according to the seventh aspect in the present disclosure, which include various preferable forms and configurations described above, can be arbitrarily combined. The combinations may be of imaging apparatuses according to three or more aspects, not limited to imaging apparatuses according to two aspects.

The imaging apparatuses and the like in the present disclosure can be applied to infrared cameras, night-vision cameras, thermographs, vehicle-mounted cameras (person detection), air conditioners (person detection sensor), and microwave ovens, for example.

First Embodiment

Figure 1B:
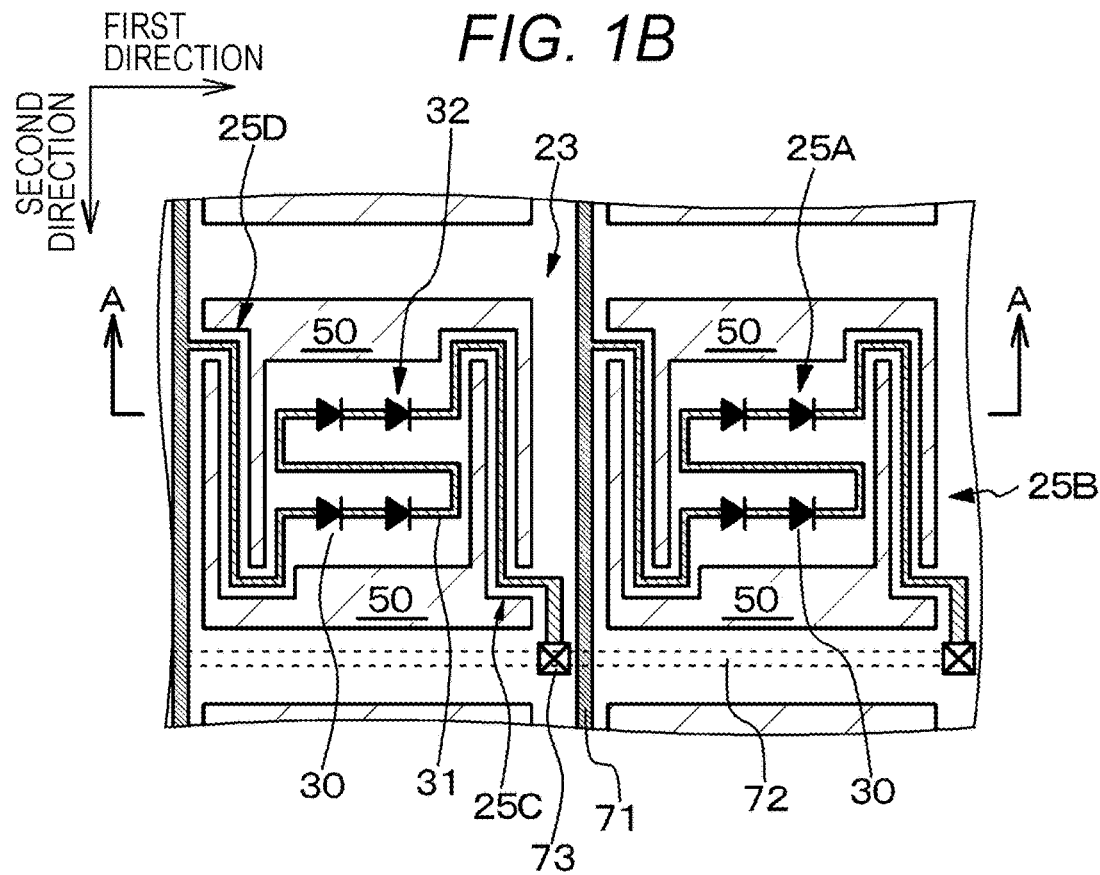
Figure 3:
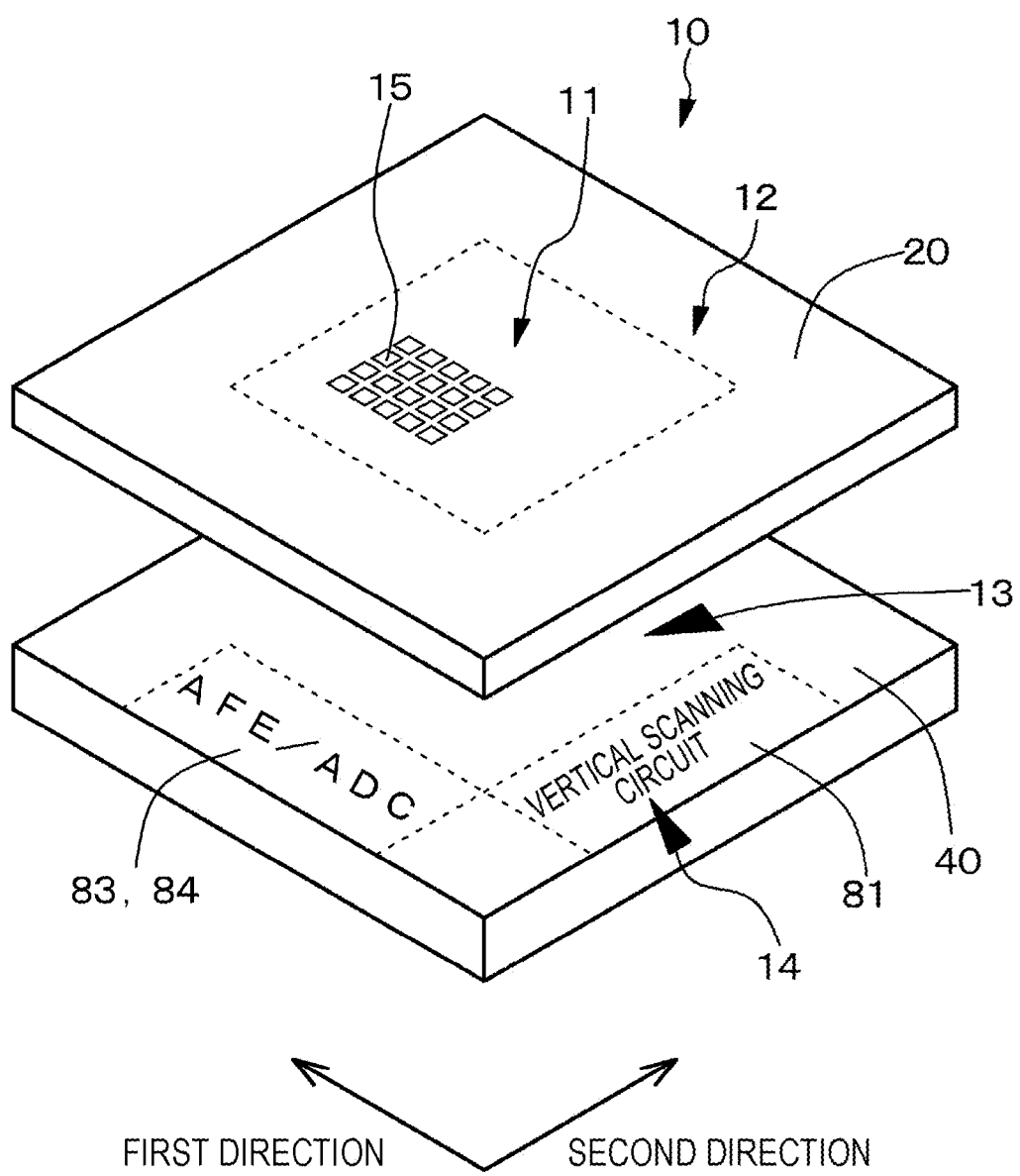
FIG. 3 is a schematic exploded perspective view of a first structure and a second structure in the imaging apparatus according to the first embodiment.
Figure 4:
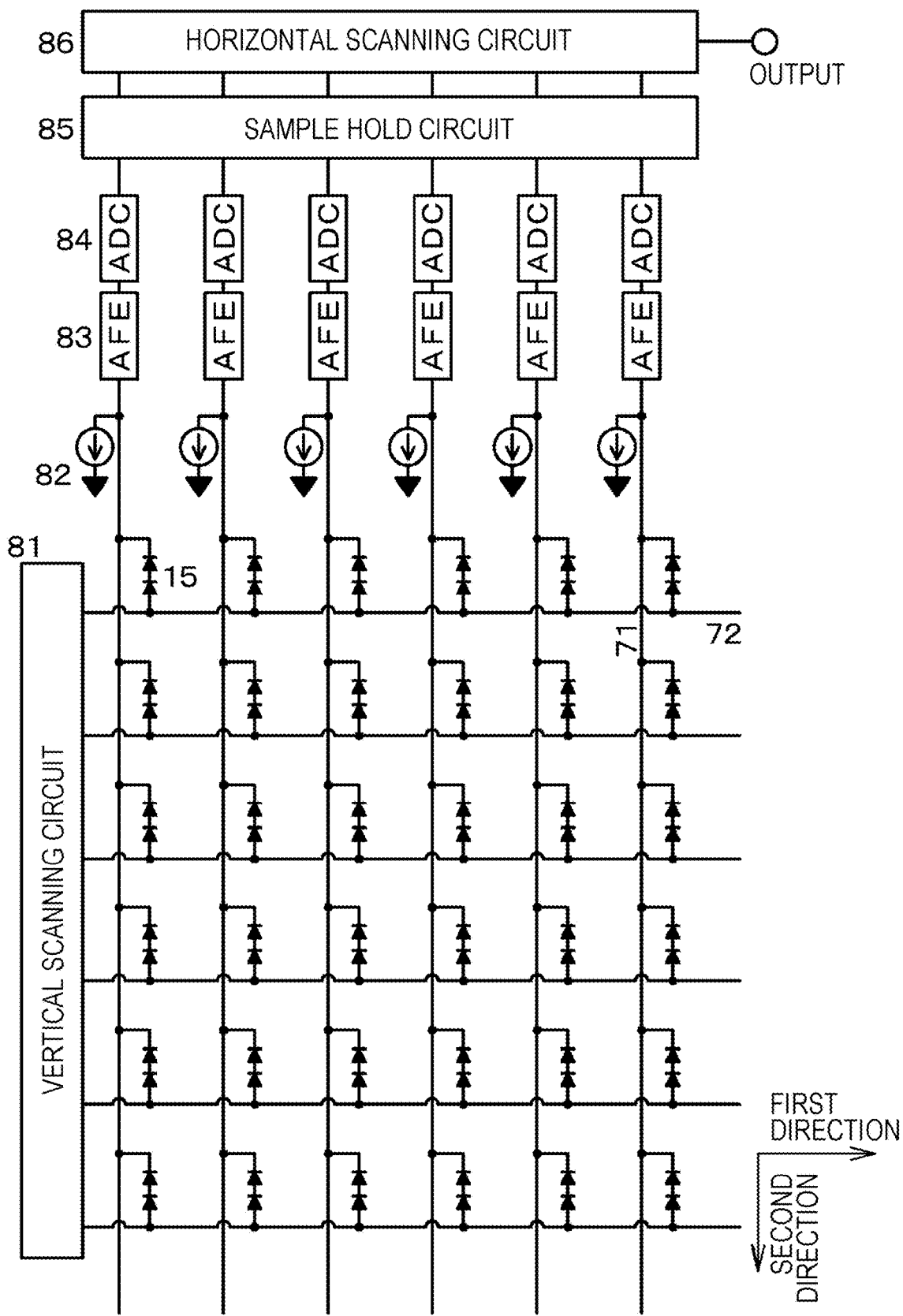
FIG. 4 is an equivalent circuit diagram of the imaging apparatus according to the first embodiment.

A first embodiment relates to the imaging apparatus according to the first aspect in the present disclosure. FIG. 1A illustrates a schematic partial end view of an imaging apparatus according to the first embodiment, and FIG. 1B illustrates a schematic partial plan view. Further, FIG. 3 illustrates a schematic exploded perspective view of a first structure and a second structure in the imaging apparatus according to the first embodiment, and FIG. 4 illustrates an equivalent circuit diagram of the imaging apparatus according to the first embodiment. The imaging apparatus according to the first embodiment is specifically an imaging apparatus in the face-to-back structure. Here, FIG. 1A is a schematic partial end view along the arrow A-A of FIG. 1B.

Further, the insulative film and the infrared ray absorption layer are not illustrated in FIG. 1B, the cavities, the signal lines, and the wirings are shaded for clear illustration, the drive lines are indicated in dotted lines, and the pn junction diodes are denoted by symbols.

An imaging apparatus 10 according to the first embodiment is configured of a first structure 20 and a second structure 40, in which:

the first structure 20 includes:

a first substrate 21;

a plurality of temperature detection devices 15 formed on the first substrate 21, arranged in a 2D matrix shape in a first direction and in a second direction different from the first direction, and configured to detect a temperature on the basis of an infrared ray;

a plurality of drive lines 72 arranged in the first direction and connected with the plurality of temperature detection devices 15; and a plurality of signal lines 71 arranged in the second direction and connected with the plurality of temperature detection devices 15, the second structure 40 includes:

a second substrate 41; and a drive circuit provided on the second substrate 41 and covered with a covering layer (interlayer insulative layer) 43, the first substrate 21 is bonded to the covering layer 43, and a cavity 50 is provided between each temperature detection device 15 and the covering layer 43.

Then, the drive lines 72 and the signal lines 71 are electrically connected to the drive circuit. In the Figures, a layer in which the drive circuit is formed is schematically denoted with a reference numeral 42. Here, the first structure 20 includes a temperature detection device array region 11 (surrounded in a dotted line) in which a plurality of temperature detection devices 15 are arranged in a 2D matrix shape and a peripheral region 12 surrounding the temperature detection device array region 11 as illustrated in FIG. 3, and the drive lines 72 and the signal lines 71 are electrically connected to the drive circuit in the peripheral region 12. Additionally, the center region in the second structure 40 is denoted with a reference numeral 13 and the peripheral region in the second structure 40 is denoted with a reference numeral 14.

The drive lines 72 and the signal lines 71 are electrically connected to the drive circuit via through silicon vias (TSV), for example, in the peripheral regions 12 and 14, but the through silicon vias (TSV) are not illustrated. The peripheral region 14 in the second structure 40 is arranged with a region in which analog front ends (AFE) 83 each including a differential integration circuit configuring the drive circuit, a sample hold circuit 84, and analog-digital conversion circuits (ADC) 85 are provided, as well as constant current circuits 82 and a vertical scanning circuit 81, for example. The differential integration circuit functions as an amplifier (preamplifier). Further, the center region 13 in the second structure 40 is arranged with a horizontal scanning circuit 86 configuring the drive circuit, a CPU (or DSP), a signal processing circuit, a storage apparatus (such as memory or nonvolatile memory), and the like, for example. Additionally, the CPU (or DSP), the signal processing circuit, and the storage apparatus are not illustrated. The drive circuit provided in the second structure 40 can be configured of a well-known drive circuit.

In the imaging apparatus 10 according to the first embodiment, a partition wall 23 is formed on the first substrate 21 positioned between a temperature detection device 15 and another temperature detection device 15, and the bottom of the partition wall 23 is bonded to the covering layer 43. Here, the bottom of the partition wall 23 and the covering layer 43 are bonded through silicon-oxygen covalent bonding formation by dehydration and condensation. A sidewall 24 of the partition wall 23 includes at least one material layer selected from a group comprising an insulative material layer, a metal material layer, an alloy material layer, and a carbon material layer. Specifically, according to the first embodiment, the sidewall 24 of the partition wall 23 includes an insulative material layer such as $SiO_2$ layer. Further, the inside of the partition wall 23 surrounded by the sidewall 24 of the partition wall 23 is configured of part of the first substrate 21, or specifically a silicon layer 22. The exposed face of the covering layer 43 exposed to the cavities 50 includes at least one material layer selected from a group comprising an insulative material layer, a metal material layer, an alloy material layer, and a carbon material layer. Specifically, according to the first embodiment, the exposed face of the covering layer 43 exposed to the cavities 50 includes an insulative material layer such as $SiO_2$ layer, and an interlayer insulative layer (not specifically illustrated) including SiN or the like configuring the covering layer 43 is formed below the $SiO_2$ layer. Additionally, if the sidewall 24 of the partition wall 23 includes a material which reflects an infrared ray, an incident infrared ray can be effectively reflected.

According to the first embodiment, a temperature detection device 15 is configured in which a plurality of (four in the illustrated example) pn junction diodes 30 are connected in series via a wiring 31, but are not limited thereto and can be configured of resistive bolometric devices, thermoelectric conversion devices, thermopile devices, pyroelectric devices, or ferroelectric devices having a well-known configuration or structure. The pn junction diodes have a well-known configuration or structure. The temperature detection devices 15 are formed in the MEMS technique as described below. The temperature detection devices 15 are provided on a side of the first substrate 21 in which an infrared ray is incident (a second face 21B of the first substrate 21).

A temperature detection device 15 (specifically pn junction diodes 30) is formed on diaphragm parts (aerial parts, aerial thin layer parts) 25A configured of an insulative material layer including $SiO_2$. Further, an insulative material layer 25B including $SiO_2$ is formed on the top face of the partition wall 23. The diaphragm part 25A and the insulative material layer 25B are integrally formed via a first stud 25C (support leg or elongate beam, which applies hereafter) and a second stud 25D corresponding to the extensions of the diaphragm part 25A and the insulative material layer 25B. A cavity 50 is present below the diaphragm 25A, the first stud 25C, and the second stud 25D.

One end of a temperature detection device 15 (a pn junction diode 30 positioned at one end of the plurality of pn junction diodes 30) is connected to a signal line 71 provided on the insulative material layer 25B formed on the partition wall 23 via the wiring 31 formed on the diaphragm part 25A and the second stud 25D. Further, the other end of the temperature detection device 15 (a pn junction diode 30 positioned at the other end of the plurality of pn junction diodes 30) is connected to a drive line 72 formed above the partition wall 23 via the wiring 31 formed the diaphragm part 25A and the first stud 25C, and further via a contact hole 73. The diaphragm parts 25A, the first studs 25C, the second studs 25D, the pn junction diodes 30, the wirings 31, the signal lines 71, and the drive lines 72 are covered with an insulative film 26 including SiO$_2$.

The temperature detection devices 15 (specifically the pn junction diodes 30) can be formed by ion-implanting an n-type impurity and a p-type impurity in a silicon layer, for example. The number of plurality of temperature detection devices 15 is 640×480 (VGA), for example. The first direction and the second direction are orthogonal to each other. All or part of the first substrate 21 is configured of a SOI substrate, and the second structure 40 is configured of the second substrate 41 including a silicon semiconductor substrate. The wirings 31, the signal lines 71, the drive lines 72, and the contact holes 73 include an aluminum alloy, for example.

An infrared ray absorption layer 61 including an aluminum thin film is formed on a side of a temperature detection device 15 in which an infrared ray is incident (the second face 21B of the first substrate 21), and an infrared ray reflection layer 62 including a copper thin film is formed in the regions of the covering layer 43 positioned at the bottom of a cavity 50. In the illustrated example, the infrared ray reflection layer 62 is formed on part of the covering layer 43 positioned at the bottom of a cavity 50. Further, the infrared ray absorption layer 61 is formed above a temperature detection device 15. Specifically, the infrared ray absorption layer 61, which partially contacts the insulative film 26 and is partially apart (spaced) from the insulative film 26, is formed on the insulative film 26. The infrared ray reflection layer 62 is formed on the top face of the covering layer 43. Then, assuming a wavelength $\lambda_{IR}$ of an infrared ray to be absorbed in the infrared ray absorption layer 61, an optical distance $L_0$ between the infrared ray absorption layer 61 and the infrared ray reflection layer 62 meets:

$$0.75 \times \lambda_{IR}/2 \le L_0 \le 1.25 \times \lambda_{IR}/2$$

or $$0.75 \times \lambda_{IR}/4 \le L_0 \le 1.25 \times \lambda_{IR}/4.$$

According to the first embodiment, it specifically meets: $L_0 = \lambda_{IR}/4$. The value of $\lambda_{IR}$ is between 8 μm and 14 μm, and specifically $\lambda_{IR} = 10$ μm is assumed according to the first embodiment, though not limited thereto. The wing-shaped infrared ray absorption layers 61 may be partially coupled between adjacent temperature detection devices 15.

While the imaging apparatus is operating, one drive line 72 is selected under control of the vertical scanning circuit 81. On the other hand, a constant current is flowed from the constant current circuits 82 to all the signal lines 71. The temperatures of the selected temperature detection devices 15 change depending on an incident infrared ray, and the temperature changes cause a change in electric resistance value of the temperature detection devices 15 (specifically the pn junction diodes 30). Consequently, a voltage of each signal line 71 changes. The voltage of each signal line 71 is input in one input unit of a differential integration circuit configuring an analog front end (AFE) 83. On the other hand, a standard voltage (reference voltage) is input in the other input unit of the differential integration circuit. The outputs of the temperature detection devices 15 are amplified in the differential integration circuit. Then, after a predetermined time elapses, an integral value of the voltage difference is sent from the differential integration circuit to the sample hold circuit 84, the analog value held in the sample hold circuit 84 is output to the analog-digital conversion circuit (ADC) 85, and the integral value of the voltage difference is converted into a digital value in the analog-digital conversion circuit 85 to be sent to the horizontal scanning circuit 86. Then, the digital value is sequentially output to the signal processing circuit per temperature detection device and is finally output as digital output by the operation of the horizontal scanning circuit 86.

An outline of a method for manufacturing the imaging apparatus according to the first embodiment, particularly a method for manufacturing the first structure 20 will be described below with reference to the schematic partial end views of a SOI substrate and the like of FIG. 25A, FIG. 25B, FIG. 25C, FIG. 25D, FIG. 26A, FIG. 26B, FIG. 26C, FIG. 27A, FIG. 27B, FIG. 28A, and FIG. 28B.

[Step-100]

A SOI substrate 90, in which a first silicon layer 91 is formed on the surface and a SiO$_2$ layer 92 is formed below the first silicon layer 91, is prepared. A portion of a silicon semiconductor substrate configuring the SOI substrate 90 positioned below the SiO$_2$ layer 92 is called "second silicon layer 93" as needed. Then, the second silicon layer 93 in the SOI substrate 90 on which the sidewalls 24 of the partition walls 23 are to be formed is first etched thereby to form grooves, and the grooves are embedded with a material making the sidewalls 24 (see FIG. 25A). Thereafter, the first silicon layer 91 on the surface of the SOI substrate 90 is patterned thereby to leave the first silicon layer 91 on which the pn junction diodes 30 are to be formed. Then, the pn junction diodes 30 are formed on the first silicon layer 91 in a well-known method (see FIG. 25B).

[Step-110]

Figure 25A:
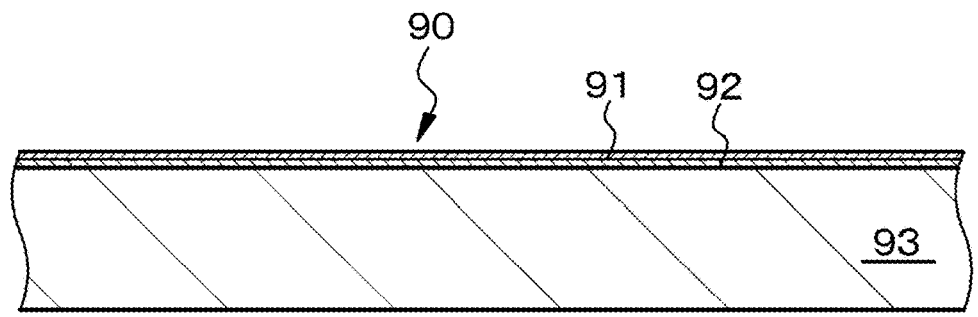
FIG. 25A, FIG. 25B, FIG. 25C, and FIG. 25D are schematic partial end views of a SOI substrate and the like for explaining a method for manufacturing the imaging apparatus according to the first embodiment.
Figure 25B:
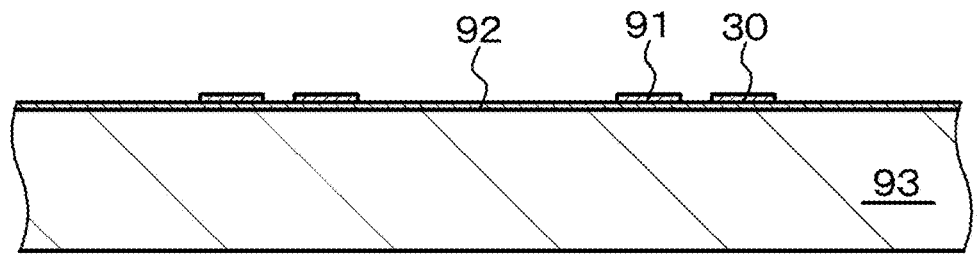
Figure 25C:
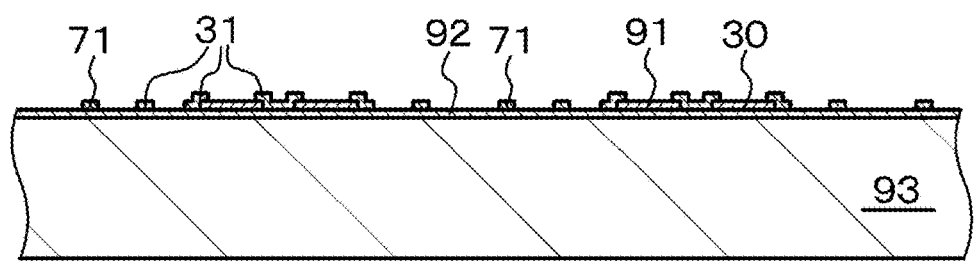
Figure 25D:
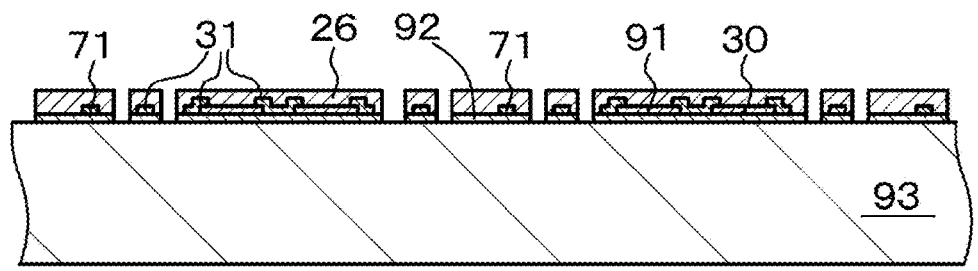

Thereafter, the wirings 31 and the signal lines 71 are formed on the SiO$_2$ layer 92 and part of the pn junction diodes 30 in a well-known method (see FIG. 25C). Then, the insulative film 26 including SiO$_2$, the contact holes 73, and the drive lines 72 are formed on the entire surface, and then the insulative film 26 is patterned (see FIG. 25D). However, the contact holes 73 and the drive lines 72 are not illustrated in and subsequent to FIG. 25D.

[Step-120]

Figure 26A:
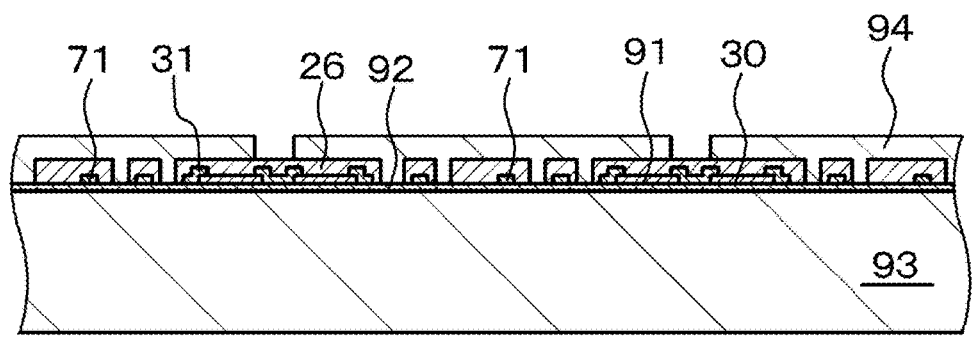
FIG. 26A, FIG. 26B, and FIG. 26C are schematic partial end views of a SOI substrate and the like for explaining the method for manufacturing the imaging apparatus according to the first embodiment subsequent to FIG. 25D.
Figure 26B:
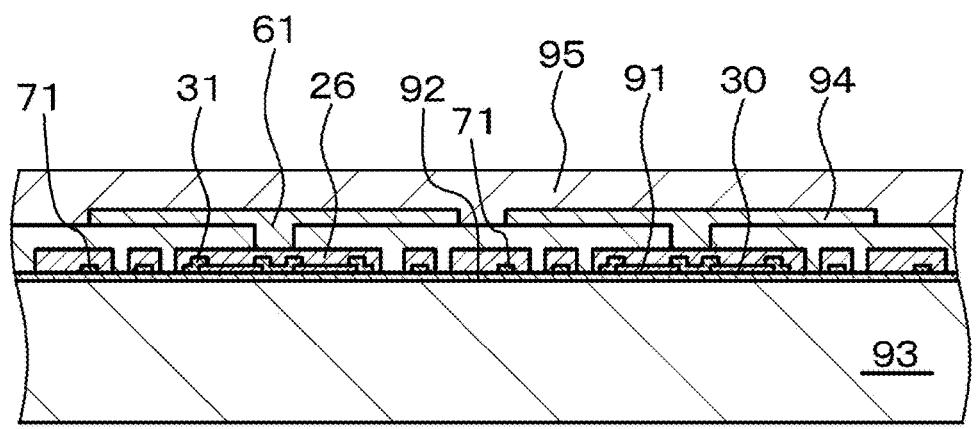
Figure 26C:
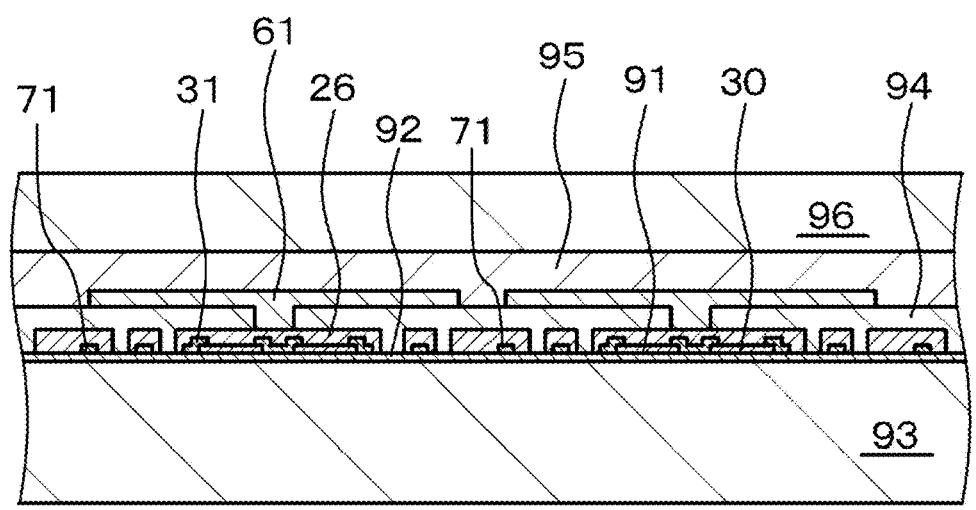

Thereafter, a first sacrifice layer 94 is formed (see FIG. 26A), the infrared ray absorption layer 61 is formed, and a second sacrifice layer 95 is formed (see FIG. 26B), and then a support substrate 96 is attached to the second sacrifice layer 95 (see FIG. 26C)

[Step-130]

Figure 27A:
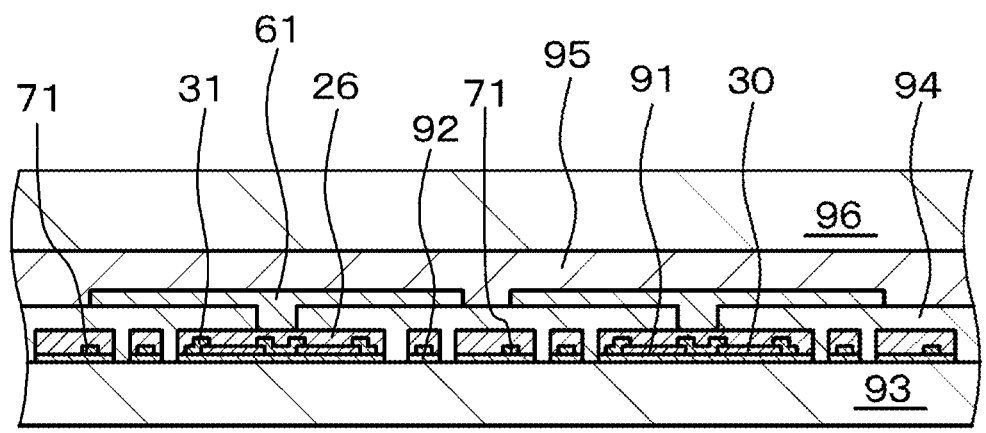
FIG. 27A and FIG. 27B are schematic partial end views of a SOI substrate and the like for explaining the method for manufacturing the imaging apparatus according to the first embodiment subsequent to FIG. 26C.
Figure 27B:
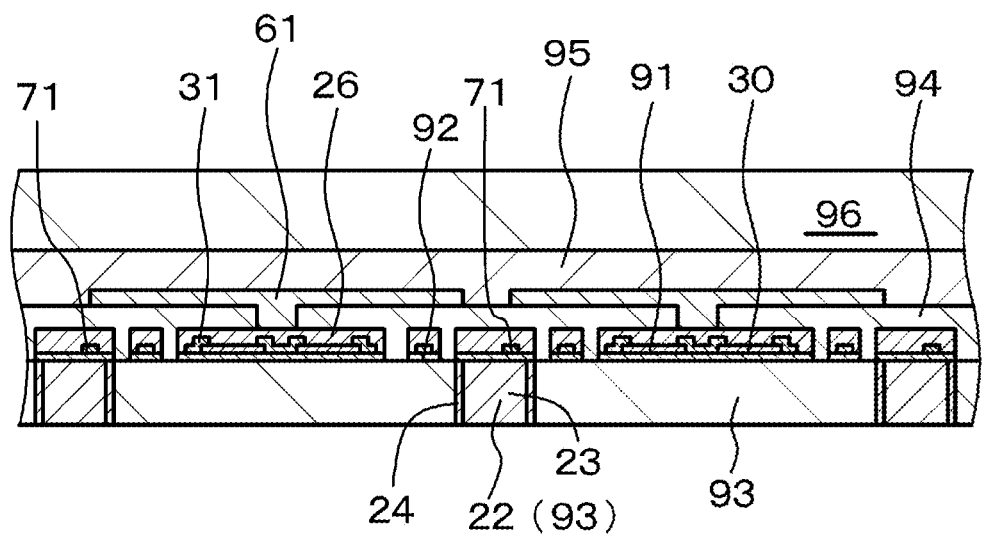

The second silicon layer 93 in the SOI substrate 90 is then thinned by the CMP method (see FIG. 27A). $L_0$ is defined by the thickness of the second silicon layer 93. Therefore, the value of $L_0$ can be accurately defined. The structure illustrated in FIG. 27B can be obtained in this way, but the second silicon layer 93 inside the sidewall 24 corresponds to the partition wall 23, and the hatching of this part is different from the hatching of the second silicon layer 93 for convenience.

[Step-140]

The second structure 40 provided with the drive circuit is prepared. Additionally, the infrared ray reflection layer 62 is formed on the covering layer 43 beforehand. The second silicon layer 93 and the covering layer 43 are then bonded in a well-known method (see FIG. 28A). Then, the drive lines 72 and the signal lines 71 are electrically connected to the drive circuit via through silicon vias (TSV) (not illustrated), for example, in the peripheral regions 12 and 14.

[Step-150]

Figure 28A:
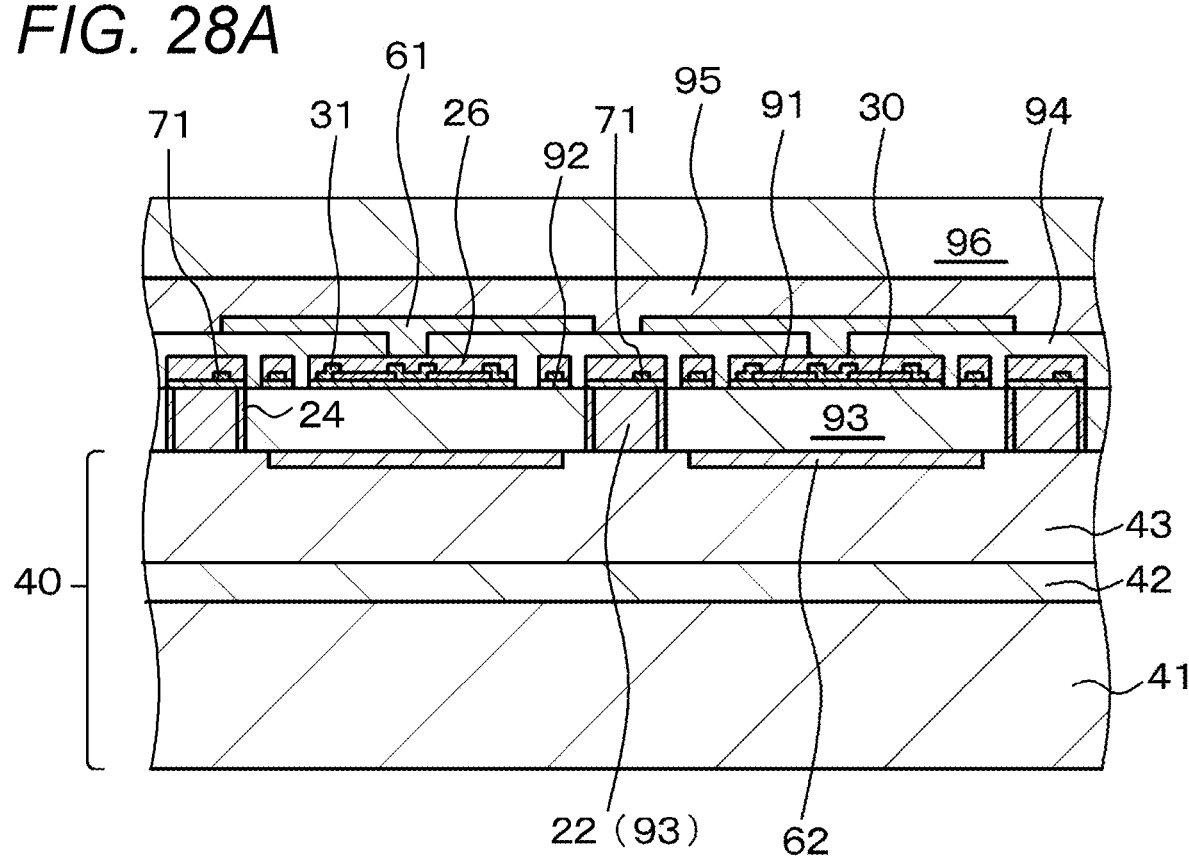
FIG. 28A and FIG. 28B are schematic partial end views of a SOI substrate and the like for explaining the method for manufacturing the imaging apparatus according to the first embodiment subsequent to FIG. 27B.
Figure 28B:
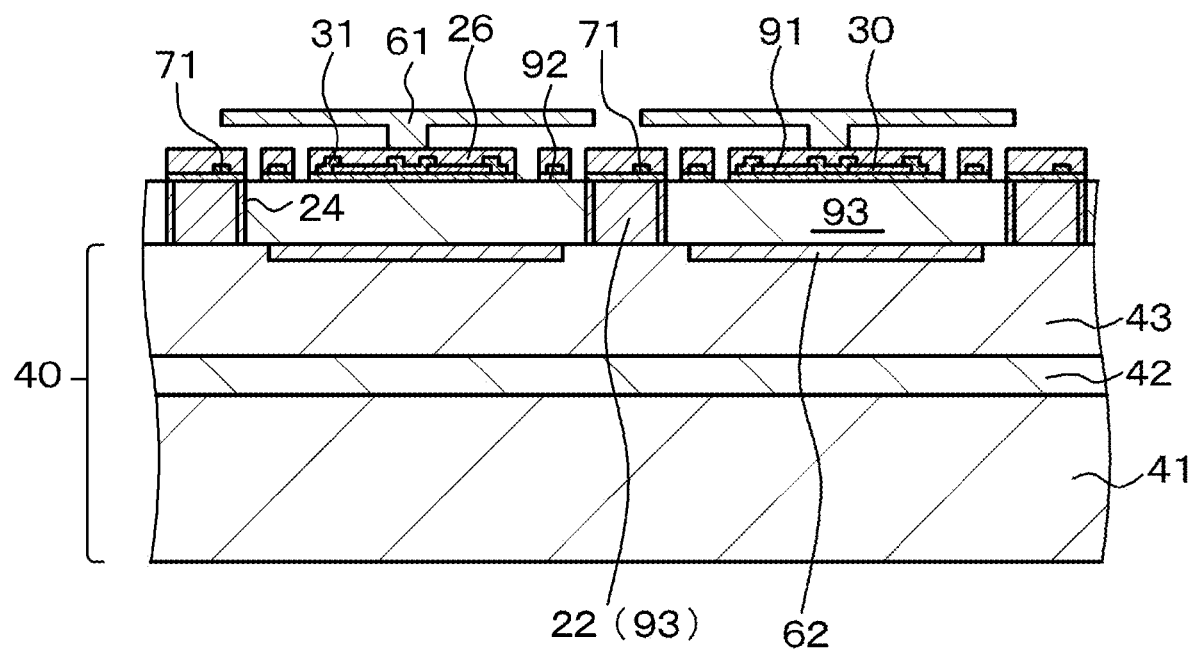
Figure 29A:
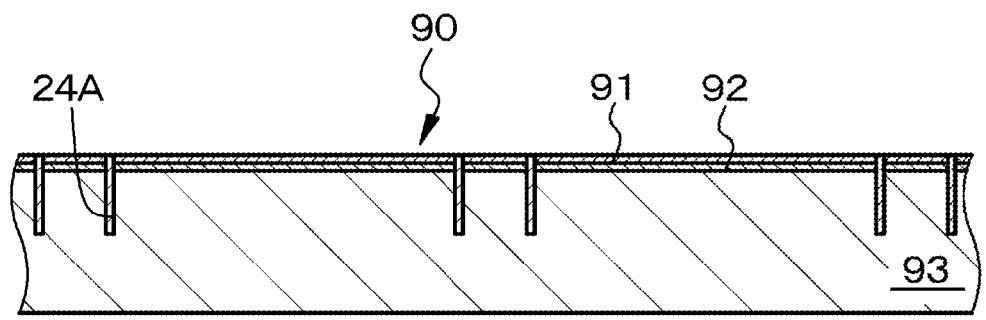
FIG. 29A, FIG. 29B, and FIG. 29C are schematic partial end views of a SOI substrate and the like for explaining a method for manufacturing the imaging apparatus according to the second embodiment.
Figure 29B:
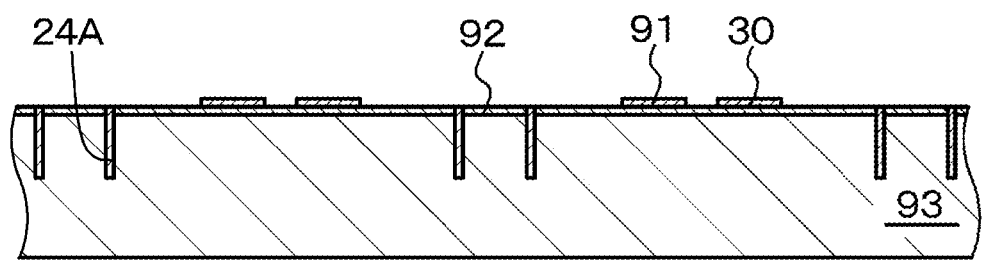
Figure 29C:
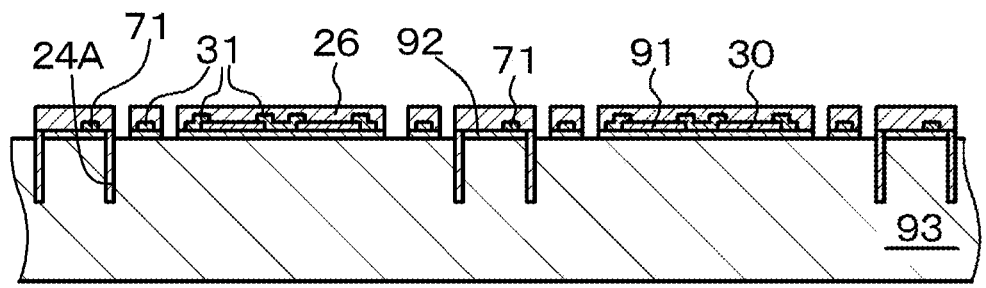

Thereafter, the support substrate 96 is removed, and the second sacrifice layer 95 and the first sacrifice layer 94 are removed in the etching method (see FIG. 28B). Further, the second silicon layer 93 positioned below the pn junction diodes 30 is removed in the etching method. The imaging apparatus 10 illustrated in FIG. 1A can be obtained in this way. The diaphragm parts 25A, the insulative material layer 25B, the first studs 25C, and the second studs 25D are configured of the SiO₂ layer 92. Additionally, the second silicon layer 93 positioned below the pn junction diodes 30 may not be totally removed.

Thereafter, the resultant imaging apparatus 10 is packaged under the vacuum atmosphere. Thereby, the space in which the temperature detection devices 15 are arranged is depressurized or evacuated. The cavities 50 are also depressurized or evacuated.

In the imaging apparatus according to the first embodiment, the first substrate is bonded to the covering layer formed on the second substrate, and the silicon layer positioned below the temperature detection devices is surrounded by the covering layer and the sidewalls of the partition walls which are more difficult to etch than the silicon layer. Thus, the cavities can be provided between the temperature detection devices and the covering layer accurately, or with higher accuracy. Consequently, for example, an infrared ray with a desired wavelength can be accurately absorbed in the infrared ray absorption layer with high efficiency, and an improvement in detection sensitivity in the temperature detection devices can be achieved. Further, the second structure including any well-known drive circuit and signal processing circuit can be combined, thereby achieving a reduction in manufacture cost of the imaging apparatus, an improvement in degree of freedom of design, and a reduction in design time, and reducing the number of I/O pins and reducing an I/O signal bandwidth.

Figure 2A:
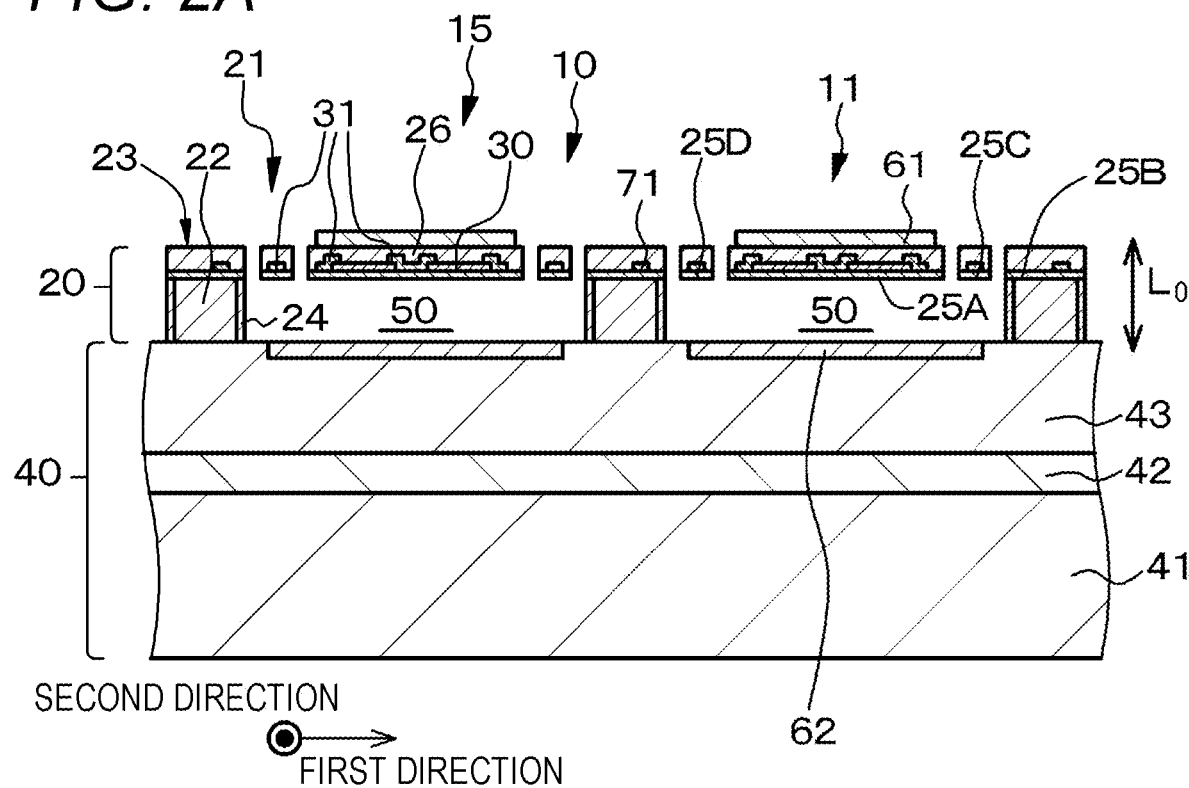
FIG. 2A and FIG. 2B are schematic partial end views of a variant of the imaging apparatus according to the first embodiment.
Figure 2B:
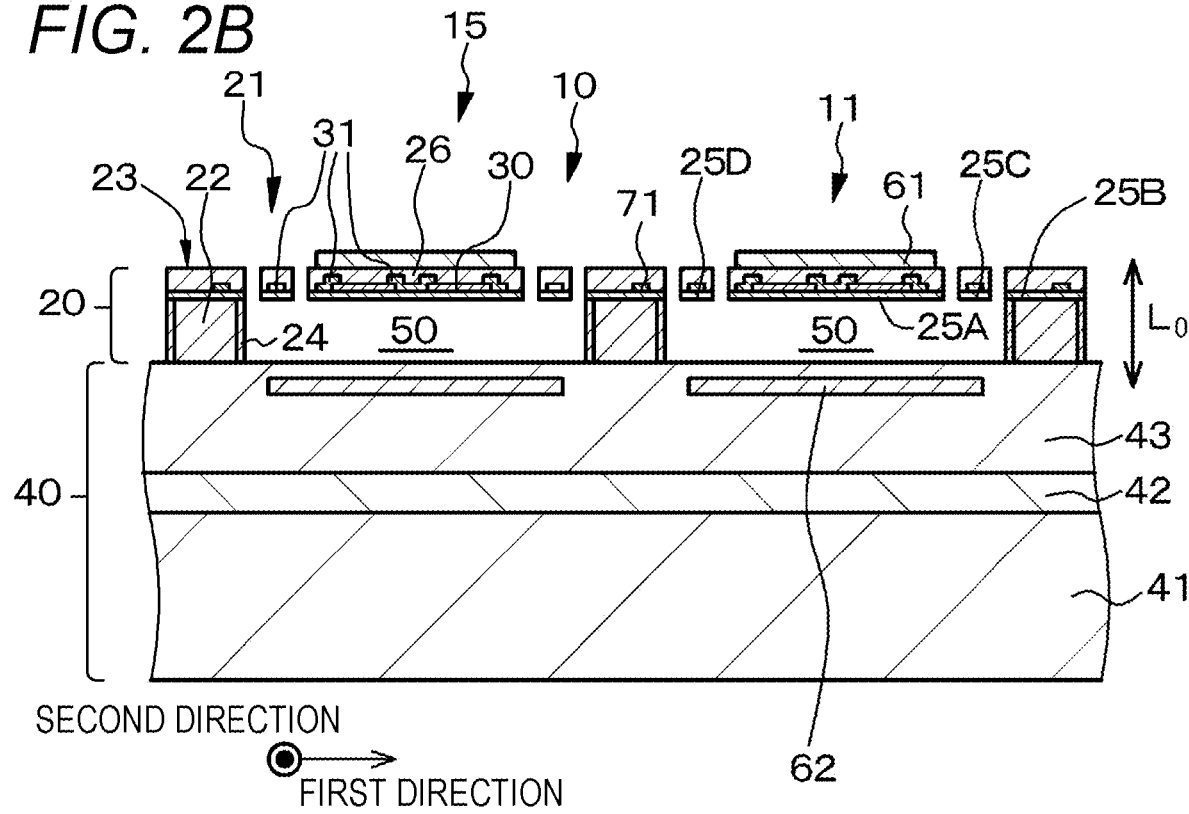

FIG. 2A and FIG. 2B illustrate a variant of the imaging apparatus according to the first embodiment illustrated in FIG. 1A. In the variant of the imaging apparatus according to the first embodiment illustrated in FIG. 2A, the infrared ray absorption layer 61 is formed on the insulative film 26. In the variant of the imaging apparatus according to the first embodiment illustrated in FIG. 2B, the infrared ray reflection layer 62 is formed inside the covering layer 43. In FIG. 2B, the infrared ray absorption layer 61 is assumed to have the structure illustrated in FIG. 2A, but may take the structure illustrated in FIG. 1A. Further, the infrared ray absorption layer 61 may be formed inside the insulative film 26, and the infrared ray reflection layer 62 may be formed on the top face of the covering layer 43.

Second Embodiment

Figure 5A:
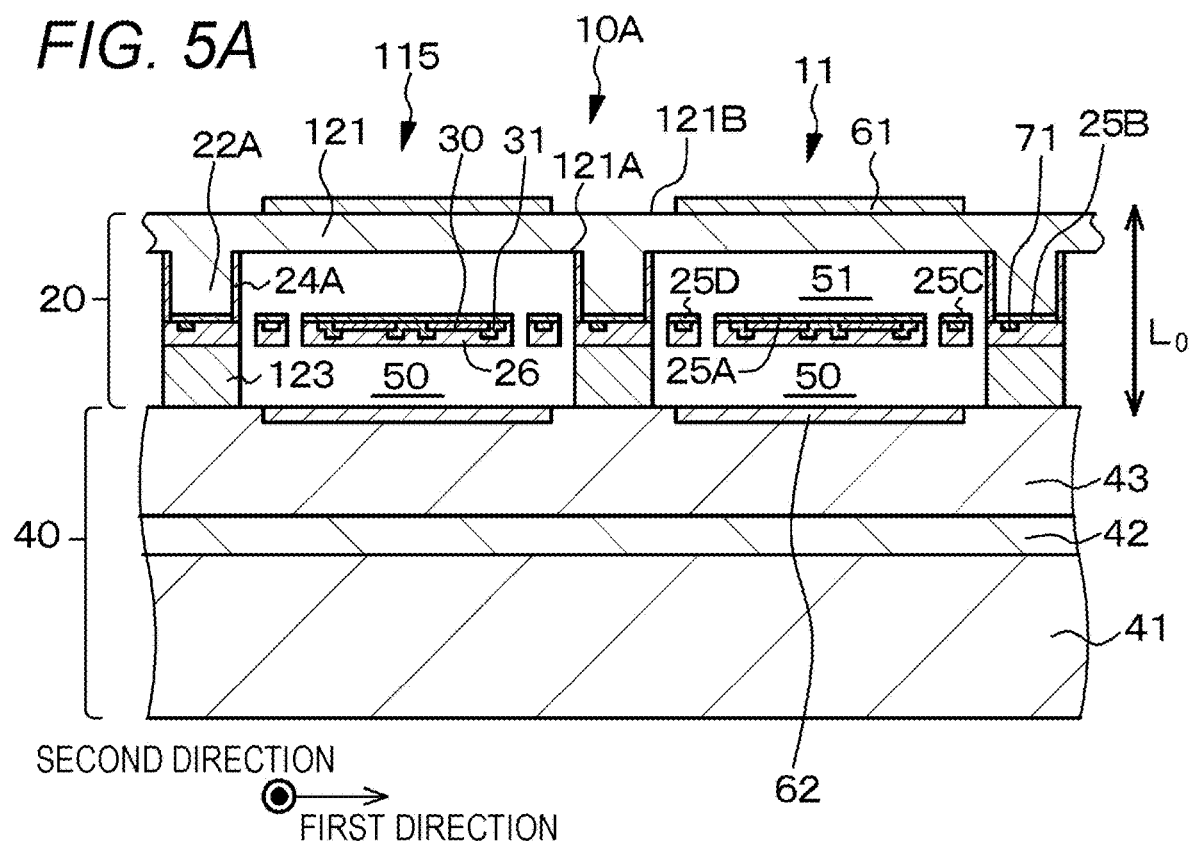
FIG. 5A and FIG. 5B are schematic partial end views of an imaging apparatus according to a second embodiment and its variant, respectively.

A second embodiment is a variant of the first embodiment, and relates to an imaging apparatus in the face-to-face structure. FIG. 5A illustrates a schematic partial end view of an imaging apparatus according to the second embodiment.

In an imaging apparatus 10A according to the second embodiment, a partition wall 123 is formed independent of a first substrate 121 between the first substrate 121 positioned between a temperature detection device 115 and another temperature detection device 115, and the covering layer 43, and the bottom of the partition wall 123 is bonded to the covering layer 43. The exposed face of the covering layer 43 exposed to the cavities 50 includes at least one material layer selected from a group comprising an insulative material layer, a metal material layer, an alloy material layer, and a carbon material layer. Specifically, in the imaging apparatus 10A according to the second embodiment, the exposed face of the covering layer 43 exposed in the cavities 50 includes SiO₂. Further, the partition wall 123 includes at least one material layer selected from a group comprising an insulative material layer, a metal material layer, an alloy material layer, and a carbon material layer. The partition wall 123 specifically includes SiO₂. A reference numeral 22A indicates a convex part extending from the silicon layer described below, and a reference numeral 24A indicates a sidewall of the convex part 22A.

The infrared ray absorption layer 61 is formed on a side of a temperature detection device 115 in which an infrared ray is incident, and the infrared ray reflection layer 62 is formed in the regions of the covering layer 43 positioned at the bottom of a cavity 50. The infrared ray reflection layer 62 is formed on the top face of the covering layer 43 or inside the covering layer 43. Further, the infrared ray reflection layer 62 may be formed on the covering layer 43 positioned at the bottom of a cavity 50, or may be formed on part of the covering layer 43 positioned at the bottom of a cavity 50, or may be formed out of the covering layer 43 positioned at the bottom of a cavity 50. Specifically, the infrared ray reflection layer 62 has the similar configuration or structure as in the first embodiment. The infrared ray absorption layer 61 may be provided on a first face of the first substrate 121, or may be provided on a second face of the first substrate 121. In the second embodiment illustrated in FIG. 5A, the infrared ray absorption layer 61 is specifically provided on the second face of the first substrate 121 (on the second face 121B of the first substrate 121). Also in the second embodiment, assuming a wavelength $\lambda_{IR}$ of an infrared ray to be absorbed in the infrared ray absorption layer 61, an optical distance $L_0$ between the infrared ray absorption layer 61 and the infrared ray reflection layer 62 meets:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

In some cases, the infrared ray absorption layer 61 may be formed on the side of a temperature detection device 15 opposite to a cavity 50.

An outline of a method for manufacturing the imaging apparatus according to the second embodiment, particularly a method for manufacturing the first structure 20 will be described below with reference to the schematic partial end views of a SOI substrate and the like of FIG. 29A, FIG. 29B, FIG. 29C, FIG. 30A, FIG. 30B, FIG. 30C, and FIG. 30D.

[Step-200]

At first, the SOI substrate 90 is prepared similarly as in the first embodiment. Then, a concave part is formed on the SOI substrate 90 from the first silicon layer side, and then embedded with an insulative material, for example, thereby to form the sidewall 24A of the convex part 22A (see FIG. 29A). The first silicon layer 91 on the surface of the SOI substrate 90 is then patterned thereby to leave the regions of the first silicon layer 91 on which the pn junction diodes 30 are to be formed. The pn junction diodes 30 are then formed on the first silicon layer 91 in a well-known method (see FIG. 29B).

[Step-210]

Thereafter, similarly as in [Step-110] according to the first embodiment, the wirings 31 and the signal lines 71 are formed on the SiO₂ layer 92 and part of the pn junction diodes 30 in a well-known method. The insulative film 26 including SiO₂, the contact holes 73, the drive lines 72 are formed on the entire surface, and then the insulative film 26 is patterned (see FIG. 29C). However, the contact holes 73 and the drive lines 72 are not illustrated in and subsequent to FIG. 29C.

[Step-220]

Figure 30A:
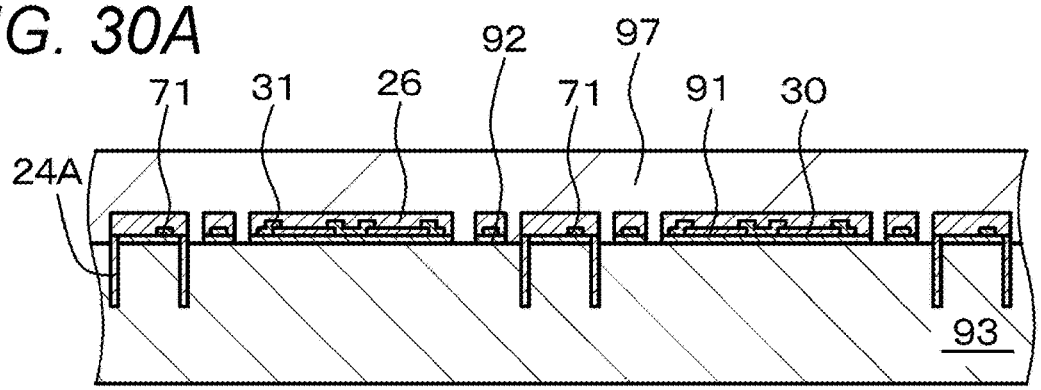
FIG. 30A, FIG. 30B, FIG. 30C, and FIG. 30D are schematic partial end views of a SOI substrate and the like for explaining the method for manufacturing the imaging apparatus according to the first embodiment subsequent to FIG. 29C.
Figure 30B:
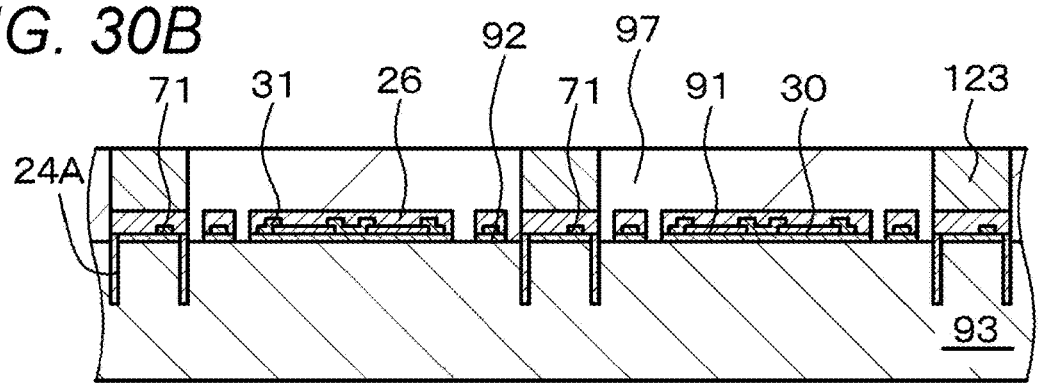
Figure 30C:
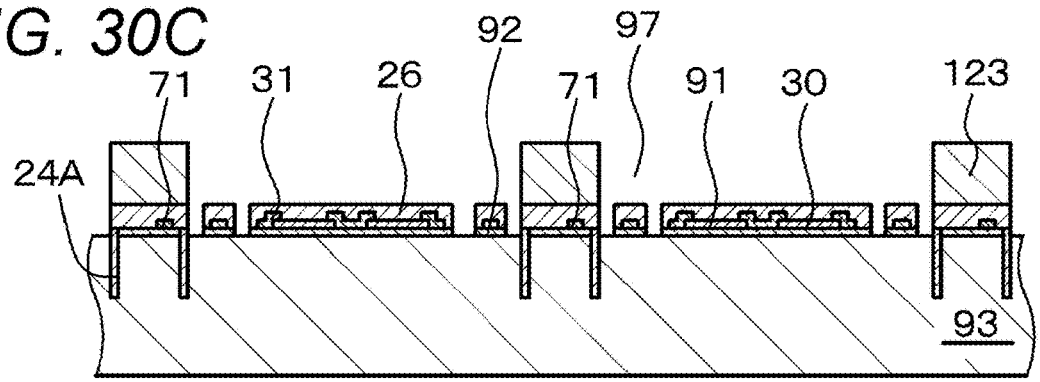
Figure 30D:
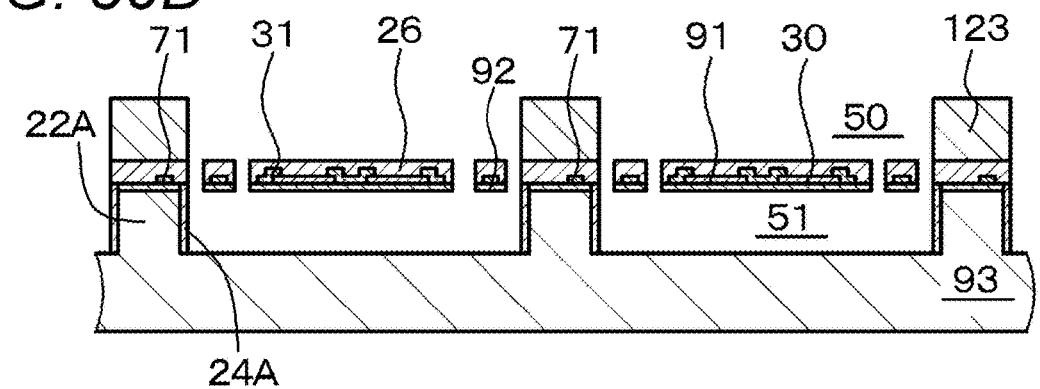

Thereafter, a sacrifice layer 97 including an insulative material is formed on the entire surface (see FIG. 30A), portions of the sacrifice layer 97 on which the partition walls 123 are to be formed are etched thereby to form grooves, and the grooves are embedded with a material making the partition walls 123 thereby to obtain the partition walls 123 (see FIG. 30B). $L_0$ is defined by the thickness of the sacrifice layer 97. Therefore, the value of $L_0$ can be accurately defined. Further, a mask layer for etching (not illustrated) is formed on the sacrifice layer 97 corresponding to the portions where the partition walls 123 are to be formed.

[Step-230]

The sacrifice layer 97 is then removed in the etching method (see FIG. 30C), and an etchant is changed thereby to remove part of the second silicon layer 93 in the etching method (see FIG. 30D), thereby providing the cavities 51 between the diaphragm parts 25A and the second silicon layer. Thereafter, the mask layer for etching formed on the partition walls 123 is removed. Additionally, the cross-section shape of the cavities 51 is not limited to the illustrated shape.

[Step-240]

The second structure 40 provided with the drive circuit is prepared. Additionally, the infrared ray reflection layer 62 is formed on the covering layer 43 beforehand. The partition walls 123 and the covering layer 43 are then bonded in a well-known method under the vacuum atmosphere. Then, the drive lines 72 and the signal lines 71 are electrically connected to the drive circuit via through silicon vias (TSV) (not illustrated), for example, in the peripheral regions 12 and 14. The imaging apparatus 10A illustrated in FIG. 5A can be obtained in this way. Thereafter, the resultant imaging apparatus 10 is packaged.

Figure 5B:
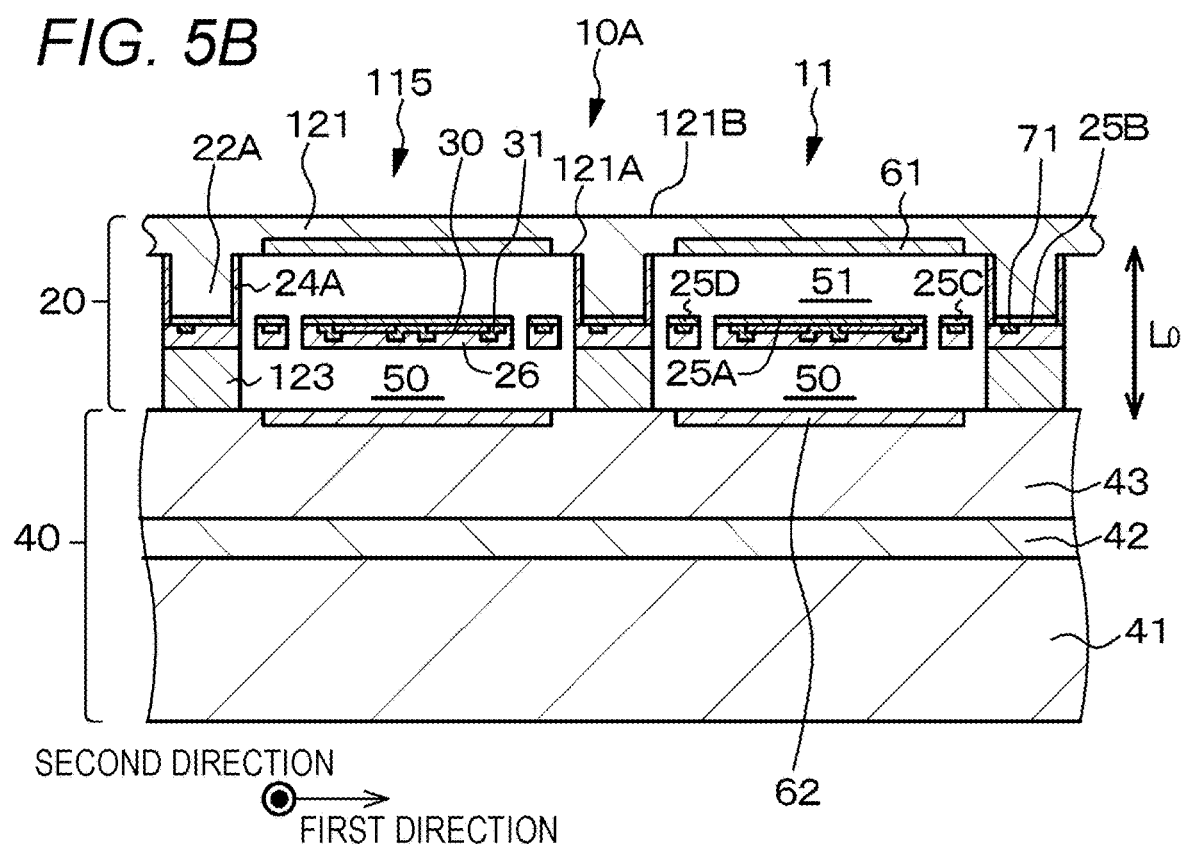

As illustrated in a schematic partial end view of FIG. 5B, the infrared ray absorption layer 61 may be provided on the first face 121A of the first substrate 121. Alternatively as illustrated in a schematic partial end view of FIG. 6A, the infrared ray absorption layer 61 may be provided inside the first substrate 121. Alternatively, as illustrated in a schematic partial end view of FIG. 6B, the infrared ray absorption layer 61 may be provided closer to the side of the diaphragm part 25A in which an infrared ray is incident.

Figure 7:
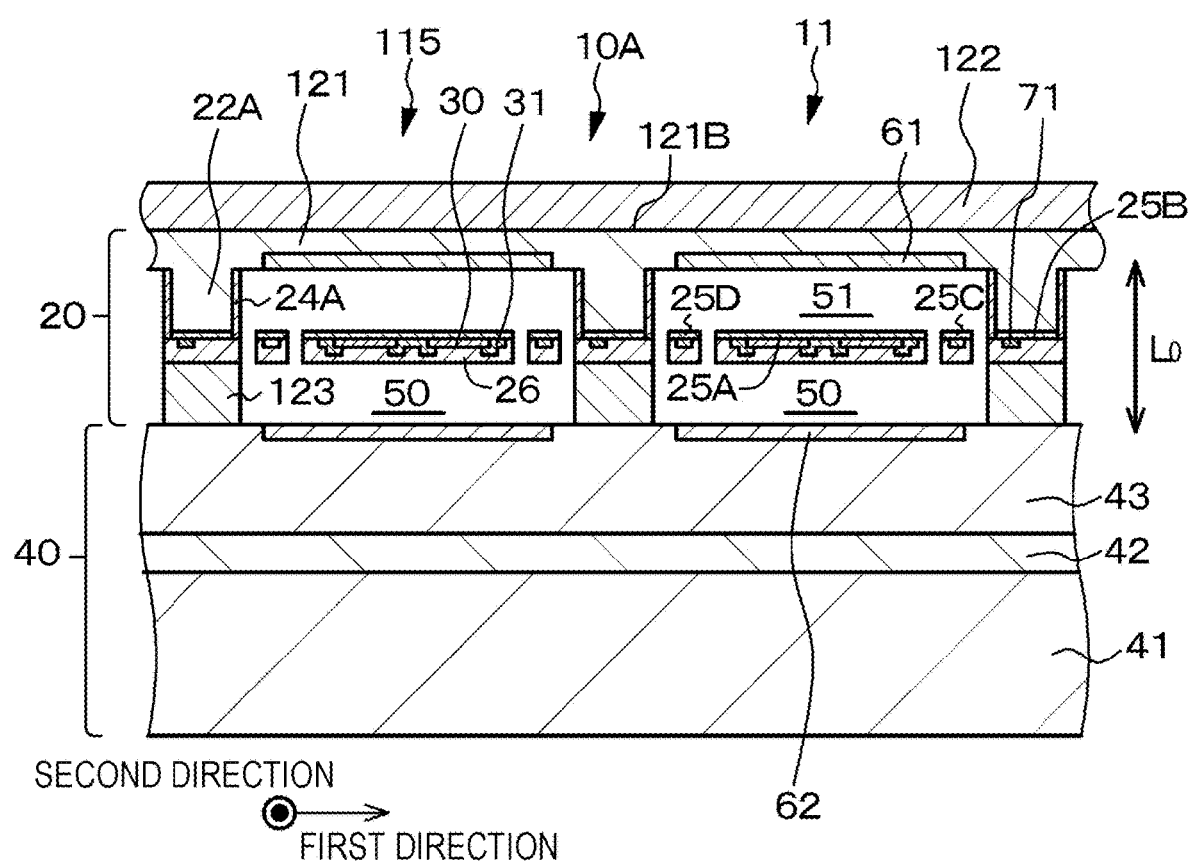
FIG. 7 is a schematic partial end view of still another variant of the imaging apparatus according to the second embodiment.

Further in the imaging apparatus according to the second embodiment, as illustrated in a schematic partial end view of FIG. 7, a protective substrate 122 including a silicon semiconductor substrate may be attached on the face of the first substrate 121 in which an infrared ray is incident (the second face 121B of the first substrate 121). The protective substrate 122 includes a silicon semiconductor substrate in which the drive circuit is provided in the peripheral region, the protective substrate 122 and the first substrate 121 are attached to each other, and the drive circuit provided in the peripheral region of the protective substrate 122 may be electrically connected to the drive lines 72 and the signal lines 71 via through silicon vias (TSV), for example, in the peripheral region 12. Additionally, in this case, the drive circuit may not be provided in the second structure 40.

Third Embodiment

Figure 8A:
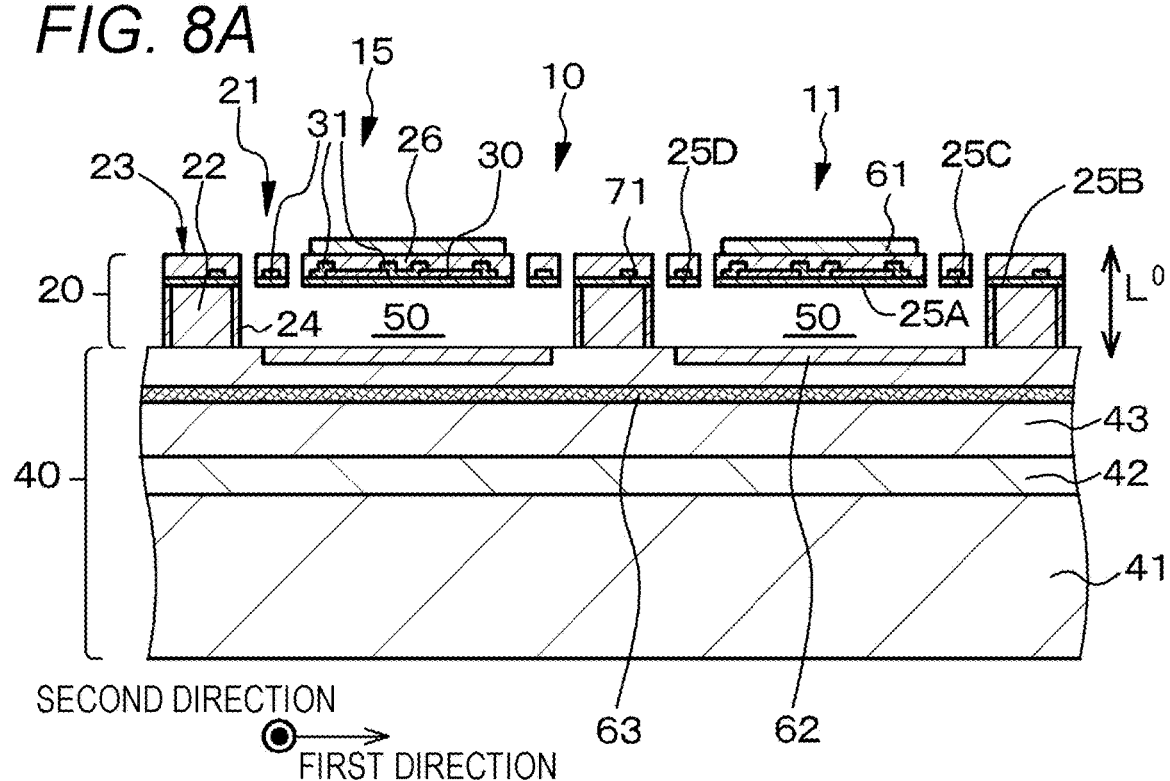
FIG. 8A and FIG. 8B are schematic partial end views of an imaging apparatus according to a third embodiment and its variant, respectively.
Figure 8B:
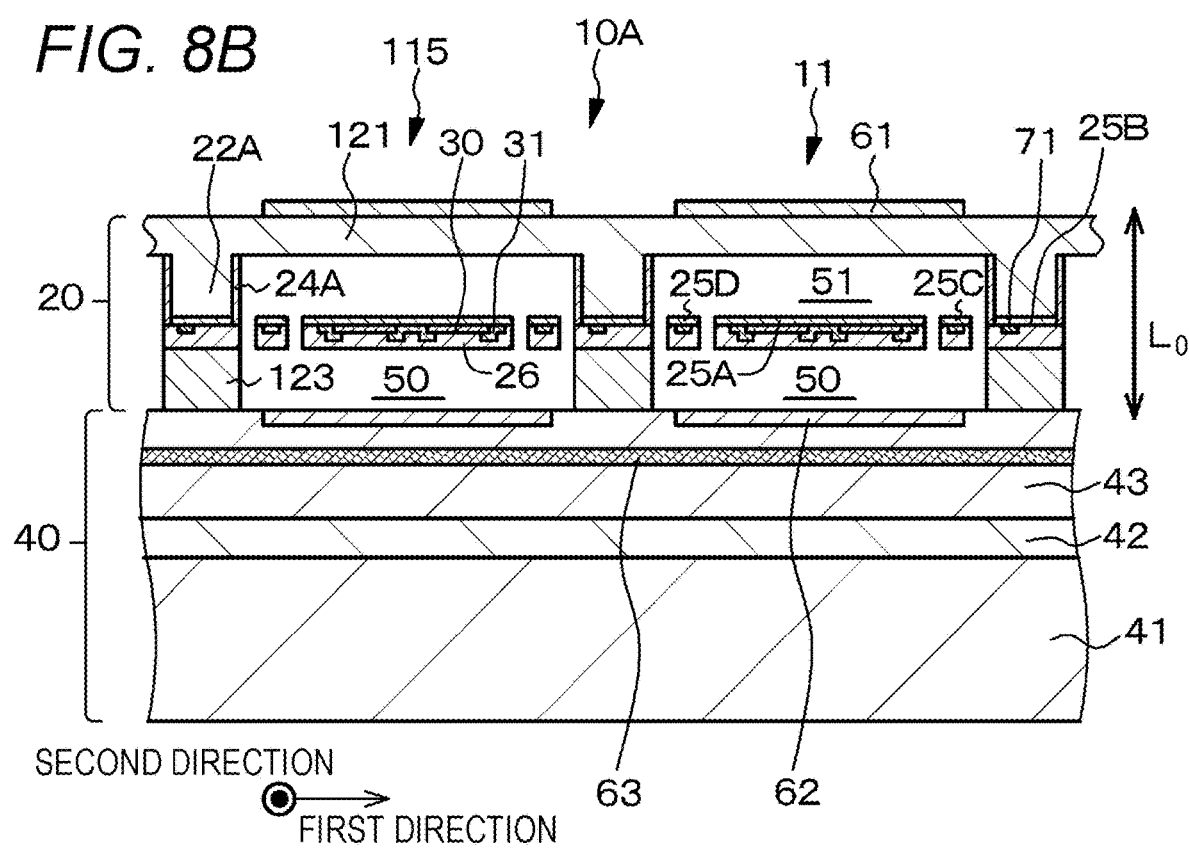

A third embodiment is a variant of the first embodiment and the second embodiment. According to the third embodiment, as illustrated in the schematic partial end views of FIG. 8A (variant of the first embodiment) and FIG. 8B (variant of the second embodiment), a heat conductive layer (heat uniformization layer) 63 including a metal material, a carbon-based material such as carbon film or carbon nanotube, or an organic material is formed on the covering layer 43. Specifically, the heat conductive layer 63 is arranged inside the covering layer 43 and below the infrared ray reflection layer 62. The heat conductive layer 63 is formed thereby to achieve more uniform temperatures and a more uniform distribution of temperatures. In some cases, the heat conductive layer (heat uniformization layer) 63 can include a vacuum layer. Further, the configuration of the heat conductive layer (heat uniformization layer) 63 may be changed depending on the temperature detection device array region 11.

The configuration and structure of the imaging apparatus according to the third embodiment can be similar to the configurations and structures of the imaging apparatuses according to the first embodiment and the second embodiment except the above points, and thus the detailed description thereof will be omitted. Additionally, the heat conductive layer (heat uniformization layer) can be applied to imaging apparatuses (such as imaging apparatus configured to perform imaging on the basis of a visible ray) other than the imaging apparatuses according to the first embodiment and the second embodiment.

Fourth Embodiment

Figure 9A:
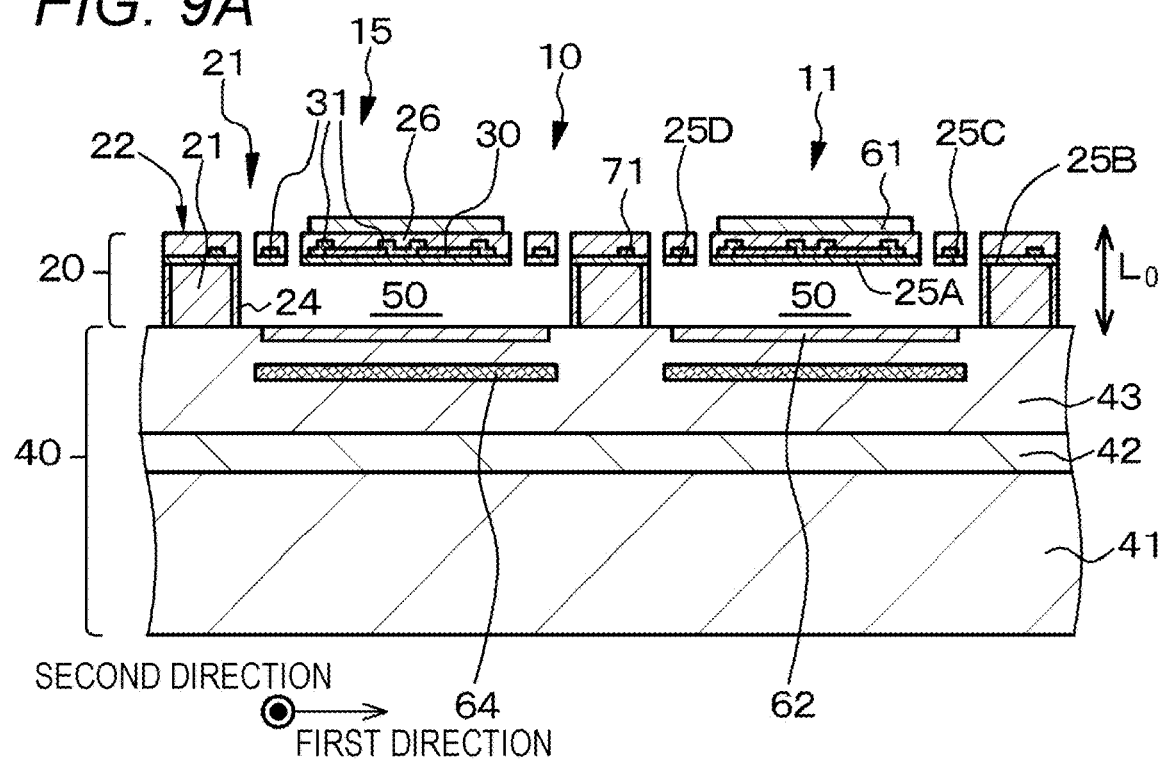
FIG. 9A and FIG. 9B are schematic partial end views of an imaging apparatus according to a fourth embodiment and its variant, respectively.
Figure 9B:
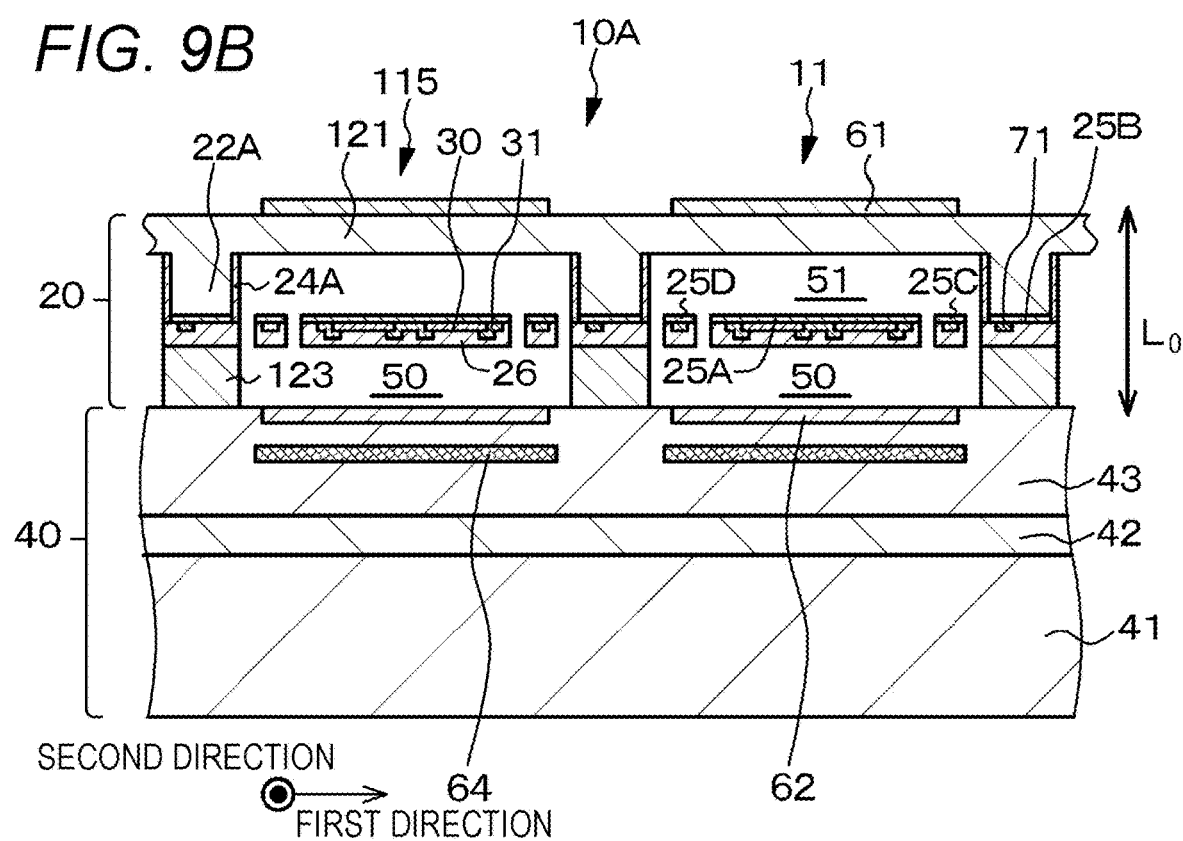

A fourth embodiment is a variant of the first embodiment to the third embodiment. According to the fourth embodiment, as illustrated in the schematic partial end views of FIG. 9A (variant of the first embodiment) and FIG. 9B (variant of the second embodiment), temperature control layers 64 including tungsten (W) are formed on the covering layer 43 (specifically inside the covering layer 43), and the covering layer 43 is provided with temperature detection means (not illustrated) including silicon diodes. The temperature control layer 64 functions as a heater (resistor, resistive member). Additionally, the temperature control layer may serve as a wiring. The drive circuit then controls the temperature control layers 64 on the basis of the temperature detection results of the temperature detection means. Specifically, for example, a current flowing in the temperature control layers 64 is controlled thereby to control the amounts of generated heat of the temperature control layers 64. Additionally, the wirings connecting the temperature control layers 64 and the control circuit for controlling the temperature control layers 64 are not illustrated.

That is, the drive circuit (specifically the CPU or DSP) which receives the temperature detection results of the temperature detection means finds a distribution of temperatures in the covering layer 43 on the basis of the received temperature detection results. The drive circuit then calculates the required amount of heat and individually controls the value of a current flowing in the temperature control layers 64, thereby achieving uniform temperatures and uniform distribution of temperatures (restriction of variation in in-plane temperatures) in the covering layer 43, and further uniform temperatures and uniform distribution of temperatures in the first substrate 21, 121, and uniform temperatures and uniform distribution of temperatures in the temperature detection devices 15. Thus, for example, even if the amount of current in an analog logic block changes and the amount of generated heat in the analog logic block changes, the temperature can be easily controlled. In a case where the temperature control by the temperature control layers 64 departs from its range, the drive circuit controls the amount of current in the analog logic block and controls an operation clock in the analog logic block, thereby achieving uniform temperatures and uniform distribution of temperatures. Additionally, the temperature control layers 64 are not provided and the drive circuit controls the amount of current in the analog logic block and controls the operation clock in the analog logic block, thereby achieving uniform temperatures and uniform distribution of temperatures. A temperature controlled by the temperature control layers 64 is set to be higher than room temperature, for example, and thus the temperature control layers 64 are set in a kind of ON/OFF operation, thereby achieving a reduction in power consumption in the temperature control layers 64. Further, in combination with the heat conductive layer 63 described according to the third embodiment, more uniform temperatures and more uniform distribution of temperatures can be achieved. In this case, it is preferable that the heat conductive layer 63 is arranged above the temperature control layers 64. In some cases, the temperature control layer 64 may serve as the infrared ray reflection layer 62.

Figure 10:
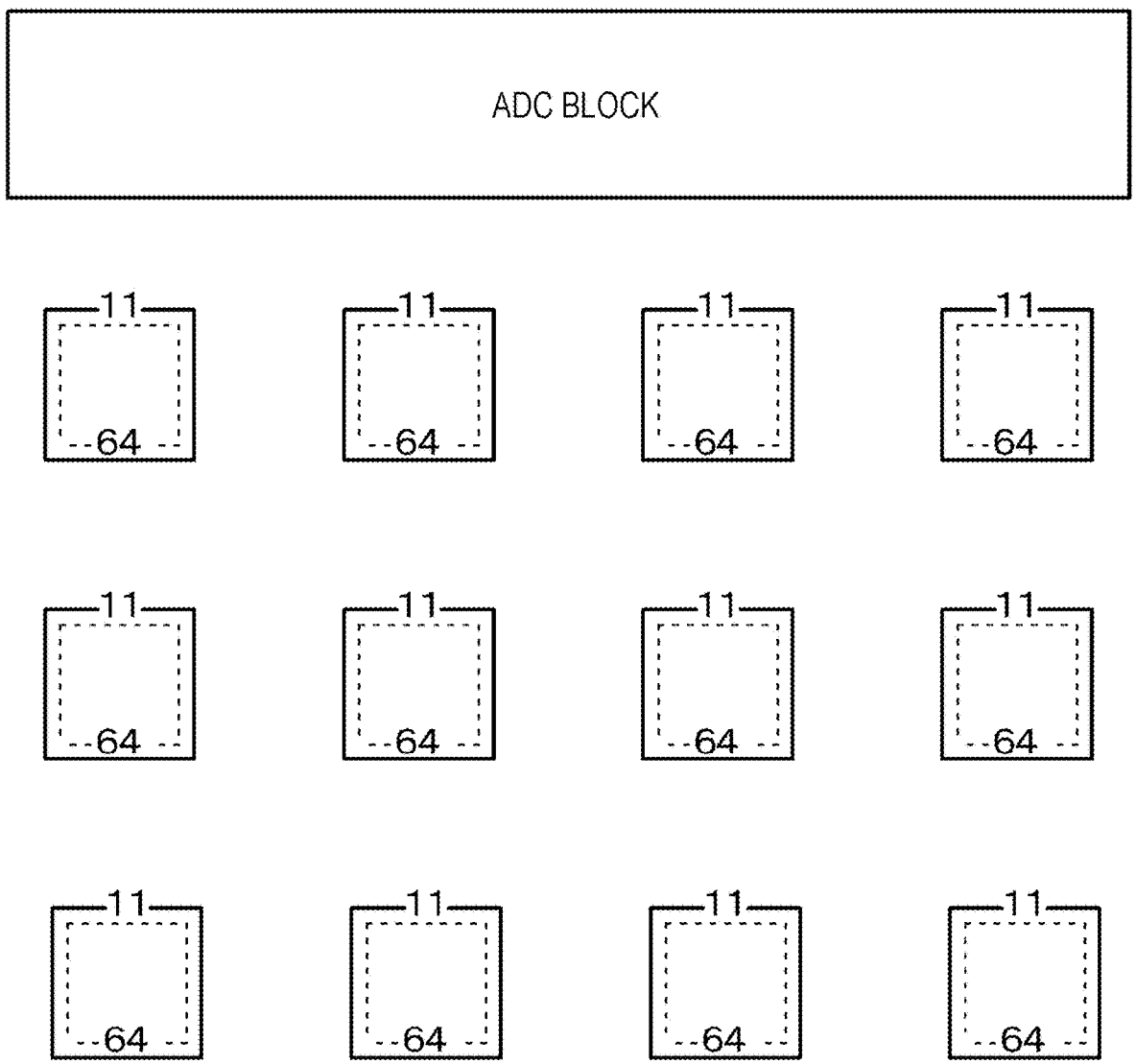
FIG. 10 is a diagram schematically illustrating an arrangement state of temperature detection devices and temperature control layers in the imaging apparatus according to the fourth embodiment.
Figure 11:
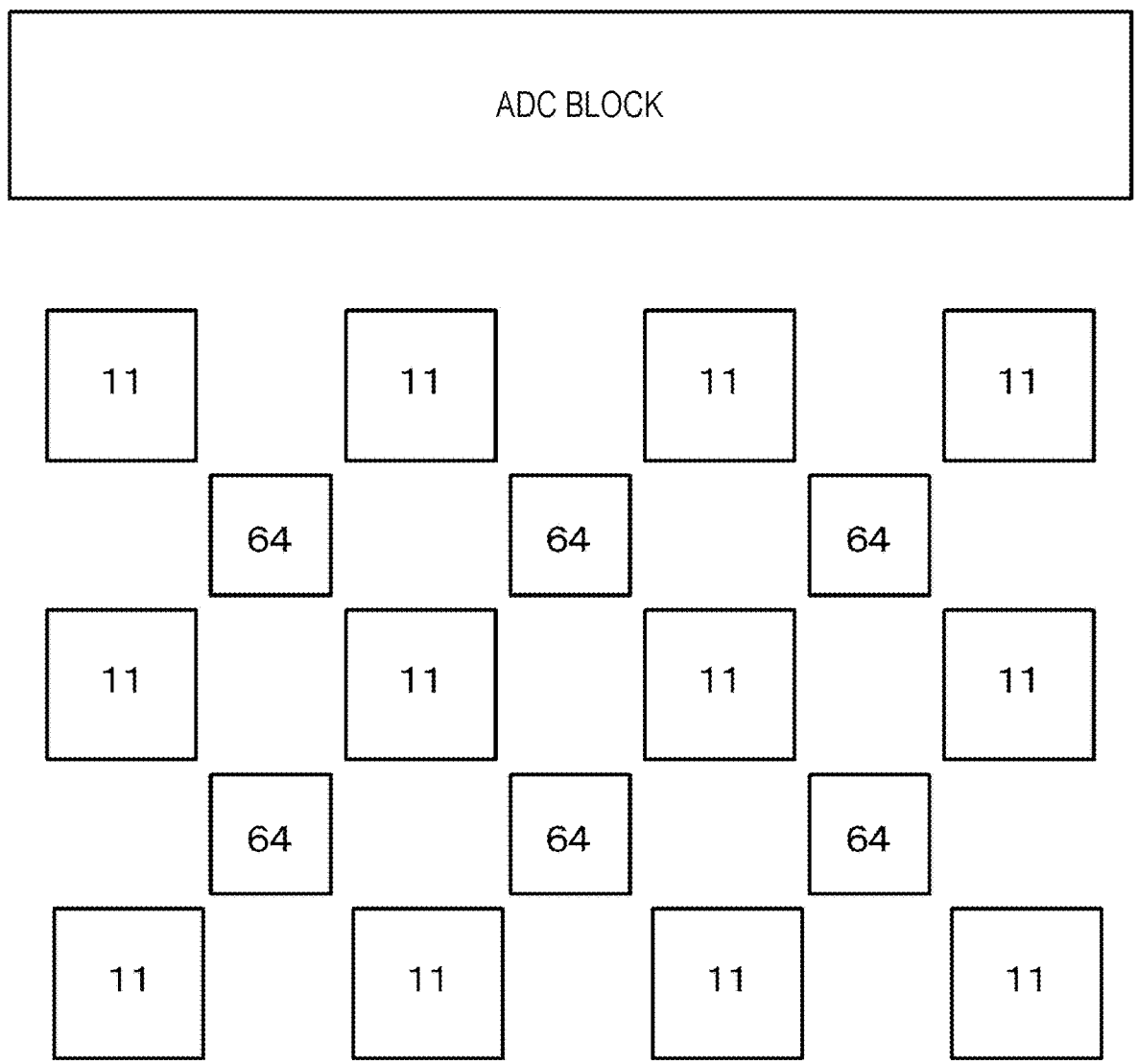
FIG. 11 is a diagram schematically illustrating an arrangement state of temperature detection devices and temperature control layers in another variant of the imaging apparatus according to the fourth embodiment.

FIG. 10 and FIG. 11 schematically illustrate an arrangement state of the temperature detection devices 15 and the temperature control layers 64, and orthographically-projected images of the temperature detection devices 15 and orthographically-projected images of the temperature control layers 64 may overlap (see FIG. 10), or an orthographically-projected image of a temperature control layer 64 can be positioned between an orthographically-projected image of a temperature detection device 15 and an orthographically-projected image of another temperature detection device 15 (see FIG. 11). The area, the arrangement positions, and the arrangement density of the temperature control layers 64 may be an area, arrangement positions, and an arrangement density capable of achieving uniform temperatures and uniform distribution of temperatures. Additionally, the temperature control layers 64 are positioned below the temperature detection devices 15, and thus the temperature control layers 64 are indicated in dotted lines in FIG. 10 and FIG. 11.

Here, it is preferable that the first structure 20 includes the temperature detection device array region 11 in which a plurality of temperature detection devices 15 are arranged in a 2D matrix shape and the peripheral region 12 surrounding the temperature detection device array region 11 and the temperature control layers 64 are formed in the temperature detection device array region 11. Alternatively, it is preferable that the temperature control layers 64 are formed in the regions of the covering layer 43 in which an orthographically-projected image of the temperature detection device array region is present. Alternatively, it is preferable that the drive circuit includes the analog-digital conversion circuits (ADC) and the analog-digital conversion circuits are not arranged in the regions of the drive substrate in which an orthographically-projected image of the temperature detection device array region is present.

The configuration and structure of the imaging apparatus according to the fourth embodiment can be similar to the configurations and structures of the imaging apparatuses according to the first embodiment to the third embodiment except the above points, and thus the detailed description thereof will be omitted. Additionally, the temperature control layers can be applied to imaging apparatuses (such as imaging apparatus configured to perform imaging on the basis of a visible ray) other than the imaging apparatuses according to the first embodiment to the third embodiment.

Fifth Embodiment

A fifth embodiment relates to the imaging apparatuses according to the second aspect and the third aspect in the present disclosure.

A radiation spectrum from an object around room temperature has a peak around a wavelength of 10 μm (see radiation spectrum "B" in FIG. 14). Additionally, a radiation spectrum "A" in FIG. 14 indicates a radiation spectrum from an object at a temperature higher than room temperature. Then, for example, a temperature detection device with a shorter sensitivity wavelength than the peak wavelength and a temperature detection device with a longer sensitivity wavelength than the peak wavelength are combined in the same pixel, thereby measuring a temperature of an object with high accuracy on the basis of a ratio of signal intensities of the two temperature detection devices.

An imaging apparatus according to the fifth embodiment includes:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices 15A and 15B are arranged, and a wavelength of an infrared ray detected by each temperature detection device 15A, 15B is different in the temperature detection device units.

Then, in the imaging apparatus according to the fifth embodiment, each temperature detection device 15A, 15B has an infrared ray absorption layer 61, 61A, 61B on a side in which an infrared ray is incident, and an infrared ray reflection layer 62, 62A, 62B opposite to the side in which an infrared ray is incident, an optical distance $L_0$, $L_0'$ between the infrared ray absorption layer 61, 61A, 61B and the infrared ray reflection layer 62, 62A, 62B in each temperature detection device 15A, 15B is different in the temperature detection device units, assuming a wavelength $\lambda_{IR\text{-}A}$, $\lambda_{IR\text{-}B}$ of an infrared ray to be absorbed in the infrared ray absorption layer 61, 61A, 61B configuring the temperature detection device 15A, 15B, the optical distance $L_0$, $L_0'$ in each temperature detection device 15A, 15B meets $$0.75 \times \lambda_{IR\text{-}A}/2 \leq L_0 \leq 1.25 \times \lambda_{IR\text{-}A}/2$$

or $$0.75 \times \lambda_{IR\text{-}A}/4 \leq L_0 \leq 1.25 \times \lambda_{IR\text{-}A}/4, \text{ and meets}$$

$$0.75 \times \lambda_{IR\text{-}B}/2 \leq L_0' \leq 1.25 \times \lambda_{IR\text{-}B}/2$$

or $$0.75 \times \lambda_{IR\text{-}B}/4 \leq L_0' \leq 1.25 \times \lambda_{IR\text{-}B}/4.$$

Further, each temperature detection device 15A, 15B has the infrared ray absorption layer 61, 61A, 61B on a side in which an infrared ray is incident, and the infrared ray reflection layer 62, 62A, 62B opposite to the side in which an infrared ray is incident, and a material, configuration, and structure making the infrared ray absorption layer 61, 61A, 61B, or a material, configuration, and structure making the infrared ray reflection layer 62, 62A, 62B, or the material, configuration, and structure making the infrared ray absorption layer 61, 61A, 61B and the material, configuration, and structure making the infrared ray reflection layer 62, 62A, 62B are different for each temperature detection device 15A, 15B in the temperature detection device units. That is, this is specifically described in (Case A), (Case B), and (Case C).

Alternatively, the imaging apparatus according to the fifth embodiment includes:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices 15A and 15B are arranged, and the amount of absorbed infrared ray of each temperature detection device 15A, 15B is different in the temperature detection device units.

Then, in the imaging apparatus according to the fifth embodiment, each temperature detection device 15A, 15B has the infrared ray absorption layer 61, 61A, 61B on the side in which an infrared ray is incident and the infrared ray reflection layer 62, 62A, 62B opposite to the side in which an infrared ray is incident, a material making the infrared ray absorption layer 61, 61A, 61B, or a material making the infrared ray reflection layer 62, 62A, 62B, or the material making the infrared ray absorption layer 61, 61A, 61B and the material making the infrared ray reflection layer 62, 62A, 62B are different for each temperature detection device 15 in the temperature detection device units. Further, in the imaging apparatus according to the fifth embodiment, each temperature detection device 15A, 15B has the infrared ray absorption layer 61, 61A, 61B on the side in which an infrared ray is incident and the infrared ray reflection layer 62, 62A, 62B opposite to the side in which an infrared ray is incident, and the infrared ray absorption layer 61, 61A, 61B, or the infrared ray reflection layer 62, 62A, 62B, or the infrared ray absorption layer 61, 61A, 61B and the infrared ray reflection layer 62, 62A, 62B are different in area, or thickness, or area and thickness for each temperature detection device 15 in the temperature detection device units. That is, this is specifically described in (Case a), (Case b), (Case c), (Case d), (Case e), (Case f), (Case g), (Case h), and (case i).

Figure 12A:
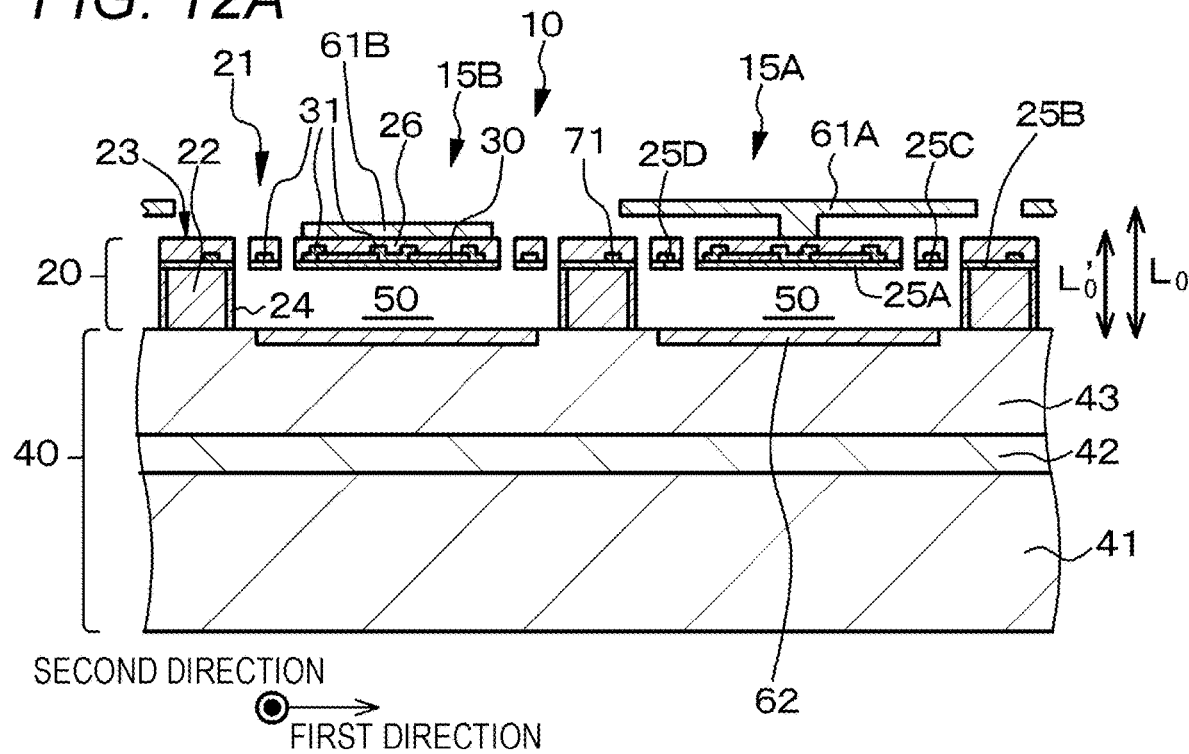
FIG. 12A and FIG. 12B are schematic partial end views of an imaging apparatus according to a fifth embodiment and its variant, respectively.

More specifically, as illustrated in a schematic partial end view of FIG. 12A, the structures of the infrared ray absorption layers 61A and 61B in the temperature detection device 15A and the temperature detection device 15B are different. Thereby, the values of $L_0$ and $L_0'$ in the temperature detection devices 15A and 15B can be changed, the wavelengths of infrared rays detected by the temperature detection devices 15A and 15B can be different, and the amounts of absorbed infrared ray of the temperature detection devices 15A and 15B can be different.

Figure 12B:
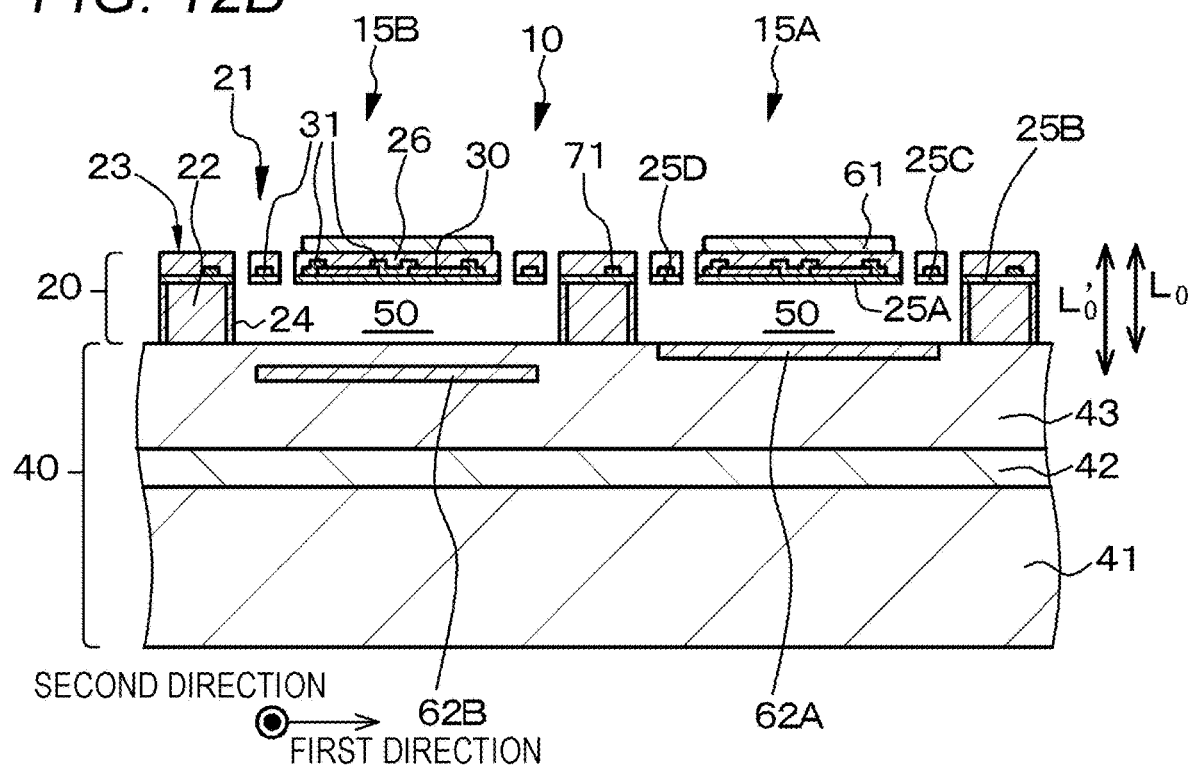

Alternatively, as illustrated in a schematic partial end view of FIG. 12B, the structures of the infrared ray absorption layers 61A and 61B in the temperature detection device 15A and the temperature detection device 15B are the same, but are formed at different positions. Thereby, the values of $L_0$ and $L_0'$ in the temperature detection devices 15A and 15B can be changed, and the wavelengths of infrared rays detected by the temperature detection devices 15A and 15B can be different.

Figure 13A:
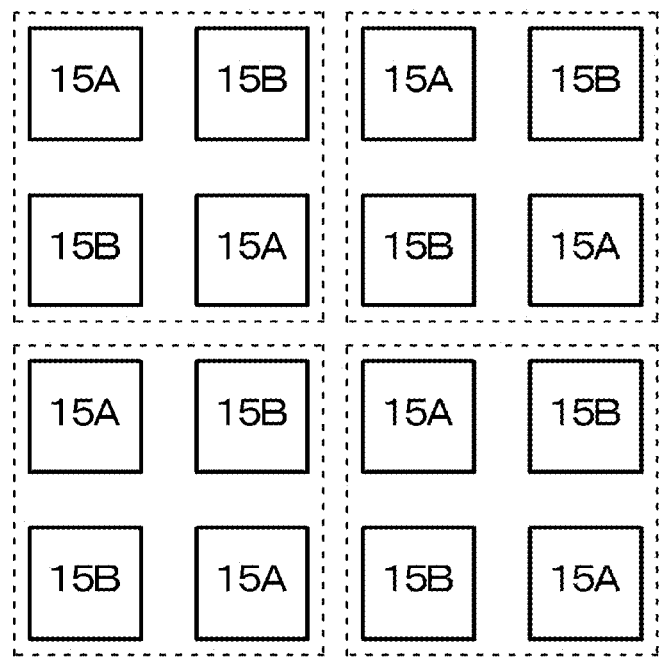
FIG. 13A and FIG. 13B are diagrams schematically illustrating an arrangement state of temperature detection devices in the imaging apparatus according to the fifth embodiment.
Figure 13B:
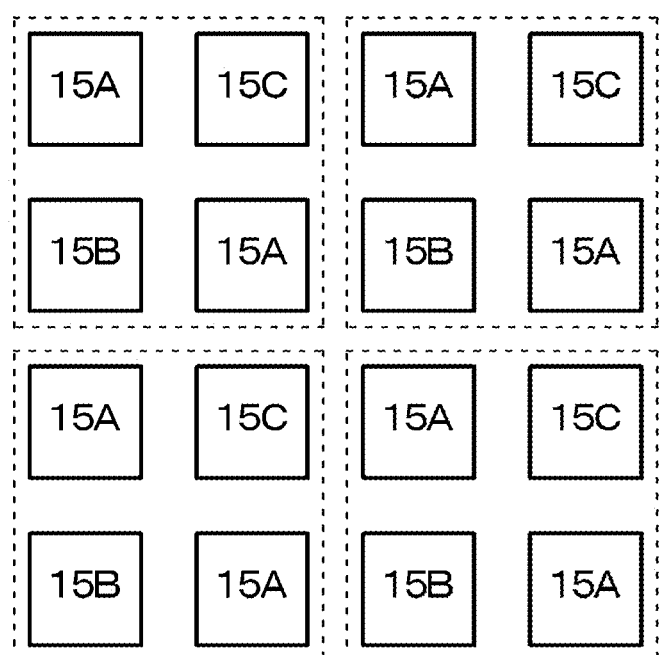

FIG. 13A illustrates an arrangement of the temperature detection devices 15A and the temperature detection devices 15B in a temperature detection device unit configured of the two types of temperature detection device 15A and temperature detection device 15B. A temperature detection device unit configured of four temperature detection devices 15A and 15B configuring one pixel is surrounded in a dotted line. Additionally, a temperature detection device unit can be configured of two temperature detection devices 15A and 15B. Further, FIG. 13B illustrates an arrangement of temperature detection devices 15A, a temperature detection device 15B, and a temperature detection device 15C in a case where a temperature detection device unit is configured of three types of temperature detection device 15A, temperature detection device 15B, and temperature detection device 15C. A temperature detection device for an infrared ray wavelength requiring high spatial resolution may be assumed as the temperature detection device 15A.

In the imaging apparatus according to the fifth embodiment, each temperature detection device unit is configured in which a plurality of temperature detection devices are arranged, a wavelength of an infrared ray detected by each temperature detection device is different in a temperature detection device unit or the amount of absorbed infrared ray of each temperature detection device is different in a temperature detection device unit, thereby changing wavelength spectroscopic characteristics or infrared sensitivity per temperature detection device. Then, the temperature detection devices with different sensitivity wavelengths are combined in the same pixel, thereby measuring a temperature of an object with high accuracy on the basis of a ratio of signal intensities of the plurality of temperature detection devices. Alternatively, a temperature detection device unit is configured in a combination of a high-sensitivity temperature detection device and a low-sensitivity temperature detection device, thereby changing a dynamic range of the temperature detection device unit. That is, the low-sensitivity temperature detection device may be operated at high infrared intensity, and the high-sensitivity temperature detection device may be operated at low infrared intensity. Alternatively, in a case where an object (or environment) changes from a low infrared intensity state to a high state, the high-sensitivity temperature detection device is switched to the low-sensitivity temperature detection device, and in a case where an object (or environment) changes from a high infrared intensity state to a low state, the low-sensitivity temperature detection device may be switched to the high-sensitivity temperature detection device.

The configuration and structure of the temperature detection devices 15A and 15B illustrated in FIG. 12A and FIG. 12B employ the configuration and structure of the temperature detection devices described according to the first embodiment, but are not limited thereto, and the configuration and structure of the imaging apparatus according to the fifth embodiment may be similar to the configurations and structures of the imaging apparatuses described according to the first embodiment to the fourth embodiment. Alternatively, only when each temperature detection device unit is configured in which a plurality of temperature detection devices are arranged, and a wavelength of an infrared ray detected by each temperature detection device is different in a temperature detection device unit, or the amount of absorbed infrared ray of each temperature detection device is different in a temperature detection device unit, the configuration and structure of the imaging apparatus according to the fifth embodiment are not limited to the configurations and structures of the imaging apparatuses described according to the first embodiment to the fourth embodiment, and can be applied to imaging apparatuses in other configurations and structures.

Sixth Embodiment

A sixth embodiment relates to the imaging apparatus according to the fourth aspect in the present disclosure.

As described above, in a case where a differential integration circuit is arranged for a signal line connected with a plurality of temperature detection devices arranged in the second direction, a time required for the differential integration circuit to integrate the signals output from the temperature detection devices may not be enough.

Figure 15:
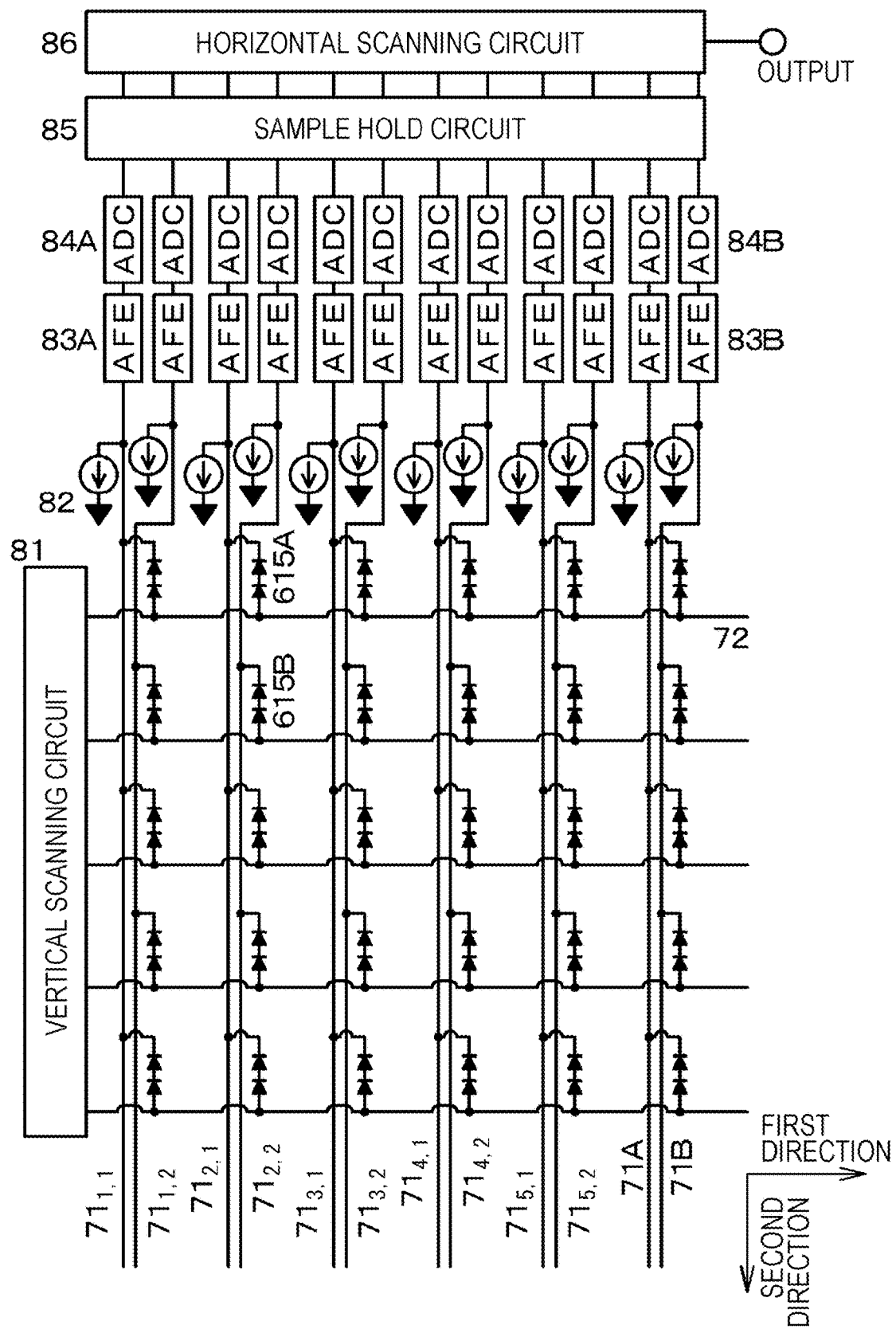
FIG. 15 is an equivalent circuit diagram of an imaging apparatus according to a sixth embodiment.

In order to solve the problem, as illustrated in an equivalent circuit diagram of FIG. 15, the imaging apparatus according to the sixth embodiment includes:

$M_0 \times N_0$ (where $M_0 \geq 2$, $N_0 \geq 2$) temperature detection devices arranged in a 2D matrix shape in a first direction and in a second direction different from the first direction and configured to detect a temperature on the basis of an infrared ray; a plurality of drive lines 72 arranged in the first direction;

$N_0 \times P_0$ (where $P_0 \geq 2$) signal lines arranged in the second direction;

a first drive circuit (specifically the vertical scanning circuit 81) connected with the plurality of drive lines 72; and a second drive circuit (specifically the horizontal scanning circuit 86 or the like) connected with the $N_0 \times P_0$ signal lines. Then, each temperature detection device includes a first terminal (specifically a pn junction diode 30 positioned at one end of the plurality of pn junction diodes 30) and a second terminal (specifically a pn junction diode 30 positioned at the other end of the plurality of pn junction diodes 30), the first terminal of each temperature detection device is connected to a drive line 72, and a (n, p)-th signal line (where n=1, 2, . . . , $N_0$, p=1, 2, . . . , $P_0$) is connected to the second terminals of $\{(q-1)P_0+p\}$-th temperature detection devices (where, q=1, 2, 3 . . . ) in a group of temperature detection devices configured of $N_0$ n-th temperature detection devices arranged in the second direction.

According to the sixth embodiment, more specifically, $P_0=2$ is assumed. Thus, the value of p is 1 or 2. That is, the number of signal lines is $2N_0$. The temperature detection devices connected to an odd-numbered signal line 71A ($71_{1,\,1}$, $71_{2,\,1}$, $71_{3,\,1}$, . . . ) are denoted with a reference numeral 615A, and the temperature detection devices connected to an even-numbered signal line 71B ($71_{1,\,2}$, $71_{2,\,2}$, $71_{3,\,2}$, . . . ) are denoted with a reference numeral 615B.

Assuming p=1, a (n, 1)-th signal line is connected to the second terminals of $\{(q-1)P_0+1\}$-th temperature detection devices (where q=1, 2, 3, . . . ) in a group of temperature detection devices configured of $N_0$ n-th temperature detection devices arranged in the second direction, or the odd-numbered temperature detection devices 615A. Further, assuming p=2, a (n, 2)-th signal line is connected to the second terminals of $\{(q-1)P_0+2\}$-th temperature detection devices (where q=1, 2, 3, . . . ) in a group of temperature detection devices configured of $N_0$ n-th temperature detection devices arranged in the second direction, or the even-numbered temperature detection devices 615B.

Here, in the imaging apparatus according to the sixth embodiment, each signal line 71A, 71B is connected to an analog front end (AFE) 83a, 83b, the sample hold circuit 84, and an analog-digital conversion circuit (ADC) 85a, 85b configuring the second drive circuit, and the analog front end 83a, 83b has a differential integration circuit. The analog front ends 83a and 83b each including a differential integration circuits, and the analog-digital conversion circuits 85a and 85b can be in a well-known circuit configuration.

In this way, a group of temperature detection devices 615A and 615B arranged in the second direction is divided into two groups (odd-numbered temperature detection devices 615A arranged in the second direction and even-numbered temperature detection devices 615B arranged in the second direction), and the groups of temperature detection devices 615A and 615B are connected to two signal lines 71A and 71B, respectively. That is, the temperature detection devices 615A and 615B arranged in the second direction are connected to the two signal lines 71A and 71B, respectively. Thus, the differential integration circuits are arranged in parallel unlike in a case where the temperature detection devices arranged in the second direction are connected to one signal line, and thus a time required for the differential integration circuits to integrate a signal output from the temperature detection devices can be doubled, thereby providing an imaging apparatus with high sensitivity and less noises. The configuration and structure of the imaging apparatus according to the sixth embodiment can be applied to the imaging apparatuses described according to the first embodiment to the fifth embodiment. In some cases, the configuration and structure of the imaging apparatus according to the sixth embodiment can be applied to imaging apparatuses (such as imaging apparatus configured to perform imaging on the basis of a visible ray) in configurations and structures other than the imaging apparatuses according to the first embodiment to the fifth embodiment.

The configuration and structure of the temperature detection devices 615A and 615B or the imaging apparatus can be similar to the configurations and structures of the temperature detection devices 15 or the imaging apparatuses described according to the first embodiment to the fourth embodiment. Alternatively, the configuration and structure of the temperature detection devices 615A and 615B can be similar to the configuration and structure of the temperature detection devices 15A and 15B described according to the fifth embodiment. Therefore, the description of the temperature detection devices 615A and 615B or the imaging apparatus will be omitted.

Figure 16:
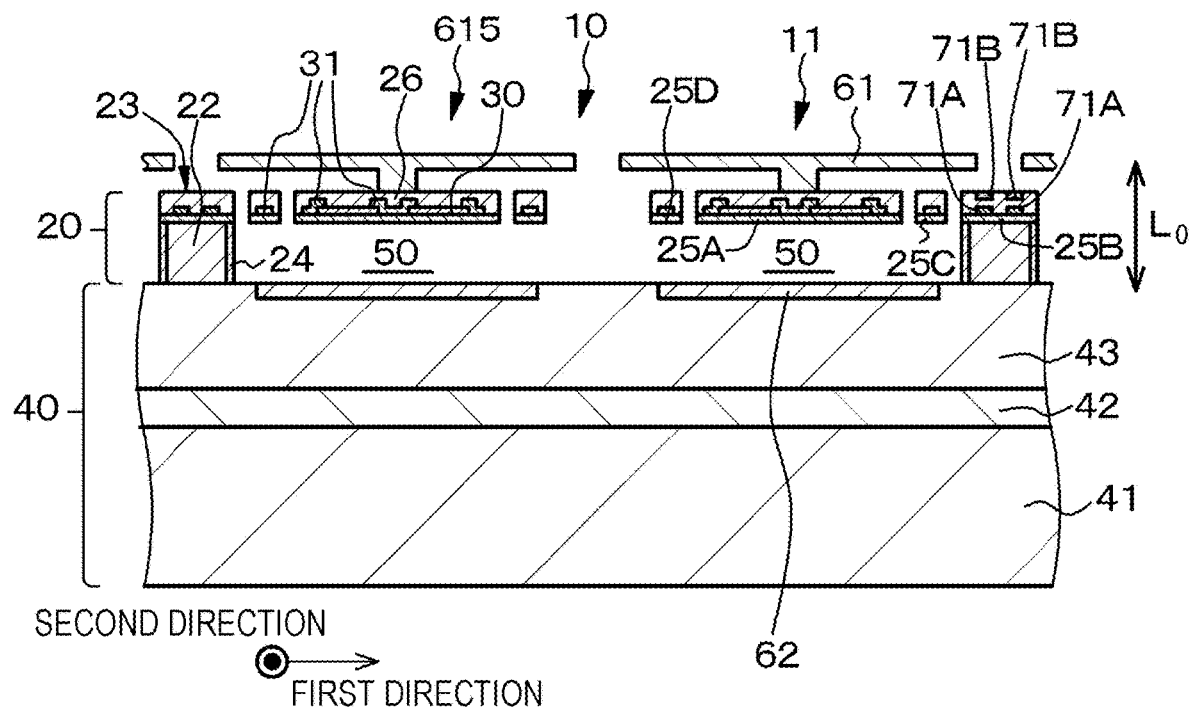
FIG. 16 is a schematic partial end view of a variant of the imaging apparatus according to the sixth embodiment.
Figure 17:
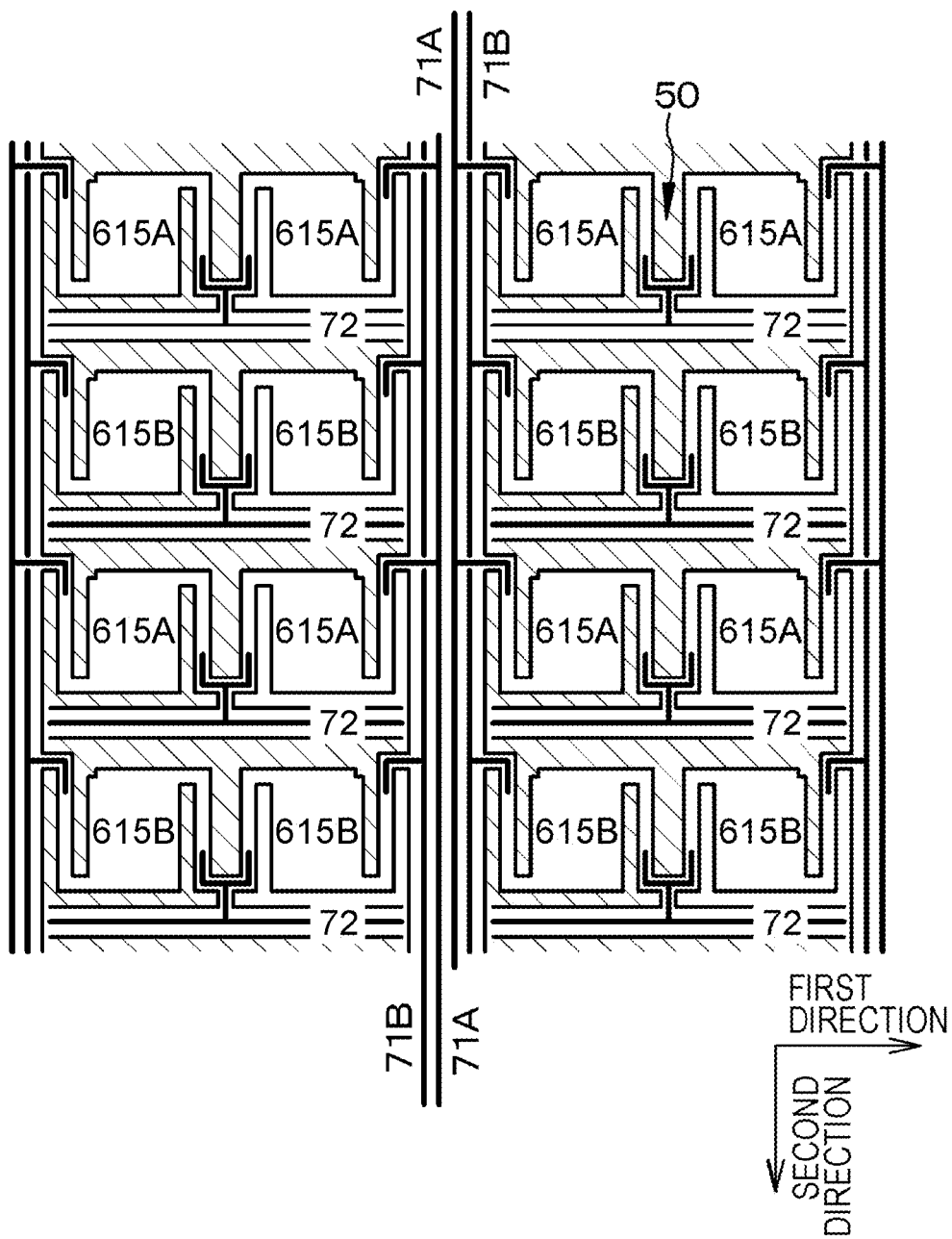
FIG. 17 is a diagram schematically illustrating an arrangement state of the components in a variant of the imaging apparatus according to the sixth embodiment illustrated in FIG. 16.

Additionally, as illustrated in a schematic partial end view of FIG. 16 and as schematically illustrated in an arrangement state of the components in the imaging apparatus of FIG. 17, a cavity 50 can be configured to be shared in 2×k adjacent temperature detection devices (where k is an integer of 1 or more, and k=1 in the illustrated example). Additionally, the cavities 50 are shaded in FIG. 17 in order to clearly illustrate the cavities 50. Further, the signal lines 71A and 71B and the drive lines 72 are indicated in thick solid lines, and some wirings 31 are also indicated in thick solid lines. This applies in FIG. 19 described below. In order to enhance the detection sensitivity of the temperature detection devices 615, thermal dissipation via the first studs 25C and the second studs 25D needs to be restricted as much as possible. In the example illustrated in FIG. 16, part of a first stud 25C is shared between two adjacent temperature detection devices in the first direction, thereby restricting thermal dissipation via the first stud 25C. Additionally, the structure of the cavities 50 illustrated in FIG. 16 and FIG. 17 can be applied to the imaging apparatuses described according to the first embodiment to the fifth embodiment.

A variant of the imaging apparatus according to the sixth embodiment will be described below.

Figure 18:
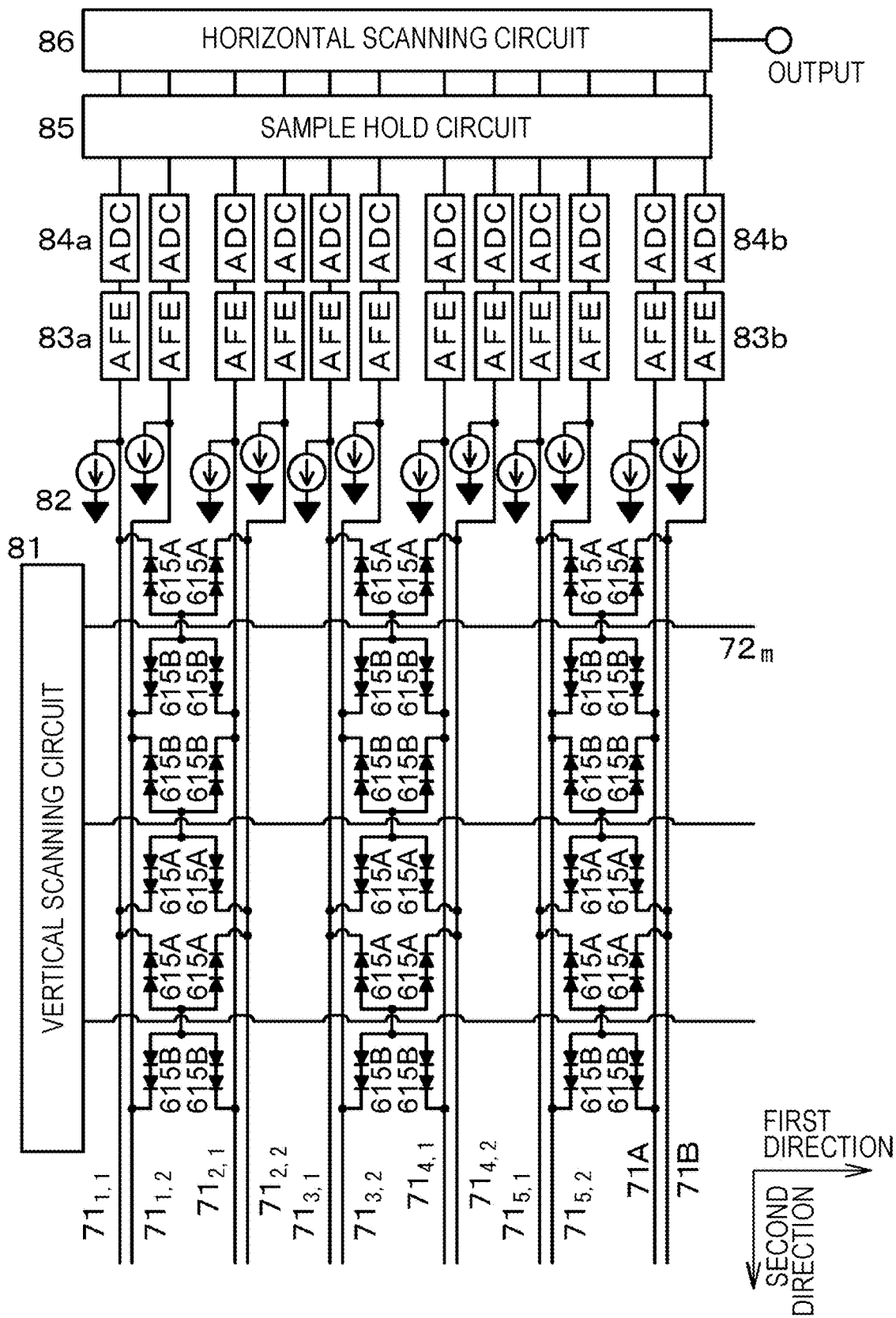
FIG. 18 is an equivalent circuit diagram of another variant of the imaging apparatus according to the sixth embodiment.
Figure 19:
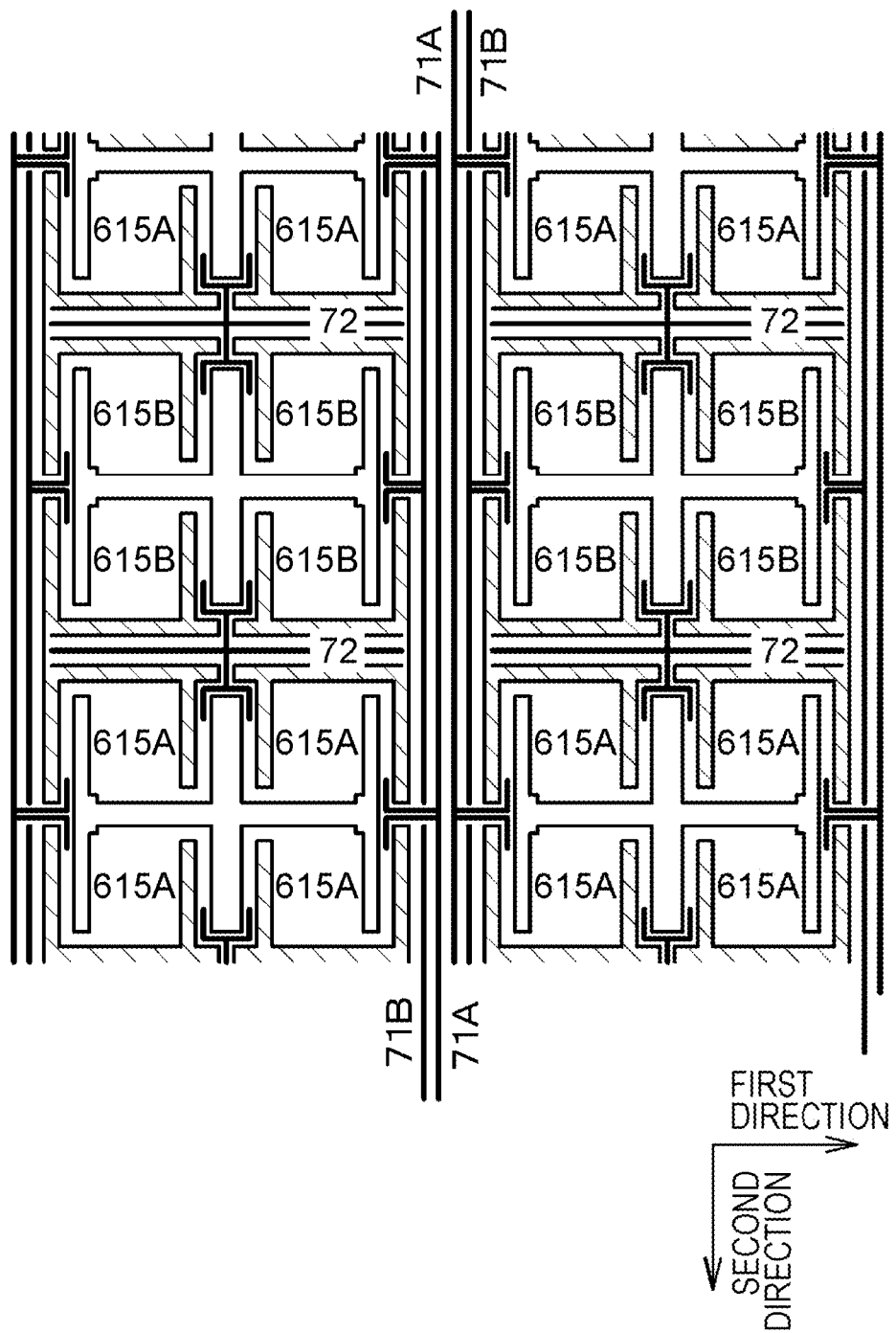
FIG. 19 is a diagram schematically illustrating an arrangement state of the components in another variant of the imaging apparatus according to the sixth embodiment illustrated in FIG. 18.

As illustrated in an equivalent circuit diagram of FIG. 18 and as schematically illustrated in an arrangement state of the components of FIG. 19, in the variant of the imaging apparatus according to the sixth embodiment, the number of plurality of drive lines is $M_0/P_0$, and an m-th drive line (where m=1, 2, . . . , $M_0/P_0$) is shared in a group of temperature detection devices configured of $M_O\{(m-1)P_O+p'\}$-th temperature detection devices (where $p'$=all values of 1, 2, ..., $P_O$) arranged in the first direction.

According to the sixth embodiment, more specifically, $P_O=2$ is assumed as described above. Thus, the value of p' is 1 and 2. That is, an m-th drive line $72_m$ is shared in a group of temperature detection devices configured of $M_O\{(m-1)P_O+p'\}$-th temperature detection devices arranged in the first direction (specifically all of $M_O\{(m-1)P_O+1\}$-th temperature detection devices and $M_O\{(m-1)P_O+2\}$-th temperature detection devices).

Then in the variant of the imaging apparatus according to the sixth embodiment illustrated in FIG. 18, the temperature detection devices 615A and 615B are arranged above the cavities 50 provided on a substrate for temperature detection devices (the first substrate 21), respectively, the first connection part (specifically part of the drive lines 72) provided on the substrate for temperature detection devices (the first substrate 21) is connected to the first terminals of the temperature detection devices 615A and 615B (specifically a pn junction diode 30 positioned at one end of the plurality of pn junction diodes 30) via the first stud 25C (specifically via the partially-shared first stud 25c), and the second connection part (specifically part of the signal lines 71A and 71B) provided on the substrate for temperature detection devices (the first substrate 21) is connected to the second terminals of the temperature detection devices 615A and 615B (specifically a pn junction diode 30 positioned at the other end of the plurality of pn junction diodes 30) via the second stud 25D (specifically via the partially-shared second stud 25D).

Alternatively, $P_O=2$ is assumed, the second terminals of two temperature detection devices 615A and 615B adjacent in the second direction are connected to the second connection part (part of the signal lines 71A and 71B) provided on the substrate for temperature detection devices (the first substrate 21) via one second stud 25D (specifically a partially-shared second stud 25D), and the first terminals of a total of four temperature detection devices 615A and 615B including two temperature detection devices 615A or two temperature detection devices 615B adjacent in the first direction and two temperature detection devices 615A and 615B adjacent in the second direction are connected to the first connection part (part of the drive lines 72) provided on the substrate for temperature detection devices (the first substrate 21) via one first stud 25C (specifically a partially-shared first stud 25C).

In order to enhance the detection sensitivity of the temperature detection devices 615, thermal dissipation via the first stud 25C and the second stud 25D needs to be restricted as much as possible. In the example illustrated in FIG. 18, part of the first stud 25C is shared among four temperature detection devices adjacent in the first direction and in the second direction, and part of the second stud 25D is shared in two temperature detection devices adjacent in the second direction, thereby restricting thermal dissipation via the first stud 25C and the second stud 25D. Additionally, the structure of the cavities 50 illustrated in FIG. 18 can be applied to the imaging apparatuses described according to the first embodiment to the fifth embodiment.

Seventh Embodiment

Figure 20:
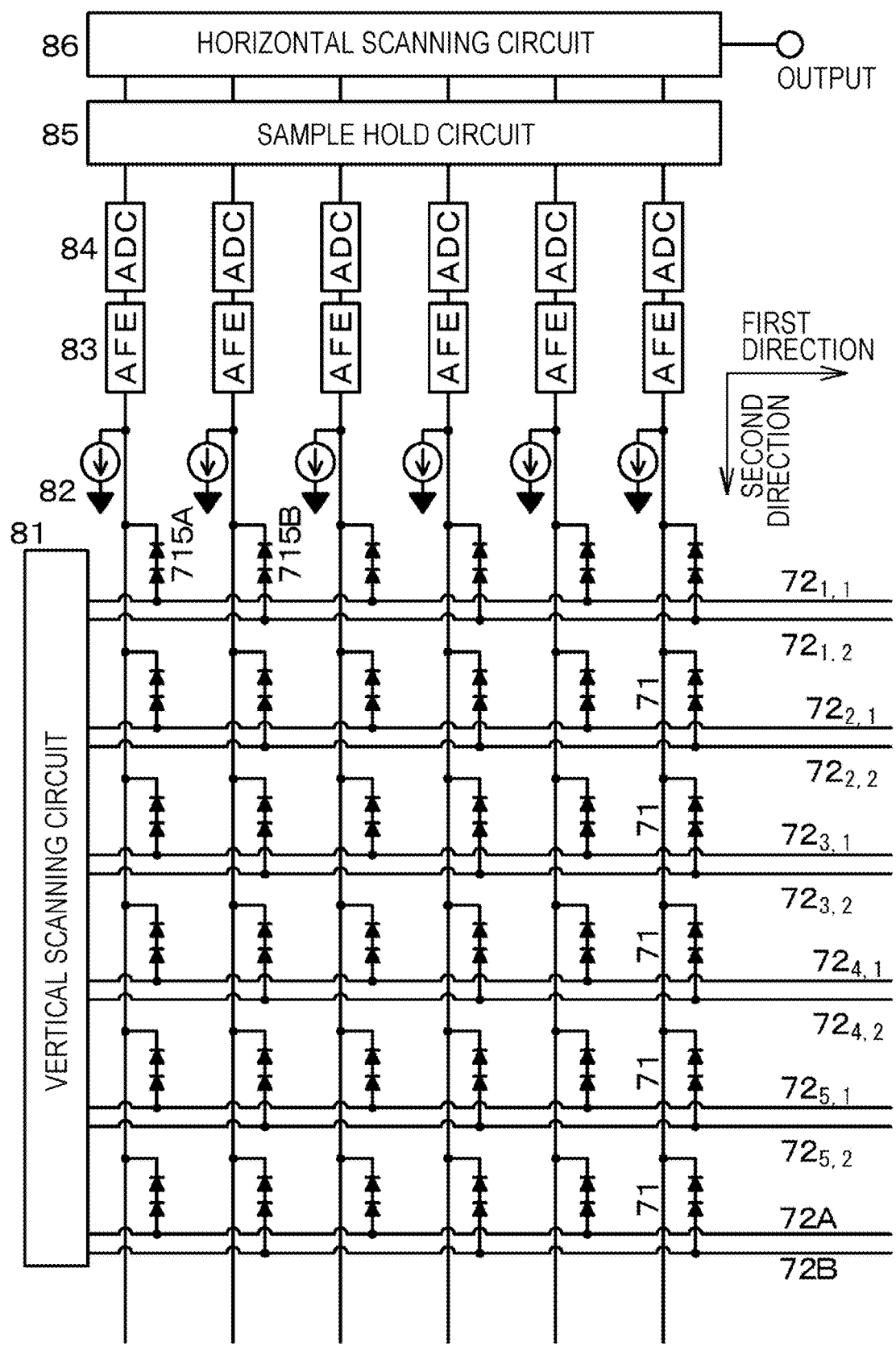
FIG. 20 is an equivalent circuit diagram of an imaging apparatus according to a seventh embodiment.

A seventh embodiment relates to the imaging apparatus according to the fifth aspect in the present disclosure. As illustrated in an equivalent circuit diagram of FIG. 20, an imaging apparatus according to the seventh embodiment includes:

$S_O \times T_O$ (where $S_O \geq 2$, $T_O \geq 2$) temperature detection devices 715A and 715B arranged in a 2D matrix shape in a first direction and in a second direction different from the first direction and configured to detect a temperature on the basis of an infrared ray;

$S_O \times U_O$ (where $U_O \geq 2$) drive lines 72 arranged in the first direction;

a plurality of signal lines 71 arranged in the second direction;

a first drive circuit (specifically the vertical scanning circuit 81) connected with the $S_O \times U_O$ drive lines 72; and a second drive circuit (specifically the horizontal scanning circuit 86 or the like) connected with the plurality of signal lines 71. Then, each of the temperature detection devices 715A and 715B includes a first terminal (specifically a pn junction diode 30 positioned at one end of the plurality of pn junction diodes 30) and a second terminal (specifically a pn junction diode 30 positioned at the other end of the plurality of pn junction diodes 30), the second terminal of each of the temperature detection devices 715A and 715B is connected to a signal line 71, and a (s, u)-th drive line 72 (where s=1, 2, ..., $S_O$, and u=1, 2, ..., $U_O$) is connected to the first terminals of $\{(t-1)U_O+u\}$-th temperature detection devices 715A and 715B (where t=1, 2, 3, ...) in a group of temperature detection devices configured of $S_O$ s-th temperature detection devices 715A and 715B arranged in the first direction.

According to the seventh embodiment, more specifically, $U_O=2$ is assumed. Thus, the value of u is 1 or 2. That is, the number of drive lines is $2S_O$. The temperature detection devices connected to an odd-numbered drive line 72A ($72_{1,1}$, $72_{2,1}$, $72_{3,1}$, ...) are denoted with a reference numeral 715A, and the temperature detection devices connected to an even-numbered drive line 72B ($72_{1,2}$, $72_{2,2}$, $72_{3,3}$, ...) are denoted with a reference numeral 715B.

Assuming u=1, a (s, 1)-th drive line is connected to the first terminals of $\{(t-1)U_O+1\}$-th temperature detection devices (where t=1, 2, 3, ...) in a group of temperature detection devices configured of $S_O$ s-th temperature detection devices arranged in the first direction, or the odd-numbered temperature detection devices 715A. Further, assuming u=2, a (s, 2)-th drive line is connected to the second terminals of $\{(t-1)P_O+2\}$-th temperature detection devices (where t=1, 2, 3, ...) in a group of temperature detection devices configured of $S_O$ s-th temperature detection devices arranged in the first direction, or the even-numbered temperature detection devices 715B.

In this way, a group of temperature detection devices 715A and 715B arranged in the first direction is divided into two groups (the odd-numbered temperature detection devices 715A arranged in the first direction and the even-numbered temperature detection devices 715B arranged in the first direction), and the groups of temperature detection devices 715A and 715B are connected to the drive lines 72A and 72B, respectively. That is, the temperature detection devices 715A and 715B arranged in the first direction are connected to the two drive lines 72A and 72B. Thus, a reduction in current density of a current flowing in the drive lines can be achieved, thereby achieving a reduction in power consumption in driving the temperature detection devices and restricting a reduction in voltage in the drive lines, for example. The configuration and structure of the imaging apparatus according to the seventh embodiment can be applied to the imaging apparatuses described according to the first embodiment to the sixth embodiment. In some cases, the configuration and structure of the imaging apparatus according to the seventh embodiment can be applied to imaging apparatuses (such as imaging apparatus configured to perform imaging on the basis of a visible ray) in configurations and structures other than the imaging apparatuses described according to the first embodiment to the sixth embodiment.

Eighth Embodiment

Figure 21:
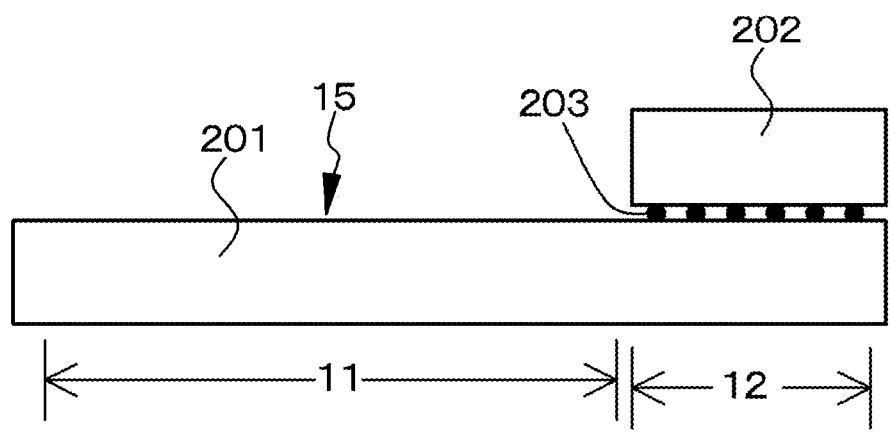
FIG. 21 is a conceptual diagram as a partial end view of an imaging apparatus according to an eighth embodiment.

An eighth embodiment relates to the imaging apparatus according to the sixth aspect in the present disclosure. As illustrated in a conceptual diagram as partial end view of FIG. 21, an imaging apparatus according to the eighth embodiment includes a substrate 201 for temperature detection devices including:

a plurality of temperature detection devices 15 arranged in a 2D matrix shape in a first direction and in a second direction different from the first direction and configured to detect a temperature on the basis of an infrared ray;

a plurality of drive lines 72 arranged in the first direction and connected with the plurality of temperature detection devices 15; and a plurality of signal lines 71 arranged in the second direction and connected with the plurality of temperature detection devices 15. Then, the substrate 201 for temperature detection devices includes the temperature detection device array region 11 in which a plurality of temperature detection devices 15 are arranged in a 2D matrix shape and the peripheral region 12 surrounding the temperature detection device array region 11, and the drive lines 72 and the signal lines 71 are electrically connected to a drive circuit provided on a drive circuit chip 202 in the peripheral region 12 on the side in which an infrared ray is incident. Additionally, the substrate 201 for temperature detection devices can be configured in the laminated structure of the first structure 20 and the second structure 40 described according to the first embodiment to the seventh embodiment.

However, the drive circuit does not need to be formed in the second structure 40 and the second substrate 41 does not necessarily need to include a silicon semiconductor substrate, but it is preferable that the infrared ray reflection layer, the temperature control layer, and the heat conductive layer (heat uniformization layer) are provided.

Here, electric connection may employ a method using solder bumps 203 (method in the chip-on-chip system) as illustrated, or may employ a method using through chip vias (TCV) or through silicon vias (TSV). The drive circuit may be in a well-known configuration or structure. This applies in a ninth embodiment described below.

The configuration of the entire imaging apparatus can be simplified in the above configuration and structure. The configuration and structure of the temperature detection devices and the configurations of the signal lines and the drive lines described according to the first embodiment to the seventh embodiment can be applied to the configuration and structure of the temperature detection devices and the configurations of the signal lines and the drive lines in the imaging apparatus according to the eighth embodiment or an imaging apparatus according to the ninth embodiment described below.

Ninth Embodiment

The ninth embodiment relates to the imaging apparatus according to the seventh aspect in the present disclosure. An imaging apparatus according to the seventh embodiment is configured of the first structure 20 and the second structure 40, in which the first structure 20 includes:

the first substrate 21;

a plurality of temperature detection devices 15 provided on the first substrate 21, arranged in a 2D matrix shape in a first direction and in a second direction different from the first direction, and configured to detect a temperature on the basis of an infrared ray;

a plurality of drive lines 72 arranged in the first direction and connected with the plurality of temperature detection devices 15; and a plurality of signal lines 71 arranged in the second direction and connected with the plurality of temperature detection devices 15. Then, the second structure 40 includes:

the second substrate 41; and a drive circuit provided on the second substrate 41, the first structure 20 includes the temperature detection device array region 11 in which a plurality of temperature detection devices 15 are arranged in a 2D matrix shape and the peripheral region 12 surrounding the temperature detection device array region 11, the second structure 40 is attached on a side of the first substrate in which an infrared ray is incident, and the drive lines 72 and the signal lines 71 are electrically connected to the drive circuit in the peripheral region 12.

Specifically, for example, the imaging apparatuses described according to the first embodiment to the eighth embodiment may be configured such that the drive circuit is not provided in the center region 13 in the second structure 40, an infrared ray is incident from the center region 13 in the second structure 40, the infrared ray absorption layer 61 is arranged at the position where the infrared ray reflection layer 62 is arranged, and the infrared ray reflection layer 62 is arranged at the position where the infrared ray absorption layer 61 is arranged. Further, the positional relationships of the cavities 50 and the cavities 51 may be reverse. The drive circuit may be covered with the covering layer 43.

10th Embodiment

Figure 22:
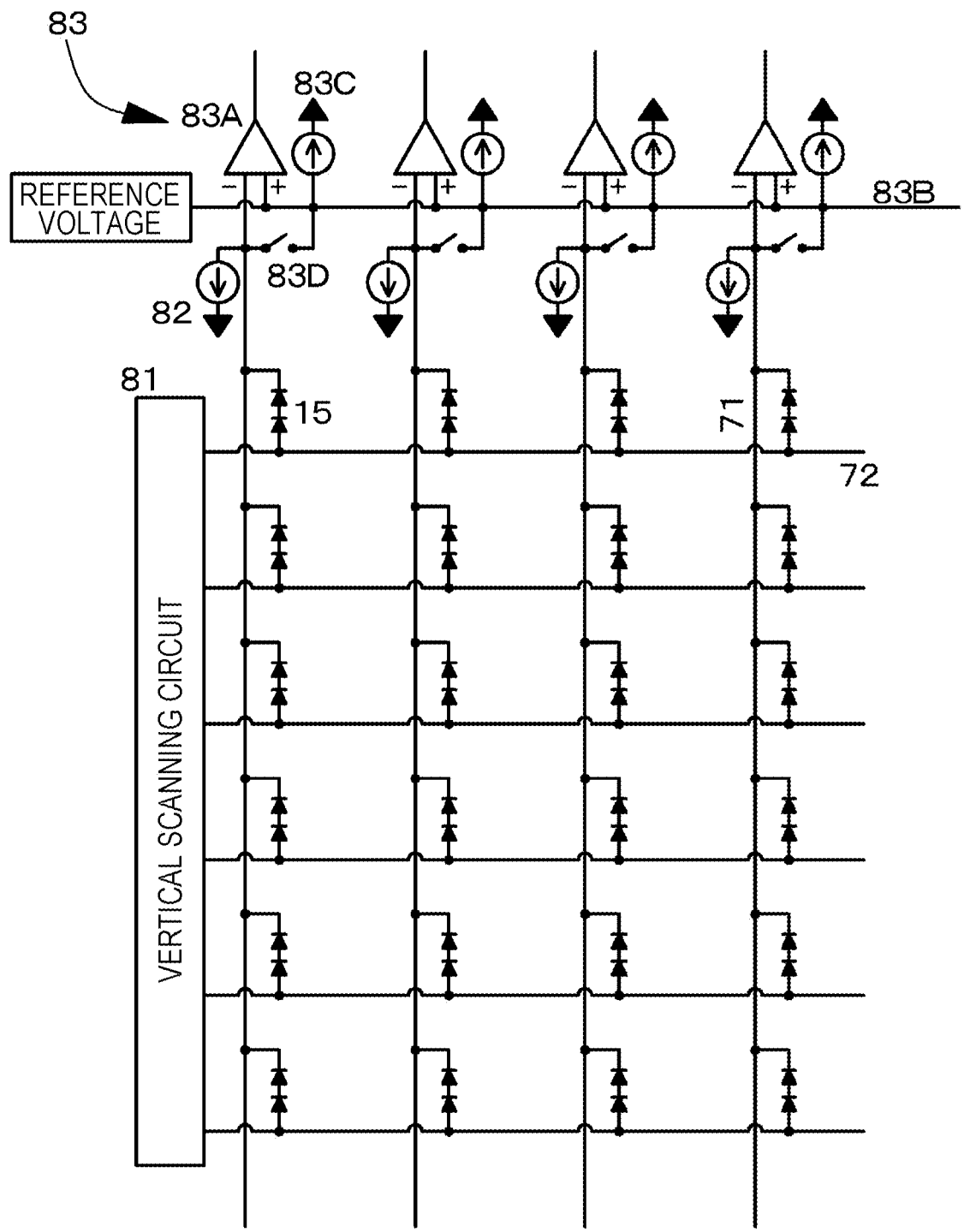
FIG. 22 is an equivalent circuit diagram of an imaging apparatus according to a 10th embodiment.

A 10th embodiment relates to a noise reduction method in the imaging apparatuses according to the present disclosure. An imaging apparatus according to the 10th embodiment is an imaging apparatus described according to the first embodiment to the ninth embodiment. That is, as illustrated in an equivalent circuit diagram of FIG. 22, the imaging apparatus according to the 10th embodiment includes:

the temperature detection devices 15 configured to detect a temperature on the basis of an infrared ray;

the drive lines 72 connected with the temperature detection devices 15; and the signal lines 71 connected with the temperature detection devices 15, and further includes:

a first drive circuit connected with the drive lines 72, a second drive circuit connected with the signal lines 71, and a storage apparatus (such as nonvolatile memory (not illustrated)), in which a signal line 71 is connected to a differential integration circuit 83A and an analog-digital conversion circuit 85 in the second drive circuit.

Here, in the imaging apparatuses according to the first embodiment to the 10th embodiment, a voltage of each signal line 71 is input in one input unit of a differential integration circuit 83A configuring an analog front end (AFE) 83. Further, a standard voltage (reference voltage) is input in the other input unit of the differential integration circuit 83A via a wiring 83B. The wiring 83B is further connected to a constant current circuits 83C. Furthermore, a switch means 83D configured to short-circuit each signal line 71 and a wiring 83 is arranged between each signal line 71 and a wiring 83B. Additionally, a constant current circuit 83C is arranged per signal line, thereby reducing errors caused by a reduction in voltage due to wiring resistance. That is, when a constant current circuit 83C is arranged per signal line, a distribution of currents of the wirings 83B and a distribution of currents of the drive lines 72 can be made almost equal. When the distributions of currents are equal and the wiring resistance values per length of the wirings 83B and the drive lines 72 are made almost equal, the reductions in voltage, which are a product of wiring resistance by current, can be made almost equal per line. A reduction in voltage in the wiring 83B lowers the voltage of the plus terminal in the differential integration circuit 83A, and the reduction in voltage of the drive line 72 lowers the voltage of the minus terminal of the differential integration circuit 83A, but the equal reductions in voltage at the plus terminal and the minus terminal are compensated for by differential integration, thereby reducing errors at the output terminal of the differential integration circuit 83A.

In the noise reduction method according to the 10th embodiment, at first, the temperature detection devices 15 are disabled and the differential integration circuits 83A are reset. That is, the switch means 83D is set in the "closed" state and the two input units of the differential integration circuit 83A are short-circuited without selecting temperature detection devices 15 from the vertical scanning circuit 81, thereby resetting the differential integration circuit 83A.

Then, the temperature detection devices 15 are disabled, a constant current is flowed in the signal line 71 for the same time $TM_0$ as the time $TM_0$ when the temperature detection devices 15 are enabled, the voltage of the signal line 71 is integrated in the differential integration circuit 83A, the resultant integral value is converted into a digital value in the analog-digital conversion circuit 85, and the resultant digital value is stored as offset value in the storage apparatus.

Specifically, the switch means 83D is set in the "open" state, the temperature detection devices 15 remain disabled, and a constant current is flowed in the signal line 71 for the same time $TM_0$ as the time $TM_0$ when the temperature detection devices 15 are enabled, while a standard voltage (reference voltage) is input in the other input unit of the differential integration circuit 83A via the wiring 83B. The voltage of the signal line 71 (basically non-changing voltage value) is integrated in the differential integration circuit 83A. Then, after the time $TM_0$ elapses, the resultant integral value is converted into a digital value in the analog-digital conversion circuit 85, and the resultant digital value is stored as offset value in the storage apparatus. In this way, the standard voltage (reference voltage) is input in one input unit of the differential integration circuit 83A, and the outputs of the disabled temperature detection devices 15 are input in the other input unit of the differential integration circuit 83A, and consequently the integral value obtained in the differential integration circuit 83A is due to a variation in characteristics in the differential integration circuit 83A (variation in offset in the operational amplifier configuring the differential integration circuit).

Then, the temperature detection devices 15 are actually operated. Here, the temperature detection devices 15 are set in the enabled state only for the time $TM_0$, the voltage of the signal line 71 is integrated in the differential integration circuit 83A, and the resultant integral value is converted into a digital value in the analog-digital conversion circuit 85 to obtain a digital signal value, and then the offset value is subtracted from the digital signal value.

In this way, it is possible to reduce noises due to the differential integration circuits 83A or it is possible to restrict variations in characteristics in the differential integration circuits 83A, thereby reducing longitudinally-fixed pattern noises. The above processing may be performed before reading one imaging frame (one screen).

11th Embodiment

Figure 23:
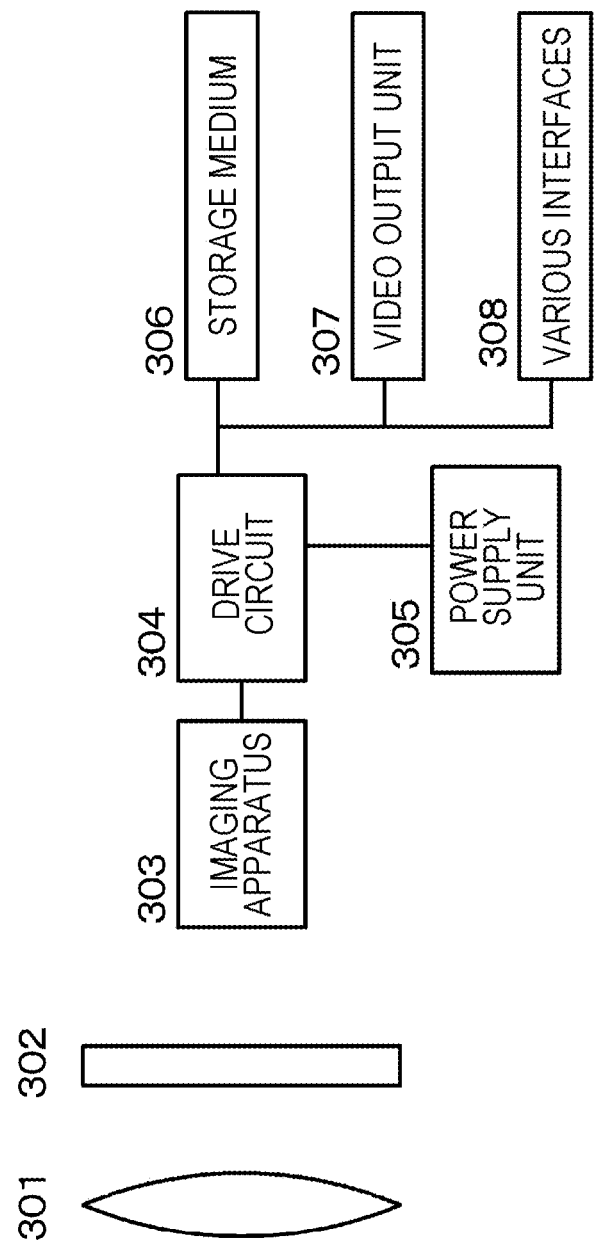
FIG. 23 is a conceptual diagram of an infrared camera including the imaging apparatus according to the present disclosure.

An example in which an imaging apparatus described according to the first embodiment to the 10th embodiment is applied to an infrared camera will be described according to an 11th embodiment. As illustrated in a conceptual diagram of FIG. 23, an infrared camera is configured of a lens 301, a shutter 302, an imaging apparatus 303 described according to the first embodiment to the 10th embodiment, a drive circuit 304, a power supply unit 305, a storage medium 306, a video output unit 307, and various interfaces 308. The drive circuit 304 may be various circuits described above, and may be a signal processing circuit configured to correct an inter-pixel variation, to correct a missing pixel, and to perform various noise cancellation, for example. The components in the thus-configured infrared camera may be well-known components except the imaging apparatus 303, and thus the detailed description thereof will be omitted.

12th Embodiment

The technology according to the present disclosure (the present technology) can be applied to various products. For example, the technology according to the present disclosure may be realized as an apparatus mounted on any mobile object such as automobile, electric vehicle, hybrid electric vehicle, motorcycle, bicycle, personal mobility, airplane, drone, ship, or robot.

Figure 31:
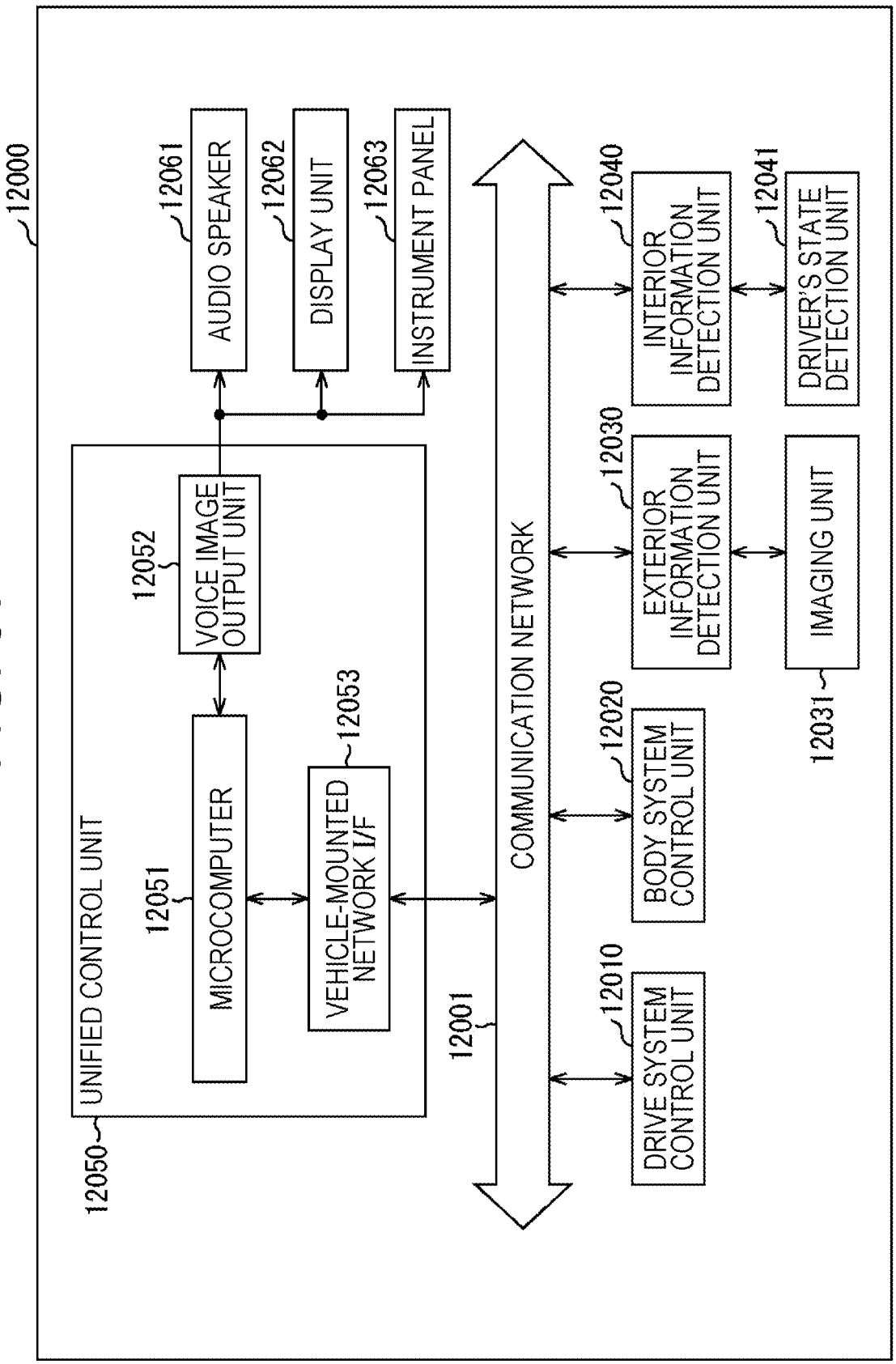
FIG. 31 is a block diagram illustrating an exemplary schematic configuration of a vehicle control system.

FIG. 31 is a block diagram illustrating an exemplary schematic configuration of a vehicle control system as an exemplary mobile control system to which the technology according to the present disclosure is applicable.

A vehicle control system 12000 includes a plurality of electronic control units connected via a communication network 12001. In the example illustrated in FIG. 31, the vehicle control system 12000 includes a drive system control unit 12010, a body system control unit 12020, an exterior information detection unit 12030, an interior information detection unit 12040, and a unified control unit 12050. Further, a microcomputer 12051, a voice image output unit 12052, and a vehicle-mounted network interface (I/F) 12053 are illustrated as functional components of the unified control unit 12050.

The drive system control unit 12010 controls the operations of the apparatuses for the vehicle drive system according to various programs. For example, the drive system control unit 12010 functions as control apparatuses such as a drive force generation apparatus configured to generate a drive force of a vehicle such as internal combustion engine or drive motor, a drive force transmission mechanism configured to transmit a drive force to wheels, a steering mechanism configured to adjust a rudder angle of a vehicle, and a braking apparatus configured to generate a braking force of a vehicle.

The body system control unit 12020 controls the operations of various apparatuses mounted on a vehicle body according to various programs. For example, the body system control unit 12020 functions as a keyless entry system, a smart key system, a power window apparatus, or a control apparatus for various lamps such as headlights, backlights, brake light, directional signal, and fog light. In this case, a radio wave originated from a portable machine as key, or signals of various switches can be input in the body system control unit 12020. In response to the input of a radio wave or signal, the body system control unit 12020 controls the door lock apparatus, the power window apparatus, a lamp, or the like of the vehicle.

The exterior information detection unit 12030 detects exterior information of a vehicle mounting the vehicle control system 12000 thereon. For example, the exterior information detection unit 12030 is connected with an imaging unit 12031. The exterior information detection unit 12030 causes the imaging unit 12031 to shoot an image outside the vehicle, and receives the shot image. The exterior information detection unit 12030 may perform an object detection processing or distance detection processing for person, vehicle, obstacle, sign, on-road characters, or the like on the basis of the received image.

The imaging unit 12031 is an optical sensor configured to receive a light and to output an electric signal depending on the amount of received light. The imaging unit 12031 can output the electric signal as an image or can output it as distance measurement information. Further, a light received by the imaging unit 12031 may be a visible ray or a non-visible ray such as infrared ray.

The interior information detection unit 12040 detects interior information of the vehicle. The interior information detection unit 12040 is connected with a driver's state detection unit 12041 configured to detect a state of a driver, for example. The driver's state detection unit 12041 includes a camera configured to shoot a driver, for example, and the interior information detection unit 12040 may calculate a degree of driver's fatigue or concentration or may determine whether the driver is dozing off on the basis of the detection information input from the driver's state detection unit 12041.

The microcomputer 12051 can calculate a control target value of the drive force generation apparatus, the steering mechanism, or the braking apparatus on the basis of the exterior or interior information obtained by the exterior information detection unit 12030 or the interior information detection unit 12040, and can output a control command to the drive system control unit 12010. For example, the microcomputer 12051 can perform coordinate control for realizing the advanced driver assistance system (ADAS) functions including vehicle collision avoidance, impact relaxation, follow-up traveling based on inter-vehicle distance, traveling at maintained vehicle speed, vehicle collision alarm, vehicle's lane deviation alarm, or the like.

Further, the microcomputer 12051 can perform coordinate control for automatic driving or the like for autonomous traveling without driver's operation by controlling the drive force generation apparatus, the steering mechanism, the braking apparatus, or the like on the basis of the information around the vehicle obtained by the exterior information detection unit 12030 or the interior information detection unit 12040.

Further, the microcomputer 12051 can output a control command to the body system control unit 12020 on the basis of the exterior information obtained by the exterior information detection unit 12030. For example, the microcomputer 12051 can perform coordinate control for achieving anti-glare such as switching high beam to low beam by controlling the headlights depending on a position of a leading vehicle or oncoming vehicle detected by the exterior information detection unit 12030.

The voice image output unit 12052 transmits an output signal of at least one of voice and image to an output apparatus capable of visually or aurally notifying a passenger of the vehicle or the outside of the vehicle with information. An audio speaker 12061, a display unit 12062, and an instrument panel 12063 are illustrated as output apparatuses in the example of FIG. 31. The display unit 12062 may include at least one of onboard display and heat-up display, for example.

Figure 32:
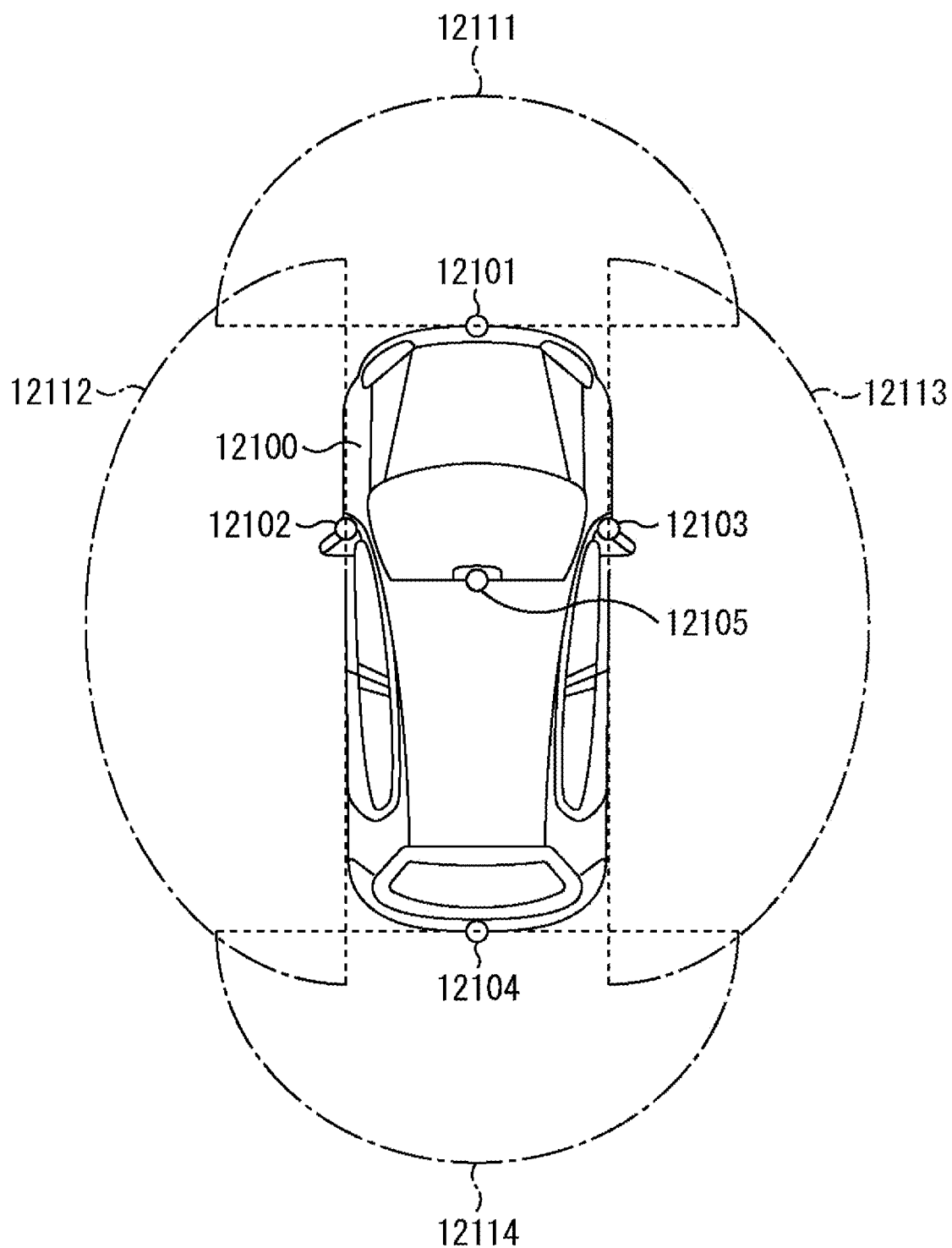
FIG. 32 is an explanatory diagram illustrating exemplary installation positions of an exterior information detection unit and an imaging unit.

FIG. 32 is a diagram illustrating an exemplary installation position of the imaging unit 12031.

In FIG. 32, a vehicle 12100 has imaging units 12101, 12102, 12103, 12104, and 12105 as the imaging unit 12031.

The imaging units 12101, 12102, 12103, 12104, and 12105 are provided at the front nose, the side mirrors, the rear bumper, the back door, on the top of the interior front glass, or the like of the vehicle 12100. The imaging unit 12101 provided at the front nose and the imaging unit 12105 provided on the top of the interior front glass mainly obtain images in front of the vehicle 12100. The imaging units 12102 and 12103 provided on the side mirrors mainly obtain images of both sides of the vehicle 12100. The imaging unit 12104 provided on the rear bumper or the back door mainly obtains images behind the vehicle 12100. The images in front of the vehicle obtained by the imaging units 12101 and 12105 are mainly used for detecting a leading vehicle, a foot passenger, an obstacle, a traffic light, a traffic sign, a lane, or the like.

Additionally, FIG. 32 illustrates exemplary imaging ranges of the imaging units 12101 to 12104. An imaging range 12111 indicates an imaging range of the imaging unit 12101 provided at the front nose, the imaging ranges 12112 and 12113 indicate the imaging ranges of the imaging units 12102 and 12103 provided on the side mirrors, respectively, and an imaging range 12114 indicates an imaging range of the imaging unit 12104 provided at the rear bumper or the back door. For example, the image data shot by the imaging units 12101 to 12104 are overlapped thereby to obtain a perspective image of the vehicle 12100 viewed from above.

At least one of the imaging units 12101 to 12104 may have a distance information acquisition function. For example, at least one of the imaging units 12101 to 12104 may be a stereo camera configured of a plurality of imaging devices, or an imaging device having pixels for phase difference detection.

For example, the microcomputer 12051 finds the distances to the solid objects in the imaging ranges 12111 to 12114 on the basis of the distance information obtained from the imaging units 12101 to 12104, and the temporal changes of the distances (the relative speeds to the vehicle 12100), thereby extracting especially a solid object, which is the closest to the vehicle 12100 on the traveling road and travels at a predetermined speed (such as 0 km/h or more) in substantially the same direction as the vehicle 12100, as a leading vehicle. Further, the microcomputer 12051 sets an inter-vehicle distance to be previously secured behind a leading vehicle, thereby performing automatic braking control (including follow-up stop control), automatic acceleration control (including follow-up start control), and the like. As described above, it is possible to perform coordinate control for automatic driving and the like for autonomous traveling without any driver's operation.

For example, the microcomputer 12051 can classify and extract the solid object data indicating solid objects into and as solid objects such as two wheels, ordinary vehicles, large-sized vehicles, foot passengers, and others such as utility poles on the basis of the distance information obtained from the imaging units 12101 to 12104, and can use them for automatically avoiding an obstacle. For example, the microcomputer 12051 discriminates obstacles around the vehicle 12100 into obstacles visually confirmable by the driver of the vehicle 12100 and obstacles which are difficult to visually confirm. The microcomputer 12051 then determines a collision risk indicating a degree of danger of collision with each obstacle, and outputs an alarm to the driver via the audio speaker 12061 or the display unit 12062 or performs forcible deceleration or steering avoidance via the drive system control unit 12010 when the collision risk is at a set value or more and a collision can occur, thereby performing driving support for collision avoidance.

At least one of the imaging units 12101 to 12104 may be an infrared camera configured to detect an infrared ray. For example, the microcomputer 12051 determines whether a foot passenger is present in the shot images of the imaging units 12101 to 12104, thereby recognizing the foot passenger. A foot passenger is recognized in the procedure of extracting the characteristic points in the shot images of the imaging units 12101 to 12104 as infrared cameras and the procedure of determining whether a foot passenger is present by performing the pattern matching processing on the characteristic points indicating the contours of objects, for example. When the microcomputer 12051 determines that a foot passenger is present in the shot images of the imaging units 12101 to 12104, and recognizes the foot passenger, the voice image output unit 12052 controls the display unit 12062 such that a square contour line is displayed in an overlapped manner on the recognized foot passenger to be emphasized. Further, the voice image output unit 12052 may control the display unit 12062 to display an icon or the like indicating a foot passenger at a desired position.

13th Embodiment

Further, the technology according to the present disclosure (the present technology) can be applied to various products. For example, the technology according to the present disclosure may be applied to an endoscopic surgery system.

Figure 33:
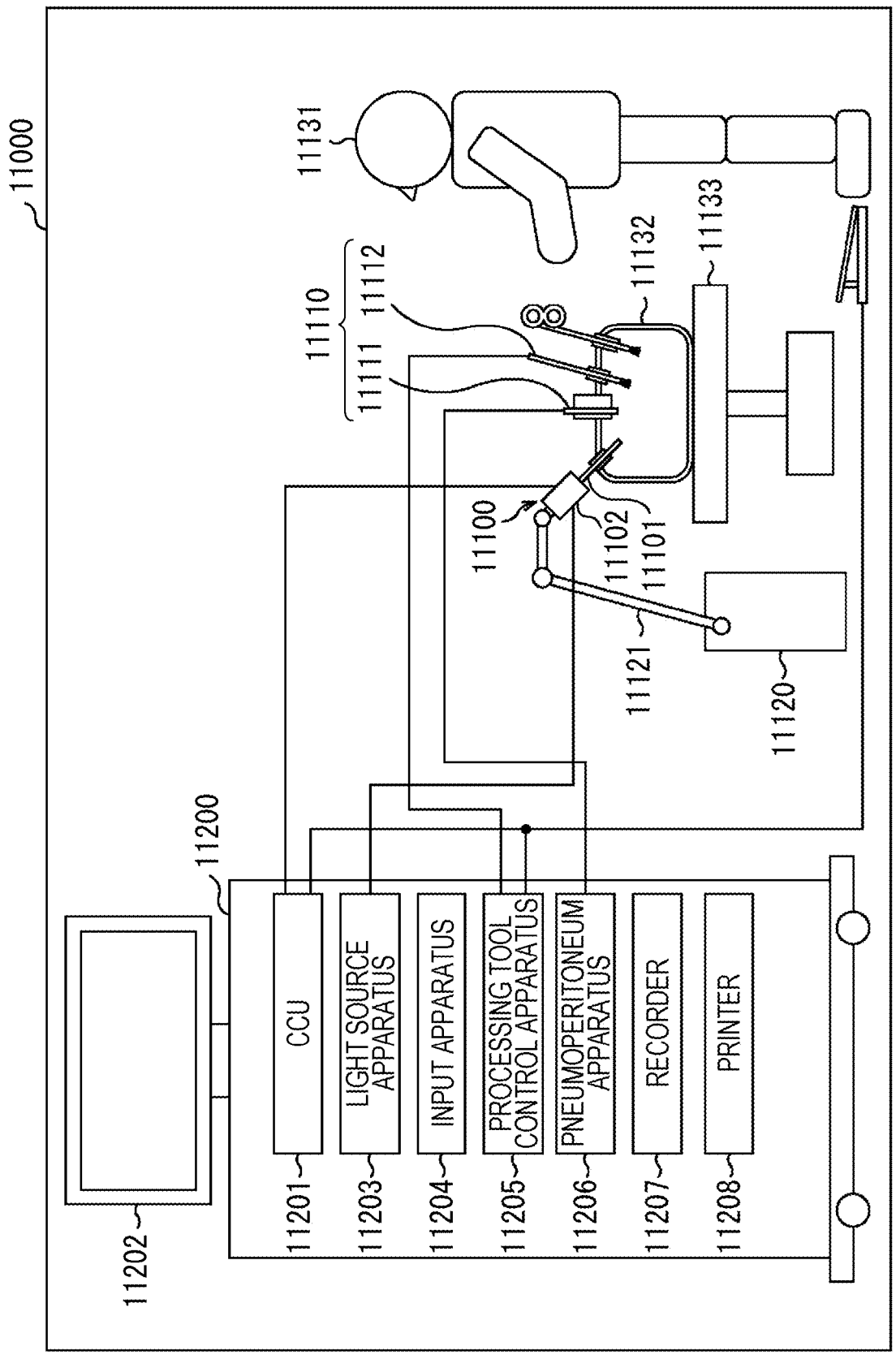
FIG. 33 is a diagram illustrating an exemplary schematic configuration of an endoscopic surgery system.

FIG. 33 is a diagram illustrating an exemplary schematic configuration of an endoscopic surgery system to which the technology according to the present disclosure (the present technology) is applicable.

FIG. 33 illustrates how an operator (doctor) 11131 performs an operation on a patient 11132 on a patient's bed 11133 by use of an endoscopic surgery system 11000. As illustrated, the endoscopic surgery system 11000 is configured of an endoscope 11100, other tools 11110 such as pneumoperitoneum tube 11111 and energy processing tool 11112, a support arm apparatus 11120 configured to support the endoscope 11100, and a cart 11200 on which various apparatuses for endoscopic surgery are mounted.

The endoscope 11100 is configured of a lens tube 11101 a region with a predetermined length from the tip end of which is inserted into the body cavity of the patient 11132, and a camera head 11102 connected to the base end of the lens tube 11101. The endoscope 11100 configured as a hard mirror having the hard lens tube 11101 is illustrated in the example, but the endoscope 11100 may be configured as a flexible mirror having a flexible lens tube.

The tip end of the lens tube 11101 is provided with an opening fitted with an objective lens. A light source apparatus 11203 is connected to the endoscope 11100, and a light generated by the light source apparatus 11203 is guided to the tip end of the lens tube by a light guide extended into the lens tube 11101, and is emitted toward an object to be observed in the body cavity of the patient 11132 via the objective lens. Additionally, the endoscope 11100 may be a forward-viewing endoscope, or may be a forward-oblique viewing endoscope or side-viewing endoscope.

An optical system and an imaging device are provided inside the camera head 11102, and a reflected light (observation light) from an object to be observed is condensed to the imaging device by the optical system. The observation light is photoelectrically converted by the imaging device thereby to generate an electric signal corresponding to the observation light or an image signal corresponding to the observation image. The image signal is transmitted as RAW data to a camera control unit (CCU) 11201.

The CCU 11201 is configured of a central processing unit (CPU), a graphics processing unit (GPU), or the like, and totally controls the operations of the endoscope 11100 and a display apparatus 11202. Further, the CCU 11201 receives an image signal from the camera head 11102, and performs various image processing for displaying an image based on the image signal, such as development processing (demosaic processing), on the image signal.

The display apparatus 11202 displays the image based on the image signal subjected to the image processing by the CCU 11201 under control of the CCU 11201.

The light source apparatus 11203 is configured of a light source such as light emitting diode (LED), and supplies the endoscope 11100 with an irradiation light when shooting a surgery site or the like.

An input apparatus 11204 is an input interface for the endoscopic surgery system 11000. A user can input various items of information or can input instructions in the endoscopic surgery system 11000 via the input apparatus 11204. For example, the user inputs an instruction to change the imaging conditions (such as type of irradiation light, magnification, and focal distance) of the endoscope 11100, and the like.

A processing tool control apparatus 11205 controls driving of the energy processing tool 11112 for cauterizing and incising a tissue, sealing a blood vessel, and the like. A pneumoperitoneum apparatus 11206 feeds gas into the body cavity via the pneumoperitoneum tube 11111 for expanding the body cavity of the patient 11132 in order to secure a field of view of the endoscope 11100 and to secure a working space of the operator. A recorder 11207 is an apparatus capable of recording various items of surgery-related information. A printer 11208 is an apparatus capable of printing various items of surgery-related information in various forms such as text, image, and graph.

Additionally, the light source apparatus 11203 configured to supply the endoscope 11100 with an irradiation light when shooting a surgery site can be configured of a LED, a laser light source, or a white light source in combination of them, for example. In a case where the white light source is configured in combination of RGB laser light sources, an output intensity and an output timing of each color (each wavelength) can be controlled with high accuracy, and thus white balance of a shot image can be adjusted in the light source apparatus 11203. Further, in this case, an object to be observed is irradiated with the laser lights from the respective RGB laser light sources in a time division manner, and the imaging device of the camera head 11102 is controlled to be driven in synchronization with the irradiation timings, thereby shooting the images corresponding to RGB in a time division manner, respectively. With the method, a color image can be obtained without a color filter provided in the imaging device.

Further, the light source apparatus 11203 may be controlled to be driven such that an intensity of a light to be output can be changed at a predetermined time. The imaging device of the camera head 11102 is controlled to be driven in synchronization with the timing to change the intensity of a light to obtain images in a time division manner, and the images are combined, thereby generating an image with a wide dynamic range without black crush and halation.

Further, the light source apparatus 11203 can be configured to be able to supply a light with a predetermined wavelength bandwidth for special light observation. In special light observation, for example, a light with a narrower bandwidth than an irradiation light (or white light) on usual observation is emitted by use of the wavelength dependency of light absorption on a body tissue, thereby shooting a predetermined tissue such as blood vessel in the superficial portion of the mucous membrane, or performing narrowband imaging. Alternatively, in special light observation, the fluorescent observation of obtaining an image by fluorescence generated by emitting an excitation light may be performed. In fluorescent observation, a body tissue is irradiated with an excitation light thereby to observe fluorescence from the body tissue (autofluorescent observation), or a reagent such as indocyanine green (ICG) is locally injected into a body tissue and the body tissue is irradiated with an excitation light corresponding to the fluorescent wavelength of the reagent thereby to obtain a fluorescent image, and the like. The light source apparatus 11203 can be configured to be able to supply a narrowband light and/or excitation light for the special light observation.

Figure 34:
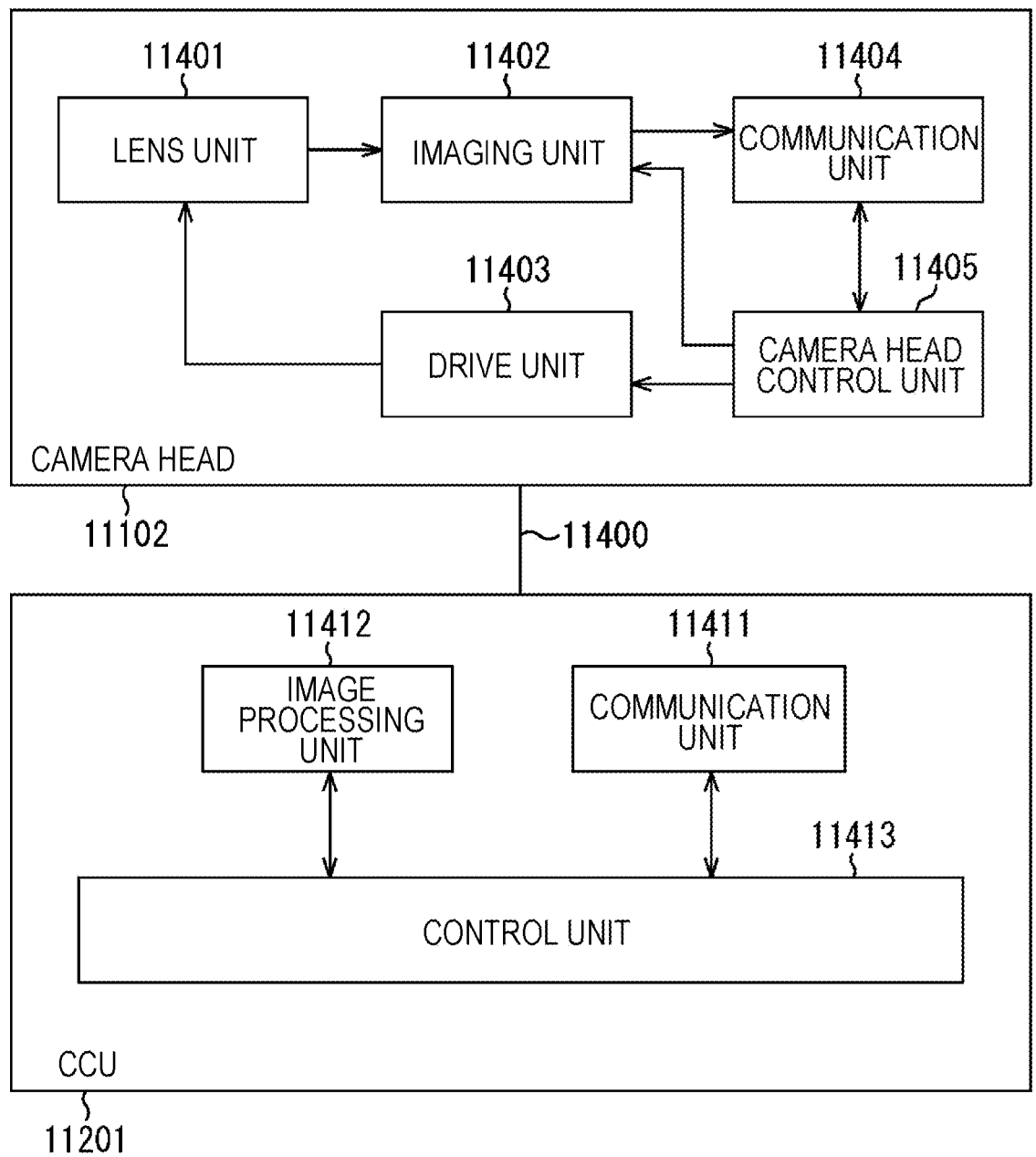
FIG. 34 is a block diagram illustrating exemplary functional configurations of a camera head and a CCU.

FIG. 34 is a block diagram illustrating an exemplary functional configuration of the camera head 11102 and the CCU 11201 illustrated in FIG. 33.

The camera head 11102 has a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicably connected via a transmission cable 11400.

The lens unit 11401 is an optical system provided at the connection part with the lens tube 11101. An observation light taken from the tip end of the lens tube 11101 is guided to the camera head 11102 to be incident in the lens unit 11401. The lens unit 11401 is configured in combination of a plurality of lenses including a zoom lens and a focus lens.

The imaging unit 11402 is configured of an imaging device. One (or single-plate type) or a plurality of (or multi-plate type) imaging devices may configure the imaging unit 11402. In a case where the imaging unit 11402 is of multi-plate type, for example, image signals corresponding to RGB are generated by the imaging devices, respectively, and are combined thereby to obtain a color image. Alternatively, the imaging unit 11402 may have a pair of imaging devices configured to obtain image signals for the right eye and the left eye for 3-dimensional (3D) display, respectively. With 3D display, the operator 11131 can more accurately grasp the depth of a body tissue at a surgery site. Additionally, in a case where the imaging unit 11402 is of multi-plate type, a plurality of lens units 11401 can be provided for the respective imaging devices.

Further, the imaging unit 11402 may not necessarily be provided on the camera head 11102. For example, the imaging unit 11402 may be provided just behind the objective lens inside the lens tube 11101.

The drive unit 11403 is configured of an actuator, and moves the zoom lens and the focus lens in the lens unit 11401 by a predetermined distance along an optical axis under control of the camera head control unit 11405. Thereby, the magnification and the focus of a shot image by the imaging unit 11402 can be adjusted as needed.

The communication unit 11404 is configured of a communication apparatus configured to exchange various items of information with the CCU 11201. The communication unit 11404 transmits an image signal obtained from the imaging unit 11402 as RAW data to the CCU 11201 via the transmission cable 11400.

Further, the communication unit 11404 receives a control signal for controlling the camera head 11102 to be driven from the CCU 11201, and supplies it to the camera head control unit 11405. The control signal includes the information associated with the imaging conditions such as information designating a frame rate of a shot image, information designating an exposure value on shooting, and/or information designating magnification and focus of a shot image.

Additionally, the imaging conditions such as frame rate, exposure value, magnification, and focus may be designated by the user as needed, or may be automatically set by the control unit 11413 in the CCU 11201 on the basis of the obtained image signal. In the latter case, the auto exposure (AE) function, the auto focus (AF) function, and the auto white balance (AWB) function are mounted on the endoscope 11100.

The camera head control unit 11405 controls driving of the camera head 11102 on the basis of a control signal received from the CCU 11201 via the communication unit 11404.

The communication unit 11411 is configured of a communication apparatus configured to exchange various items of information with the camera head 11102. The communication unit 11411 receives an image signal transmitted from the camera head 11102 via the transmission cable 11400.

Further, the communication unit 11411 transmits a control signal for controlling the camera head 11102 to be driven to the camera head 11102. An image signal or control signal can be transmitted via telecommunication, optical communication, or the like.

The image processing unit 11412 performs various image processing on an image signal as RAW data transmitted from the camera head 11102.

The control unit 11413 performs various controls for shooting a surgery site and the like by the endoscope 11100 and displaying a shot image obtained by shooting a surgery site and the like. For example, the control unit 11413 generates a control signal for controlling the camera head 11102 to be driven.

Further, the control unit 11413 causes the display apparatus 11202 to display a shot image of a surgery site or the like on the basis of an image signal subjected to the image processing by the image processing unit 11412. At this time, the control unit 11413 may recognize various objects in the shot image by use of various image recognition techniques. For example, the control unit 11413 can recognize a surgery tool such as forceps, a specific body site, bleeding, mist on use of the energy processing tool 11112, and the like by detecting the shapes, colors, and the like of the edges of the objects included in a shot image. The control unit 11413 may display various items of surgery support information to be overlapped on an image of the surgery site by use of the recognition result when displaying the shot image on the display apparatus 11202. The surgery support information is displayed in an overlapped manner to be presented to the operator 11131, thereby alleviating loads on the operator 11131 or enabling the operator 11131 to accurately perform surgery.

The transmission cable 11400 connecting the camera head 11102 and the CCU 11201 is an electric signal cable for communication of electric signals, an optical fiber for optical communication, or a composite cable thereof.

Here, in the illustrated example, wired communication is made by use of the transmission cable 11400, but wireless communication may be made between the camera head 11102 and the CCU 11201.

Additionally, the endoscopic surgery system has been described herein by way of example, but the technology according to the present disclosure may be applied to microscopic surgery system and the like, for example.

The imaging apparatuses according to the present disclosure have been described above with reference to the preferable embodiments, but the imaging apparatuses according to the present disclosure are not limited to the embodiments. The configurations and structures of the imaging apparatuses or the temperature detection devices described according to the embodiments are exemplary and can be changed as needed, and the materials making the imaging apparatuses or temperature detection devices, and the method for manufacturing the imaging apparatuses or temperature detection devices are exemplary and can be changed as needed. In some cases, the formation of the infrared ray reflection layer may be omitted, and the top face of the covering layer may function as an infrared ray reflection layer.

Figure 24:
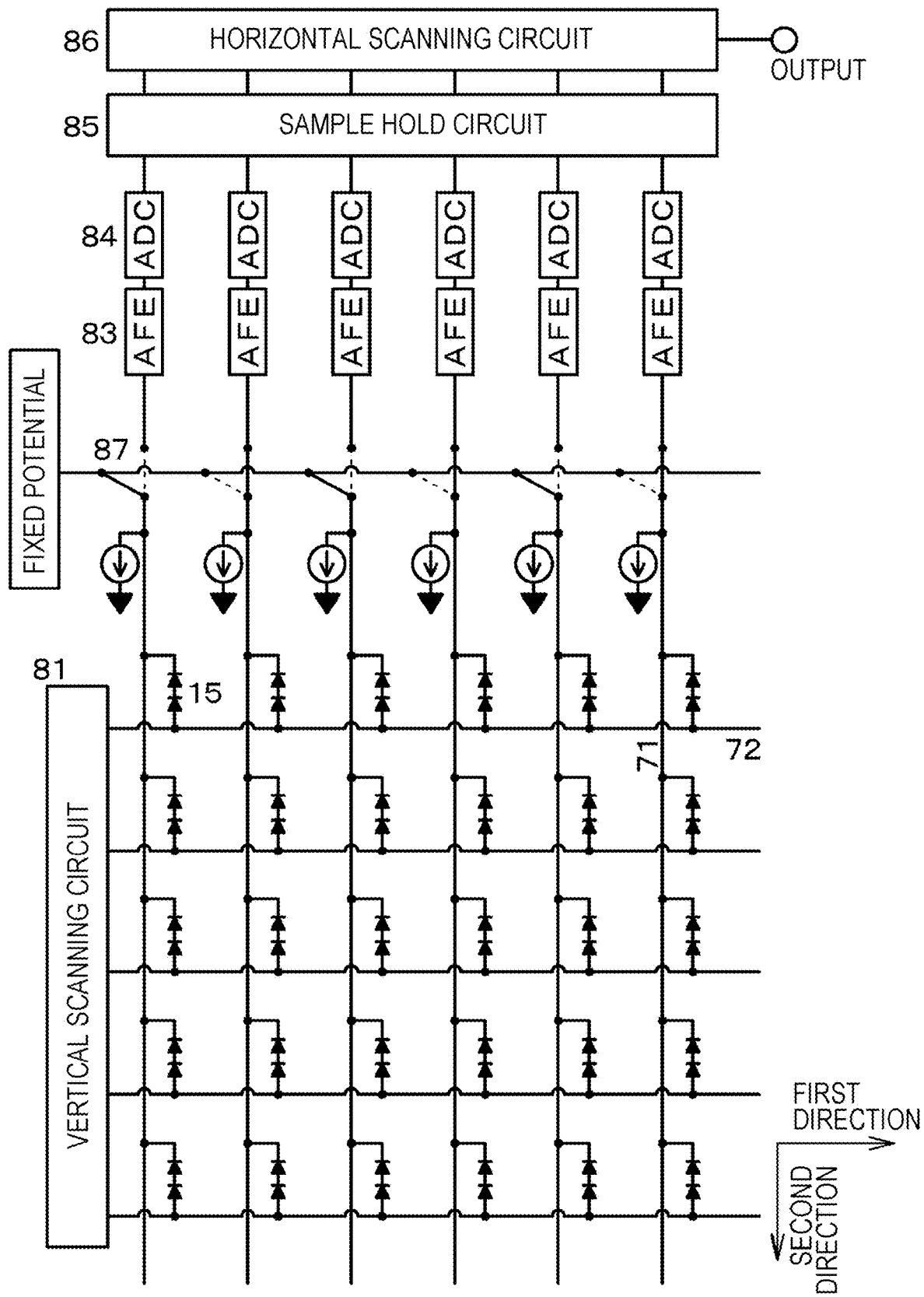
FIG. 24 is an equivalent circuit diagram of a variant of the imaging apparatus according to the fifth embodiment.

The imaging apparatus described according to the fifth embodiment is provided with the temperature detection device units each having a plurality of temperature detection devices. Here, in a case where one temperature detection device only has to be operated in a temperature detection device unit in some cases, a switch means 87 configured to control the conductive state between a differential integration circuit and a signal line 71 may be provided between an AFE 83 (specifically differential integration circuit) and a signal line 71 as illustrated in the equivalent circuit diagram of FIG. 24. Furthermore, in this case, it is preferable that when the switch means 87 sets the differential integration circuit and the signal line 71 in the non-conductive state, the signal line 71 is switched to a fixed potential. Thereby, it is possible to achieve a reduction in power consumption of the imaging apparatus. Additionally, the circuit configuration can be applied to other embodiments. That is, the temperature detection devices to be operated are reduced, thereby achieving a reduction in power consumption of the imaging apparatus in spite of a reduction in resolution. Similarly, according to the seventh embodiment, for example, the odd-numbered drive lines or the even-numbered drive lines are operated (or any set of drive lines is operated in a plurality of sets of drive lines) and the temperature detection devices to be operated are reduced, thereby achieving a reduction in power consumption of the imaging apparatus in spite of a reduction in resolution. Further, the amount of read data can be reduced, thereby achieving an increase in data output rate. Additionally, in a case where a high resolution is required, all the temperature detection devices only have to be operated.

The signal processing circuit can include the fixed pattern noise correction processing by previously measuring a noise, the noise reduction processing based on a noise model, and the resolution correction processing based on a lens image forming model. Further, an image obtained from an infrared camera and an image shot on the basis of a normal visible ray can be combined. The outlines of various signal processing will be described below, but the signal processing are not limited thereto.

For example, the fixed pattern noise correction processing may be a processing of generating differential data depending on a difference between fixed pattern noise data obtained in a previous imaging frame and fixed pattern noise data obtained in a current imaging frame, and adding the differential data and the fixed pattern noise data obtained in the previous imaging frame thereby to obtain new fixed pattern noise data.

Further, the noise reduction processing using an infinite impulse response (IIR) type filter may be configured of, for example:

a first step of calculating an average value of signal values of reference pixels near a pixel to be corrected in the IIR filter processing;

a second step of calculating a variance of the signal values of the reference pixels near the pixel to be corrected in the IIR filter processing;

a third step of inputting the average value and the variance of the reference pixels and performing the edge holding/smoothing processing applying the average value and the variance; and a fourth step of updating an IIR filter coefficient applied in the first step and the second step depending on the signal values of the pixels configuring the image.

Further, the resolution correction processing may be a method for obtaining a blurring correction filter set for a plurality of image heights, and correcting a pixel value of a pixel of an image height to be corrected by use of the obtained filters. Here, the correction may be a processing of applying a filter set for an image height adjacent to an image height to be corrected to a pixel value of a pixel to be corrected, calculating a coefficient on the basis of a positional relationship between the image height to be corrected and the adjacent image height, and calculating a corrected pixel value by use of the pixel value with the filter applied, and the coefficient. Alternatively, the correction may be a processing of calculating a coefficient on the basis of a positional relationship between an image height to be corrected and its adjacent image height, generating a filter to be applied to a pixel value of a pixel to be corrected by use of a filter set for the image height adjacent to the image height to be corrected, and the coefficient, and calculating a corrected pixel value by use of the generated filter and the pixel value of the pixel to be corrected. Furthermore, a filter coefficient may be calculated by approximated point spread function (PSF) data obtained by calculating PSF data from a plurality of image points on a first image height, averaging the PSF data, and approximating the averaged PSF data by a predetermined function, and a filter coefficient can be calculated by use of a Wiener filter.

Additionally, the present disclosure can take the following configurations.

[A01]<<Imaging Apparatus: First Aspect>>

An imaging apparatus including:

a first structure and a second structure, in which the first structure includes:

a first substrate;

a plurality of temperature detection devices formed on the first substrate, arranged in a 2D matrix shape in a first direction and in a second direction different from the first direction, and configured to detect a temperature on the basis of an infrared ray;

a plurality of drive lines arranged in the first direction and connected with the plurality of temperature detection devices; and a plurality of signal lines arranged in the second direction and connected with the plurality of temperature detection devices, the second structure includes:

a second substrate; and a drive circuit provided on the second substrate and covered with a covering layer, the first substrate is bonded to the covering layer, a cavity is provided between each temperature detection device and the covering layer, and the drive lines and the signal lines are electrically connected to the drive circuit.

[A02] The imaging apparatus according to [A01], in which the first structure has a temperature detection device array region in which a plurality of temperature detection devices are arranged in a 2D matrix shape, and a peripheral region surrounding the temperature detection device array region, and the drive lines and the signal lines are electrically connected to the drive circuit in the peripheral region.

[A03] The imaging apparatus according to [A01] or [A02], in which a partition wall is formed on a portion of the first substrate positioned between a temperature detection device and another temperature detection device, and a bottom of the partition wall is bonded to the covering layer.

[A04] The imaging apparatus according to [A03], in which an exposed face of the covering layer exposed to the cavities includes at least one material layer selected from a group comprising an insulative material layer, a metal material layer, an alloy material layer, and a carbon material layer, and a sidewall of the partition wall includes at least one material layer selected from a group comprising an insulative material layer, a metal material layer, an alloy material layer, and a carbon material layer.

[A05] The imaging apparatus according to [A03] in which the exposed face of the covering layer exposed to the cavities includes at least one material layer selected from a group of comprising an insulative material layer, a metal material layer, an alloy material layer, and a carbon material layer.

[A06] The imaging apparatus according to [A03] or [A05] in which the sidewall of the partition wall includes at least one material layer selected from a group of comprising an insulative material layer, a metal material layer, an alloy material layer, and a carbon material layer.

[A07] The imaging apparatus according to any one of [A03] to [A06], in which an infrared ray absorption layer is formed on a side of a temperature detection device in which an infrared ray is incident, and an infrared ray reflection layer is formed in regions of the covering layer positioned at a bottom of the cavity.

[A08] The imaging apparatus according to [A07] in which the infrared ray absorption layer is formed above a temperature detection device.

[A09] The imaging apparatus according to [A07] or [A08] in which the infrared ray reflection layer is formed on the top face of the covering layer or inside the covering layer.

[A10] The imaging apparatus according to any one of [A07] to [A09] in which assuming a wavelength $\lambda_{IR}$ of an infrared ray to be absorbed in the infrared ray absorption layer, an optical distance $L_0$ between the infrared ray absorption layer and the infrared ray reflection layer meets:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[A11] The imaging apparatus according to [A01] or [A02], in which a partition wall is formed independent of the first substrate between a portion of the first substrate positioned between a temperature detection device and another temperature detection device, and the covering layer, and a bottom of the partition wall is bonded to the covering layer.

[A12] The imaging apparatus according to [A11], in which an exposed face of the covering layer exposed to the cavities includes at least one material layer selected from a group comprising an insulative material layer, a metal material layer, an alloy material layer, and a carbon material layer, and the partition wall includes at least one material layer selected from a group comprising an insulative material layer, a metal material layer, an alloy material layer, and a carbon material layer.

[A13] The imaging apparatus according to [A11] in which the exposed face of the covering layer exposed to the cavities includes at least one material layer selected from a group comprising an insulative material layer, a metal material layer, an alloy material layer, and a carbon material layer.

[A14] The imaging apparatus according to [A11] or [A13] in which the partition wall includes at least one material layer selected from a group comprising an insulative material layer, a metal material layer, an alloy material layer, and a carbon material layer.

[A15] The imaging apparatus according to any one of [A11] to [A14], in which an infrared ray absorption layer is formed on a side of a temperature detection device in which an infrared ray is incident, and an infrared ray reflection layer is formed in regions of the covering layer positioned at a bottom of the cavity.

[A16] The imaging apparatus according to [A15] in which the infrared ray reflection layer is formed on the top face of the covering layer or inside the covering layer.

[A17] The imaging apparatus according to [A15] or [A16] in which assuming a wavelength $\lambda_{IR}$ of an infrared ray to be absorbed in the infrared ray absorption layer, an optical distance $L_0$ between the infrared ray absorption layer and the infrared ray reflection layer meets:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[A18] The imaging apparatus according to any one of [A11] to [A17] in which a protective substrate is attached on the face of the first substrate in which an infrared ray is incident.

[A19] The imaging apparatus according to any one of [A01] to [A18], in which a heat conductive layer is formed on the covering layer.

[A20] The imaging apparatus according to any one of [A01] to [A19], in which temperature control layers are formed on the covering layer, and the imaging apparatus further includes temperature detection means.

[A21] The imaging apparatus according to [A20], in which the temperature control layers function as heaters.

[A22] The imaging apparatus according to [A21] in which the temperature control layers serve as wirings.

[A23] The imaging apparatus according to any one of [A20] to [A22] in which the drive circuit controls the temperature control layers on the basis of temperature detection results of the temperature detection means.

[A24] The imaging apparatus according to any one of [A20] to [A23] in which the first structure includes a temperature detection device array region in which a plurality of temperature detection devices are arranged in a 2D matrix shape and a peripheral region surrounding the temperature detection device array region, and the temperature control layers are formed in the temperature detection device array region.

[A25] The imaging apparatus according to any one of [A20] to [A23] in which the temperature control layers are formed in the regions of the covering layer in which an orthographically-projected image of the temperature detection device array region is present.

[A26] The imaging apparatus according to any one of [A01] to [A23] in which the drive circuit includes analog-digital conversion circuits, and the analog-digital conversion circuits are not arranged in the regions of the drive substrate in which an orthographically-projected image of the temperature detection device array region is present.

[A27] The imaging apparatus according to any one of [A01] to [A26], in which a cavity is shared in 2×k adjacent temperature detection devices (where k is an integer of 1 or more).

[B01]<<Imaging Apparatus: Second Aspect>>

An imaging apparatus including:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices are arranged, and a wavelength of an infrared ray detected by each temperature detection device is different in the temperature detection device units.

[B02] The imaging apparatus according to [B01] in which each temperature detection device has an infrared ray absorption layer on a side in which an infrared ray is incident, and an infrared ray reflection layer opposite to the side in which an infrared ray is incident, an optical distance $L_0$ between the infrared ray absorption layer and the infrared ray reflection layer in each temperature detection device is different in the temperature detection device units, and assuming a wavelength $\lambda_{IR}$ of an infrared ray to be absorbed in the infrared ray absorption layer configuring a temperature detection device, an optical distance $L_0$ in each temperature detection device meets:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[B03] The imaging apparatus according to [B01] or [B02] in which each temperature detection device has an infrared ray absorption layer on a side in which an infrared ray is incident, and an infrared ray reflection layer opposite to the side in which an infrared ray is incident, and a material making the infrared ray absorption layer, a material, configuration, and structure making the infrared ray reflection layer, or the material, configuration, and structure making the infrared ray absorption layer and the material, configuration, and structure making the infrared ray reflection layer are different for each temperature detection device in the temperature detection device units.

[C01]<<Imaging Apparatus: Third Aspect>>

An imaging apparatus including:

a plurality of temperature detection device units arranged in a 2D matrix shape in a first direction and in a second direction different from the first direction and configured to detect a temperature on the basis of an infrared ray, in which each temperature detection device unit is configured in which a plurality of temperature detection devices are arranged, and an amount of absorbed infrared ray of each temperature detection device is different in the temperature detection device units.

[C02] The imaging apparatus according to [C01] in which each temperature detection device has an infrared ray absorption layer on a side in which an infrared ray is incident, and an infrared ray reflection layer opposite to the side in which an infrared ray is incident, and a material making the infrared ray absorption layer, a material making the infrared ray reflection layer, or the material making the infrared ray absorption layer and the material making the infrared ray reflection layer are different for each temperature detection device in the temperature detection device units.

[C03] The imaging apparatus according to [C01] or [C02] in which each temperature detection device has an infrared ray absorption layer on a side in which an infrared ray is incident, and an infrared ray reflection layer opposite to the side in which an infrared ray is incident, and the infrared ray absorption layer, or the infrared ray reflection layer, or the infrared ray absorption layer and the infrared ray reflection layer are different in area, or thickness, or area and thickness for each temperature detection device in the temperature detection device units.

[C04] The imaging apparatus according to [A01] to [A27], [B01] to [B03], and [C01] to [C03] in which each signal line is connected to an analog front end and an analog-digital conversion circuit in the second drive circuit.

[C05] The imaging apparatus according to [C04] in which the analog front end has a differential integration circuit, and a switch means configured to control the conductive state between a differential integration circuit and a signal line is provided between the differential integration circuit and the signal line.

[C06] The imaging apparatus according to [C05] in which when the switch means sets the differential integration circuit and the signal line in the non-conductive state, the signal line is set at a fixed potential.

[D01]<<Imaging Apparatus: Fourth Aspect>>

An imaging apparatus including:

$M_0 \times N_0$ (where $M_0 \geq 2$, $N_0 \geq 2$) temperature detection devices arranged in a 2D matrix shape in a first direction and in a second direction different from the first direction and configured to detect a temperature on the basis of an infrared ray;

a plurality of drive lines arranged in the first direction;

$N_0 \times P_0$ (where $P_0 \geq 2$) signal lines arranged in the second direction;

a first drive circuit connected with the plurality of drive lines; and a second drive circuit connected with the $N_0 \times P_0$ signal lines, in which each temperature detection device includes a first terminal and a second terminal, the first terminal of each temperature detection device is connected to a drive line, and a (n, p)-th signal line (where n=1, 2, . . . , $N_0$, p=1, 2, . . . , $P_0$) is connected to the second terminals of $\{(q-1)P_0+p\}$-th temperature detection devices (where q=1, 2, 3, . . . ) in a group of temperature detection devices configured of $N_0$ n-th temperature detection devices arranged in the second direction.

[D02] The imaging apparatus according to [D01], in which a number of plurality of drive lines is $M_0/P_0$, and an m-th drive line (where m=1, 2, . . . , $M_0/P_0$) is shared in a group of temperature detection devices configured of $M_0\{(m-1)_P+p'\}$-th temperature detection devices (where p'=all values of 1, 2, . . . , $P_0$) arranged in the first direction.

[D03] The imaging apparatus according to [D01] or [D02], in which each signal line is connected to an analog front end and an analog-digital conversion circuit in the second drive circuit, and the analog front end has a differential integration circuit.

[D04] The imaging apparatus according to [D01] or [D02] in which each signal line is connected to an analog front end and an analog-digital conversion circuit in the second drive circuit.

[D05] The imaging apparatus according to [D04] in which the analog front end has a differential integration circuit.

[D06] The imaging apparatus according to any one of [D01] to [D05] in which a temperature detection device is arranged above a cavity provided on a substrate for temperature detection devices, a first connection part provided on the substrate for temperature detection devices is connected to the first terminal of the temperature detection device via a first stud (support leg or elongate beam), and a second connection part provided on the substrate for temperature detection devices is connected to the second terminal of the temperature detection device via a second stud (support leg or elongate beam).

[D07] The imaging apparatus according to [D06] in which $P_0=2$ is assumed, the second terminals of two temperature detection devices adjacent in the second direction are connected to the second connection part provided on the substrate for temperature detection devices via one second stud (support leg or elongate beam), and the first terminals of a total of four temperature detection devices including two temperature detection devices adjacent in the first direction and two temperature detection devices adjacent in the second direction are connected to the first connection part provided on the substrate for temperature detection devices via one first stud (support leg or elongate beam).

[E01]<<Imaging Apparatus: Fifth Aspect>>

An imaging apparatus including:

$S_0 \times T_0$ (where $S_0 \geq 2$, $T_0 \geq 2$) temperature detection devices arranged in a 2D matrix shape in a first direction and in a second direction different from the first direction and configured to detect a temperature on the basis of an infrared ray;

$S_0 \times U_0$ (where $U_0 \geq 2$) drive lines arranged in the first direction;

a plurality of signal lines arranged in the second direction;

a first drive circuit connected with the $S_0 \times U_0$ drive lines; and a second drive circuit connected with the plurality of signal lines, in which each temperature detection device includes a first terminal and a second terminal, the second terminal of each temperature detection device is connected to a signal line, and a (s, u)-th drive line (where s=1, 2, . . . , $S_0$, u=1, 2, . . . , $U_0$) is connected to the first terminals of $\{(t-1)U_0+u\}$-th temperature detection devices (t=1, 2, 3, . . . ) in a group of temperature detection devices configured of $S_0$ s-th temperature detection devices arranged in the first direction.

[E02] The imaging apparatus according to [E01] in which each signal line is connected to an analog front end and an analog-digital conversion circuit in the second drive circuit.

[F01]<<Imaging Apparatus: Sixth Aspect>>

An imaging apparatus including:

a substrate for temperature detection devices including:

a plurality of temperature detection devices arranged in a 2D matrix shape in a first direction and in a second direction different from the first direction and configured to detect a temperature on the basis of an infrared ray;

a plurality of drive lines arranged in the first direction and connected with the plurality of temperature detection devices; and a plurality of signal lines arranged in the second direction and connected with the plurality of temperature detection devices, in which the substrate for temperature detection devices includes a temperature detection device array region in which a plurality of temperature detection devices are arranged in a 2D matrix shape, and a peripheral region surrounding the temperature detection device array region, and the drive lines and the signal lines are electrically connected to a drive circuit provide on a drive circuit chip in the peripheral region on a side in which an infrared ray is incident.

[F02]<<Imaging Apparatus: Seventh Aspect>>

An imaging apparatus configured of a first structure and a second structure, in which the first structure includes:

a first substrate;

a plurality of temperature detection devices provided on the first substrate, arranged in a 2D matrix shape in a first direction and in a second direction different from the first direction, and configured to detect a temperature on the basis of an infrared ray;

a plurality of drive lines arranged in the first direction and connected with the plurality of temperature detection devices; and a plurality of signal lines arranged in the second direction and connected with the plurality of temperature detection devices, the second structure includes:

a second substrate; and a drive circuit provided on the second substrate and covered with a covering layer, the first structure includes a temperature detection device array region in which a plurality of temperature detection devices are arranged in a 2D matrix shape and a peripheral region surrounding the temperature detection device array region, the second structure is attached on a side of the first substrate in which an infrared ray is incident, and the drive lines and the signal lines are electrically connected to the drive circuit in the peripheral region.

[G01] The imaging apparatus according to any one of [A01] to [F02], in which the temperature detection devices include pn junction diodes, bolometric devices, thermopile devices, metal film resistive devices, metal oxide resistive devices, ceramic resistive devices, or thermistor devices.

[H01]<<Noise Reduction Method in Imaging Apparatus>>

A noise reduction method in an imaging apparatus, the imaging apparatus including:

temperature detection devices configured to detect a temperature on the basis of an infrared ray;

drive lines connected with the temperature detection devices; and signal lines connected with the temperature detection devices, the imaging apparatus further including:

a first drive circuit connected with the drive lines, a second drive circuit connected with the signal lines, and a storage apparatus, in which a signal line is connected to a differential integration circuit and an analog-digital conversion circuit in the second drive circuit, the noise reduction method including:

disabling the temperature detection devices and resetting the differential integration circuits;

disabling the temperature detection devices, flowing a constant current in the signal lines for the same time $TM_0$ as the time $TM_0$ in which the temperature detection devices are enabled, integrating the voltages of the signal lines in the differential integration circuits, converting the resultant integral values into digital values in the analog-digital conversion circuits, and storing the resultant digital values as offset values in the storage apparatus; and enabling the temperature detection devices only for the time $TM_0$, integrating the voltages of the signal lines in the differential integration circuits, converting the resultant integral values into digital values in the analog-digital conversion circuits to obtain digital signal values, and then subtracting the offset values from the digital signal values, respectively.

REFERENCE SIGNS LIST 10, 10A Imaging apparatus
11 Temperature detection device array region
13 Center region
12, 14 Peripheral region
15, 115, 15A, 15B, 15C, 615A, 615B, 715A, 715B Temperature detection device
20 First structure
21, 121 First substrate (substrate for temperature detection devices)
121A Second face of first substrate
122 Protective substrate
21B, 121B Second face of first substrate
22 Silicon layer
22A Convex part extending from silicon layer
23, 123 Partition wall
24 Sidewall of partition wall
24A Sidewall of convex part
25A Diaphragm part (aerial part, aerial thin layer part)
25B Insulative material layer
25C First stud
25D Second stud
26 Insulative film
pn junction diode
31 Wiring
40 Second structure
41 Second substrate
42 Layer on which drive circuit is formed
43 Covering layer (interlayer insulative layer)
50 Cavity
51 Cavity
61, 61A, 61B Infrared ray absorption layer
62, 62A, 62B Infrared ray reflection layer
63 Heat conductive layer
64 Temperature control layer (heater)
71, 71A, $71_{1,1}$, $71_{2,1}$, $71_{3,1}$, 71B, $71_{1,2}$, $71_{2,2}$, $71_{3,2}$ Signal line
72, 72A, $72_{1,1}$, $72_{2,1}$, $72_{3,1}$, 72B, $72_{1,2}$, $72_{2,2}$, $72_{3,3}$ Drive line
73 Contact hole
81 Vertical scanning circuit
82 Constant current circuit
83, 83a, 83b Analog front end (AFE)
83A Differential integration circuit
83B Wiring
83C Constant current circuit
83D Switch means
84 Sample hold circuit
85, 85a, 85b Analog-digital conversion circuit (ADC)
86 Horizontal scanning circuit
90 SOI substrate
91 First silicon layer
92 $SIO_2$ layer
93 Second silicon layer
94 First sacrifice layer
95 Second sacrifice layer
96 Support substrate
97 Sacrifice layer
201 Substrate for temperature detection devices
202 Drive circuit chip
203 Solder bump
301 Lens
302 Shutter
303 Imaging apparatus
304 Drive circuit
305 Power supply unit
306 Storage medium
307 Video output unit
308 Various interfaces

The invention claimed is:

1. An imaging apparatus comprising:
a first structure and a second structure,
wherein the first structure includes:
a first substrate;
a plurality of temperature detection devices formed on the first substrate, arranged in a 2D matrix shape in a first direction and in a second direction different from the first direction, and configured to detect a temperature on the basis of an infrared ray, wherein each of the temperature detection devices is configured to detect a different wavelength and a different amount of infrared radiation;
a plurality of drive lines arranged in the first direction and connected with the plurality of temperature detection devices; and
a plurality of signal lines arranged in the second direction and connected with the plurality of temperature detection devices,
the second structure includes:
a second substrate; and
a drive circuit provided on the second substrate and covered with a covering layer, the first substrate is bonded to the covering layer, a cavity is provided between each temperature detection device and the covering layer,
the drive lines and the signal lines are electrically connected to the drive circuit; and
respective differential integration circuits coupled to the plurality of temperature detection devices.

2. The imaging apparatus according to claim 1,
wherein the first structure has a temperature detection device array region in which a plurality of temperature detection devices are arranged in a 2D matrix shape, and a peripheral region surrounding the temperature detection device array region, and
the drive lines and the signal lines are electrically connected to the drive circuit in the peripheral region.

3. The imaging apparatus according to claim 1,
wherein a partition wall is formed on a portion of the first substrate positioned between a temperature detection device and another temperature detection device, and
a bottom of the partition wall is bonded to the covering layer.

4. The imaging apparatus according to claim 3,
wherein an exposed face of the covering layer exposed to the cavities includes at least one material layer selected from a group comprising an insulative material layer, a metal material layer, an alloy material layer, and a carbon material layer, and
a sidewall of the partition wall includes at least one material layer selected from a group comprising an insulative material layer, a metal material layer, an alloy material layer, and a carbon material layer.

5. The imaging apparatus according to claim 3,
wherein an infrared ray absorption layer is formed on a side of a temperature detection device in which an infrared ray is incident, and
an infrared ray reflection layer is formed in regions of the covering layer positioned at a bottom of the cavity.

6. The imaging apparatus according to claim 1,
wherein a partition wall is formed independent of the first substrate between a portion of the first substrate positioned between a temperature detection device and another temperature detection device, and the covering layer, and
a bottom of the partition wall is bonded to the covering layer.

7. The imaging apparatus according to claim 6,
wherein an exposed face of the covering layer exposed to the cavities includes at least one material layer selected from a group comprising an insulative material layer, a metal material layer, an alloy material layer, and a carbon material layer, and
the partition wall includes at least one material layer selected from a group comprising an insulative material layer, a metal material layer, an alloy material layer, and a carbon material layer.

8. The imaging apparatus according to claim 6,
wherein an infrared ray absorption layer is formed on a side of a temperature detection device in which an infrared ray is incident, and
an infrared ray reflection layer is formed in regions of the covering layer positioned at a bottom of the cavity.

9. The imaging apparatus according to claim 1,
wherein a heat conductive layer is formed on the covering layer.

10. The imaging apparatus according to claim 1,
wherein temperature control layers are formed on the covering layer.

11. The imaging apparatus according to claim 10,
wherein the temperature control layers function as heaters.

12. The imaging apparatus according to claim 1,
wherein a cavity is shared in 2×k adjacent temperature detection devices, where k is an integer of 1 or more.

13. The imaging apparatus according claim 1,
wherein the plurality of temperature detection devices include pn junction diodes, bolometric devices, thermopile devices, metal film resistive devices, metal oxide resistive devices, ceramic resistive devices, or thermistor devices.

14. An imaging apparatus comprising:
a plurality of temperature detection device units arranged in a 2D matrix shape in a first direction and in a second direction different from the first direction and configured to detect a temperature on the basis of an infrared ray,
respective differential integration circuits coupled to the plurality of temperature detection devices,
wherein each temperature detection device unit includes a plurality of temperature detection devices, and
wherein each of the temperature detection devices in each temperature detection device unit is configured to detect a different wavelength and a different amount of infrared radiation.

15. An imaging apparatus comprising:
$M_0 \times N_0$, where $M_0 \geq 2$, $N_0 \geq 2$, temperature detection devices arranged in a 2D matrix shape in a first direction and in a second direction different from the first direction and configured to detect a temperature on the basis of an infrared ray, wherein each of the temperature detection devices is configured to detect a different wavelength and a different amount of infrared radiation;
a plurality of drive lines arranged in the first direction;
$N_0 \times P_0$, where $P_0 \geq 2$, signal lines arranged in the second direction;
a first drive circuit connected with the plurality of drive lines; and
a second drive circuit connected with the $N_0 \times P_0$ signal lines,
wherein each temperature detection device includes a first terminal and a second terminal,
the first terminal of each temperature detection device is connected to a drive line,
a (n, p)-th signal line, where n=1, 2, . . . , $N_0$, p=1, 2, . . . , $P_0$, is connected to the second terminals of $\{(q-1)P_0+p\}$-th temperature detection devices, where q=1, 2, 3, . . . , in a group of temperature detection devices configured of No n-th temperature detection devices arranged in the second direction, and
respective differential integration circuits coupled to the plurality of temperature detection devices.

16. The imaging apparatus according to claim 15,
wherein a number of plurality of drive lines is $M_0/P_0$, and
an m-th drive line, where m=1, 2, . . . , $M_0/P_0$, is shared in a group of temperature detection devices configured of $M_0$ $\{(m-1)P_0+p'\}$-th temperature detection devices, where p'=all values of 1, 2, . . . , $P_0$, arranged in the first direction.

17. The imaging apparatus according to claim 15,
wherein each signal line is connected to an analog front end and an analog-digital conversion circuit in the second drive circuit, and
the analog front end has a differential integration circuit.

18. The imaging apparatus according to claim 15,
wherein a temperature detection device is arranged above a cavity provided on a substrate for temperature detection devices,
a first connection part provided on the substrate for temperature detection devices is connected to the first terminal of the temperature detection device via a first stud, and
a second connection part provided on the substrate for temperature detection devices is connected to the second terminal of the temperature detection device via a second stud.

19. An imaging apparatus comprising:
$S_0 \times T_0$, where $S_0 \geq 2$, $T_0 \geq 2$, temperature detection devices arranged in a 2D matrix shape in a first direction and in a second direction different from the first direction and configured to detect a temperature on the basis of an infrared ray, wherein each of the temperature detection devices is configured to detect a different wavelength and a different amount of infrared radiation;
$S_0 \times U_0$, where $U_0 \geq 2$, drive lines arranged in the first direction;
a plurality of signal lines arranged in the second direction;
a first drive circuit connected with the $S_0 \times U_0$ drive lines; and
a second drive circuit connected with the plurality of signal lines,
wherein each temperature detection device includes a first terminal and a second terminal,
the second terminal of each temperature detection device is connected to a signal line,
a (s, u)-th drive line, where s=1, 2, . . . , $S_0$, u=1, 2, . . . , $U_0$, is connected to the first terminals of $\{(t-1)U_0+u\}$-th temperature detection devices, t=1, 2, 3, . . . , in a group of temperature detection devices configured of $S_0$ s-th temperature detection devices arranged in the first direction and
respective differential integration circuits coupled to the plurality of temperature detection devices.

* * * * *